(12) United States Patent
Minagawa et al.

(10) Patent No.: US 11,012,652 B2
(45) Date of Patent: May 18, 2021

(54) INFORMATION PROCESSING APPARATUS, INFORMATION PROCESSING METHOD, AND RECORDING MEDIUM

(71) Applicant: Sony Semiconductor Solutions Corporation, Kanagawa (JP)

(72) Inventors: Yusuke Minagawa, Tokyo (JP); Toru Akishita, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/478,159

(22) PCT Filed: Dec. 6, 2017

(86) PCT No.: PCT/JP2017/043718
§ 371 (c)(1),
(2) Date: Jul. 16, 2019

(87) PCT Pub. No.: WO2018/135161
PCT Pub. Date: Jul. 26, 2018

(65) Prior Publication Data
US 2019/0373195 A1 Dec. 5, 2019

(30) Foreign Application Priority Data

Jan. 23, 2017 (JP) .............................. JP2017-009410

(51) Int. Cl.
*H04N 5/376* (2011.01)
*H04N 5/347* (2011.01)
*H04N 5/3745* (2011.01)

(52) U.S. Cl.
CPC ............. *H04N 5/376* (2013.01); *H04N 5/347* (2013.01); *H04N 5/3745* (2013.01)

(58) Field of Classification Search
CPC .. G06K 9/0002; G06K 9/00577; H01L 27/14; H01L 27/146; H04N 5/335; H04N 5/347;
(Continued)

(56) References Cited

U.S. PATENT DOCUMENTS

2008/0112596 A1* 5/2008 Rhoads .................. G07D 7/121
382/115
2012/0327450 A1* 12/2012 Sagan ................ G06K 9/00577
358/1.14
(Continued)

FOREIGN PATENT DOCUMENTS

| JP | 2004-173154 A | 6/2004 |
|---|---|---|
| JP | 2005-341065 A | 12/2005 |
| WO | WO 2016/167076 A1 | 10/2016 |

OTHER PUBLICATIONS

International Search Report and English translation thereof dated Feb. 20, 2018 in connection with International Application No. PCT/JP2017/043718.

*Primary Examiner* — Amy R Hsu
(74) *Attorney, Agent, or Firm* — Wolf, Greenfield & Sacks, P.C.

(57) ABSTRACT

[Subject]
To generate a value unique to a solid-state imaging apparatus utilizing a physical feature of the solid-state imaging apparatus.
[Solving Means]
An information processing apparatus including a specification section specifying, from among a plurality of blocks that are set by dividing pixels included in at least a partial region of a pixel region having a plurality of pixels arrayed therein and each of which includes at least one or more of the pixels, at least one or more of the blocks, and a generation section generating a unique value based on pixel (Continued)

values of the pixels included in the specified blocks and a dispersion of the pixel values of the pixels among the plurality of blocks.

13 Claims, 34 Drawing Sheets

(58) Field of Classification Search
CPC ...... H04N 5/374; H04N 5/3745; H04N 5/376; H04N 5/378
See application file for complete search history.

(56) References Cited

U.S. PATENT DOCUMENTS

| | | | |
|---|---|---|---|
| 2013/0182160 A1* | 7/2013 | Pitter | H04N 5/3456 348/296 |
| 2017/0102419 A1* | 4/2017 | Suwald | H05K 1/0296 |
| 2018/0006230 A1* | 1/2018 | Cao | H01L 51/0098 |

* cited by examiner

INFORMATION PROCESSING APPARATUS, INFORMATION PROCESSING METHOD, AND RECORDING MEDIUM

CROSS-REFERENCE TO RELATED APPLICATIONS

This application claims the benefit under 35 U.S.C. § 371 as a U.S. National Stage Entry of International Application No. PCT/JP2017/043718, filed in the Japanese Patent Office as a Receiving Office on Dec. 6, 2017, which claims priority to Japanese Patent Application Number JP2017-009410, filed in the Japanese Patent Office on Jan. 23, 2017, each of which is hereby incorporated by reference in its entirety.

TECHNICAL FIELD

The present disclosure relates to an information processing apparatus, an information processing method, and a recording medium.

BACKGROUND ART

As a solid-state imaging apparatus, amplification type solid-state imaging apparatuses represented by a MOS type image sensor such as a CMOS (Complementary Metal Oxide Semiconductor) image sensor are known. Further, charge transfer type solid-state imaging apparatuses represented by a CCD (Charge Coupled Device) image sensor are known. Such solid-state imaging apparatuses are widely used in digital still cameras, digital video cameras and so forth. In recent years, as a solid-state imaging apparatus incorporated in a mobile apparatus such as a camera-equipped mobile phone or a PDA (Personal Digital Assistant), a MOS type image sensor is frequently used from the point of view of a lower power supply voltage and power consumption. For example, PTL 1 discloses an example of a digital camera to which such a solid-state imaging apparatus as described above is applied.

A solid-state imaging apparatus of the MOS type includes a pixel array (pixel region) in which a unit pixel includes a photodiode that serves as a photoelectric conversion section and a plurality of pixel transistors and a plurality of such unit pixels are arrayed in a two-dimensional array, and a peripheral circuit region. The plurality of pixel transistors include MOS transistors and each include three transistors of a transfer transistor, a reset transistor and an amplification transistor or four transistors additionally including a selection transistor.

CITATION LIST

Patent Literature

[PTL 1]
Japanese Patent Laid-Open No. 2004-173154

SUMMARY

Technical Problem

Incidentally, in recent years, a technology for outputting a value unique to a device utilizing a physical feature difficult to duplicate called PUF (Physically Unclonable Function) is noticed. It is expected that, since such a value unique to a device generated utilizing the PUF as just described has a characteristic that it is difficult to duplicate, it is utilized, for example, as an identifier (ID) for identifying an individual device or as so-called key information (for example, a key for encryption).

Therefore, the present disclosure proposes an information processing apparatus, an information processing method, and a recording medium that can generate a value unique to a solid-state imaging apparatus utilizing a physical feature of the solid-state imaging apparatus.

Solution to Problem

According to the present disclosure, there is provided an information processing apparatus including a specification section and a generation section. The specification section specifies, from among a plurality of blocks that are set by dividing pixels included in at least a partial region of a pixel region having a plurality of pixels arrayed therein and each of which includes at least one or more of the pixels, at least one or more of the blocks. The generation section generates a unique value based on pixel values of the pixels included in the specified blocks and a dispersion of the pixel values of the pixels among the plurality of blocks.

Further, according to the present disclosure, there is provided an information processing method executed by a computer. The information processing method includes specifying, from among a plurality of blocks that are set by dividing pixels included in at least a partial region of a pixel region having a plurality of pixels arrayed therein and each of which includes at least one or more of the pixels, at least one or more of the blocks, and generating a unique value based on pixel values of the pixels included in the specified blocks and a dispersion of the pixel values of the pixels among the plurality of blocks.

Furthermore, according to the present disclosure, there is provided a recording medium on which a program is recorded, the program causing a computer to execute specifying, from among a plurality of blocks that are set by dividing pixels included in at least a partial region of a pixel region having a plurality of pixels arrayed therein and each of which includes at least one or more of the pixels, at least one or more of the blocks, and generating a unique value based on pixel values of the pixels included in the specified blocks and a dispersion of the pixel values of the pixels among the plurality of blocks.

Advantageous Effects of Invention

As described above, according to the present disclosure, an information processing apparatus, an information processing method, and a recording medium that can generate a value unique to a solid-state imaging apparatus utilizing a physical feature of the solid-state imaging apparatus are provided.

It is to be noted that the advantageous effect described above is not necessarily restrictive and some advantageous effects indicated in the present specification or other advantageous effects that can be grasped from the present specification may be demonstrated in place of the advantageous effect described above.

DESCRIPTION OF EMBODIMENTS

In the following, preferred embodiments of the present disclosure are described in detail with reference to the accompanying drawings. It is to be noted that, in the present specification and the drawings, components having substantially the same functional configurations are denoted by the same reference signs and overlapping description of them is omitted.

It is to be noted that the description is given in the following order.

1. Configuration Example of Solid-State Imaging Apparatus
   1.1. General Configuration
   1.2. Functional Configuration
   1.3. Circuit Configuration of Unit Pixel
2. Outline of PUF
3. First Embodiment
   3.1. Configuration Example
   3.2. Operation Example 4. Second Embodiment
   4.1. Basic Idea
   4.2. Generation Method of PUF Value
   4.3. Functional Configuration
   4.4. Processing
   4.5. Evaluation
5. Application Example
   5.1. Application Example to Biometric Authentication
   5.2. Application Example to Biometric Authentication System
   5.3. Application Example to Mobile Body
6. Conclusion

1. Configuration Example of Solid-State Imaging Apparatus

A configuration example of a solid-state imaging apparatus according to the present embodiment is described in the following.

1.1. General Configuration

Figure 1:
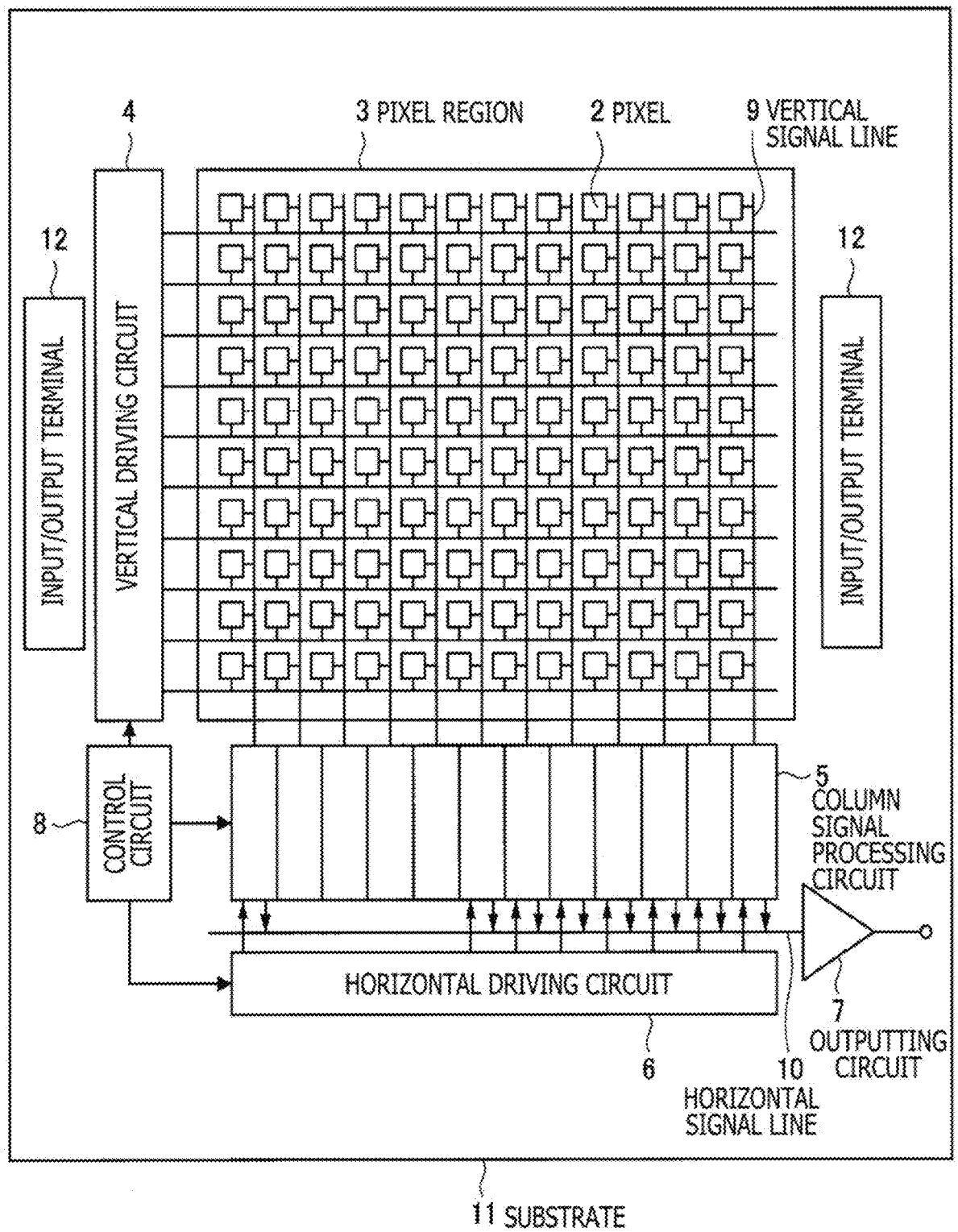
FIG. 1 is a schematic block diagram depicting an example of a configuration of a solid-state imaging apparatus according an embodiment of the present disclosure.

FIG. 1 depicts a general configuration of a CMOS solid-state imaging apparatus as an example of a configuration of a solid-state imaging apparatus according to an embodiment of the present disclosure. This CMOS solid-state imaging apparatus is applied to a solid-state imaging apparatus of each embodiment. The solid-state imaging apparatus 1 of the present example includes, as depicted in FIG. 1, a pixel array (so-called pixel region) 3 in which a plurality of pixels 2 each including a photoelectric conversion section are regularly arrayed in a two-dimensional array on a semiconductor substrate 11, for example, a silicon substrate, and a peripheral circuit section. Each pixel 2 includes, for example, a photodiode serving as the photoelectric conversion section, and a plurality of pixel transistors (so-called MOS transistors). The plurality of pixel transistors can include, for example, three transistors of a transfer transistor, a reset transistor and an amplification transistor. Also, the plurality of pixel transistors can otherwise include four transistors additionally including a selection transistor. It is to be noted that an example of an equivalent circuit of a unit pixel is hereinafter described separately. The pixel 2 can be configured as a single unit pixel. Also it is possible for the pixel 2 to have a shared pixel structure. This shared pixel structure includes a plurality of photodiodes, a plurality of transfer transistors, a single shared floating diffusion, and other pixel transistors shared one by one. In particular, a shared pixel is configured such that photodiodes and transfer transistors that configure a plurality of unit pixels share one by one of the other pixel transistors.

The peripheral circuit section includes a vertical driving circuit 4, column signal processing circuits 5, a horizontal driving circuit 6, an outputting circuit 7, a control circuit 8 and so forth.

The control circuit 8 receives an input clock and data that designates an operation mode and so forth and outputs data of internal information and so forth of the solid-state imaging apparatus. In particular, the control circuit 8 generates a clock signal that becomes a reference to operation of the vertical driving circuit 4, the column signal processing circuits 5, the horizontal driving circuit 6 and so forth and a control signal on the basis of a vertical synchronizing signal, a horizontal synchronizing signal and a master clock. Then, the control circuit 8 inputs the signals to the vertical driving circuit 4, the column signal processing circuits 5, the horizontal driving circuit 6 and so forth.

The vertical driving circuit 4 includes, for example, a shift register, and selects a pixel driving wiring line and supplies a pulse for driving a pixel to the selected pixel driving wiring line to drive pixels in a unit of a row. In particular, the vertical driving circuit 4 selectively scans the pixels 2 of the pixel array 3 in a unit of a row successively in a vertical direction and supplies pixel signals based on signal charge generated in response to a received light amount, for example, at the photodiode that serves as a photoelectric conversion section of each of the pixels 2 through a vertical signal line 9 to the corresponding column signal processing circuit 5.

The column signal processing circuit 5 is disposed, for example, for each column of the pixels 2 and performs signal processing of signals outputted from the pixels 2 for one row such as noise removal for each pixel column. In particular, the column signal processing circuit 5 performs signal processing such as CDS for removing fixed pattern noise unique to the pixels 2, signal amplification, AD conversion and so forth. A horizontal selection switch (not depicted) is provided at an output stage of the column signal processing circuit 5 such that it is connected between the column signal processing circuit 5 and a horizontal signal line 10.

The horizontal driving circuit 6 includes, for example, a shift register, and sequentially outputs a horizontal scanning pulse to select each of the column signal processing circuits 5 in order such that a pixel signal is outputted from each of the column signal processing circuits 5 to the horizontal signal line 10.

The outputting circuit 7 performs signal processing for each of signals successively supplied from the column signal processing circuits 5 through the horizontal signal line 10 and outputs a resulting signal. For example, only buffering may be performed, or black level adjustment, column dispersion correction, various digital signal processes and so forth may be performed. Input/output terminals 12 transfer a signal to and from the outside.

Figure 2:
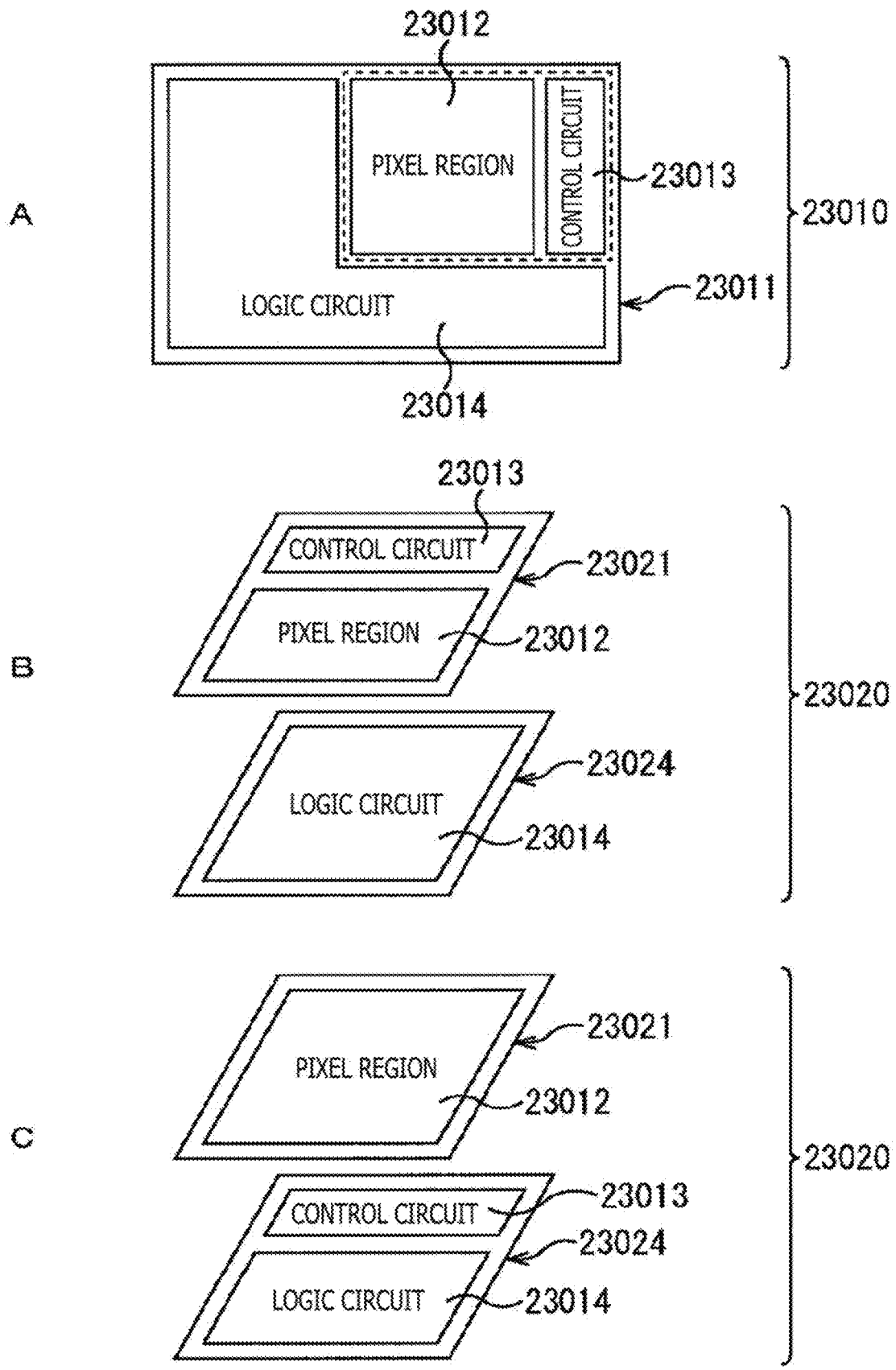
FIG. 2 is a view depicting an outline of a configuration example of a stacked type solid-state imaging apparatus to which a technology according to the present disclosure can be applied.

FIG. 2 is a view depicting an outline of a configuration example of a stacked type solid-state imaging apparatus to which the technology according to the present disclosure can be applied.

A of FIG. 2 depicts a schematic configuration example of a non-stacked type solid-state imaging apparatus. The solid-state imaging apparatus 23010 includes a single die (semiconductor substrate) 23011 as depicted in A of FIG. 2. In the die 23011, a pixel region 23012 in which pixels are disposed in an array, a control circuit 23013 that performs driving and various other controls for the pixels, and a logic circuit 23014 for performing signal processing.

B and C of FIG. 2 depict schematic configuration examples of a stacked type solid-state imaging apparatus. The solid-state imaging apparatus 23020 is configured as one semiconductor chip in which two dies of a sensor die 23021 and a logic die 23024 are stacked and electrically connected to each other as depicted in B and C of FIG. 2.

In B of FIG. 2, the pixel region 23012 and the control circuit 23013 are incorporated in the sensor die 23021, and the logic circuit 23014 including a signal processing circuit that performs signal processing is incorporated in the logic die 23024.

In C of FIG. 2, the pixel region 23012 is incorporated in the sensor die 23021, and the control circuit 23013 and a logic circuit 23014 are incorporated in the logic die 23024.

Figure 3:
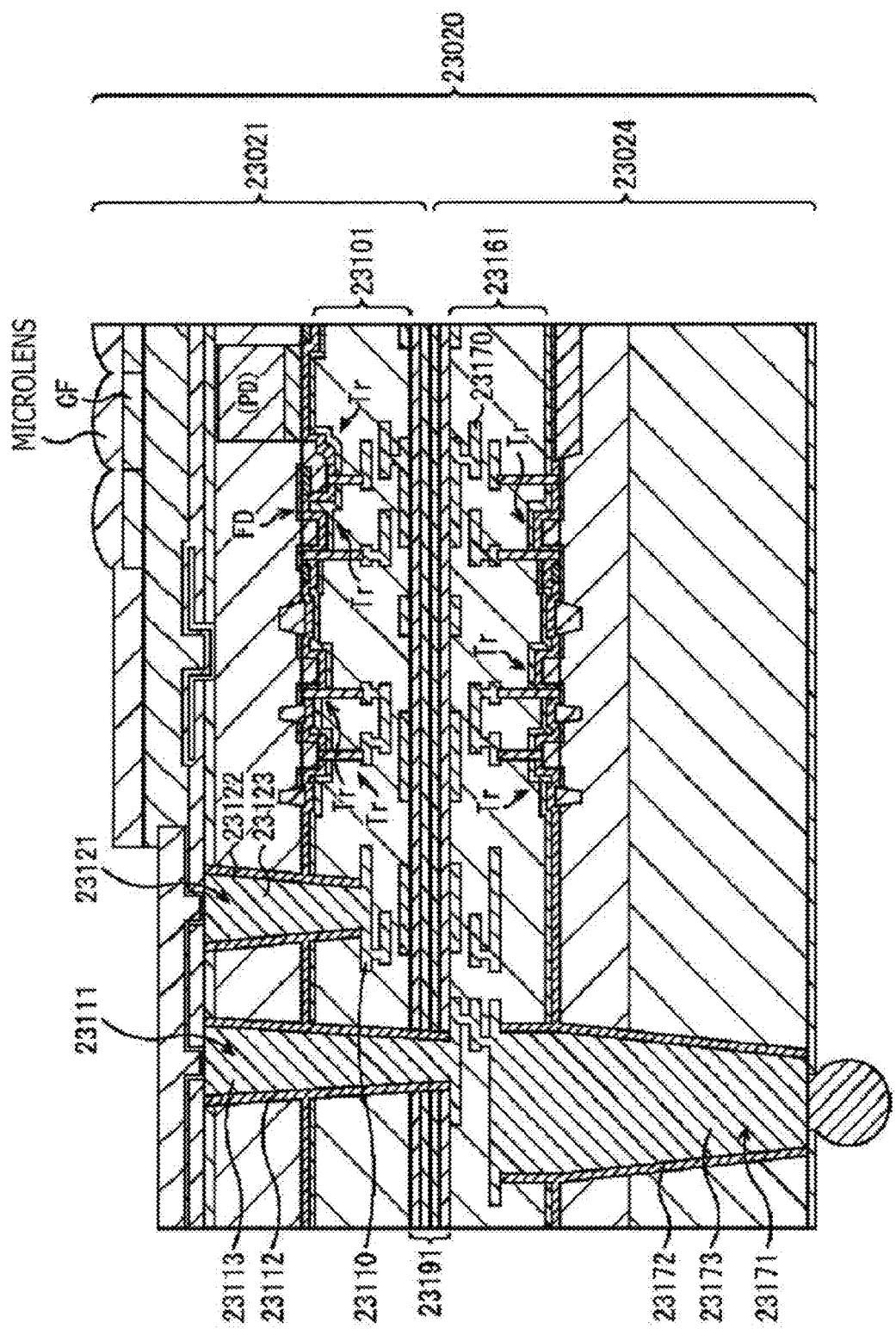
FIG. 3 is a sectional view depicting a first configuration example of a stacked type solid-state imaging apparatus 23020.

FIG. 3 is a sectional view depicting a first configuration example of the stacked type solid-state imaging apparatus 23020.

In the sensor die 23021, a PD (photodiode), an FD (floating diffusion), and a Tr (MOS FET) that configure the pixels that form the pixel region 23012 and a Tr and so forth that form the control circuit 23013 are formed. Further, in the sensor die 23021, a wiring line layer 23101 having a plurality of layers, three layers in the present example, of wiring lines 23110, is formed. It is to be noted that (the Tr that forms) the control circuit 23013 can be configured not in the sensor die 23021 but in the logic die 23024.

In the logic die 23024, a Tr configuring the logic circuit 23014 is formed. Further, a wiring line layer 23161 having a plurality of layers, three layers in the present example, of wiring lines 23170 is formed in the logic die 23024. Further, in the logic die 23024, a connection hole 23171 having an insulating film 23172 formed on an inner wall face thereof is formed, and a connection conductor 23173 connected to a wiring line 23170 and so forth is embedded in the connection hole 23171.

The sensor die 23021 and the logic die 23024 are pasted to each other such that the wiring line layers 23101 and 23161 face each other thereby to configure the stacked type solid-state imaging apparatus 23020 in which the sensor die 23021 and the logic die 23024 are stacked. On the faces at which the sensor die 23021 and the logic die 23024 are pasted to each other, a film 23191 such as a protective film and so forth is formed.

In the sensor die 23021, a connection hole 23111 is formed such that it extends through the sensor die 23021 from the rear face side of the sensor die 23021 (side on which light is incident to the PD) (upper side) to the wiring line 23170 of the uppermost layer of the logic die 23024. Further, in the sensor die 23021, a connection hole 23121 is formed in the proximity of the connection hole 23111 such that it extends from the rear face side of the sensor die 23021 to a wiring line 23110 of the first layer. On an inner wall face of the connection hole 23111, an insulating film 23112 is formed, and on an inner wall face of the connection hole 23121, an insulating film 23122 is formed. Further, connection conductors 23113 and 23123 are embedded in the connection holes 23111 and 23121, respectively. The connection conductor 23113 and the connection conductor 23123 are electrically connected to each other on the rear face side of the sensor die 23021, and consequently, the sensor die 23021 and the logic die 23024 are electrically connected to each other through the wiring line layer 23101, the connection hole 23121, the connection hole 23111 and the wiring line layer 23161.

Figure 4:
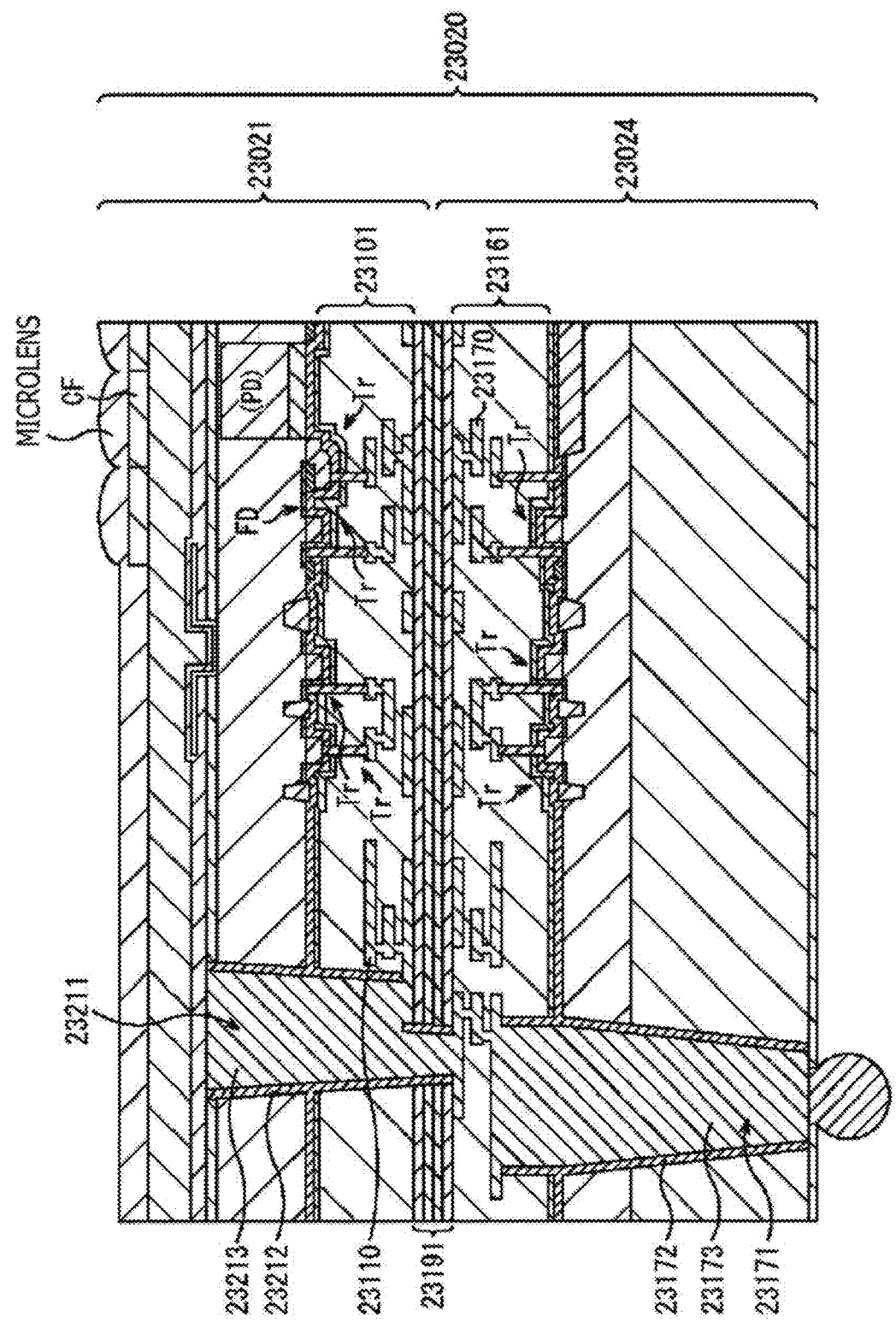
FIG. 4 is a sectional view depicting a second configuration example of the stacked type solid-state imaging apparatus 23020.

FIG. 4 is a sectional view depicting a second configuration example of the stacked type solid-state imaging apparatus 23020.

In the second configuration example of the solid-state imaging apparatus 23020, ((the wiring line 23110 of) the wiring line layer 23101 of) the sensor die 23021 and ((the wiring line 23170 of) the wiring line layer 23161 of) the logic die 23024 are electrically connected to each other through a single connection hole 23211 formed in the sensor die 23021.

In particular, in FIG. 4, the connection hole 23211 is formed such that it extends from the rear face side of the sensor die 23021 to the wiring line 23170 of the uppermost layer of the logic die 23024 through the sensor die 23021 and besides extends to the wiring line 23110 of the uppermost layer of the sensor die 23021. On an inner wall face of the connection hole 23211, an insulating film 23212 is formed, and in the connection hole 23211, a connection conductor 23213 is embedded. Although, in FIG. 3 described above, the sensor die 23021 and the logic die 23024 are electrically connected to each other through the two connection holes 23111 and 23121, in FIG. 4, the sensor die 23021 and the logic die 23024 are electrically connected to each other through the single connection hole 23211.

Figure 5:
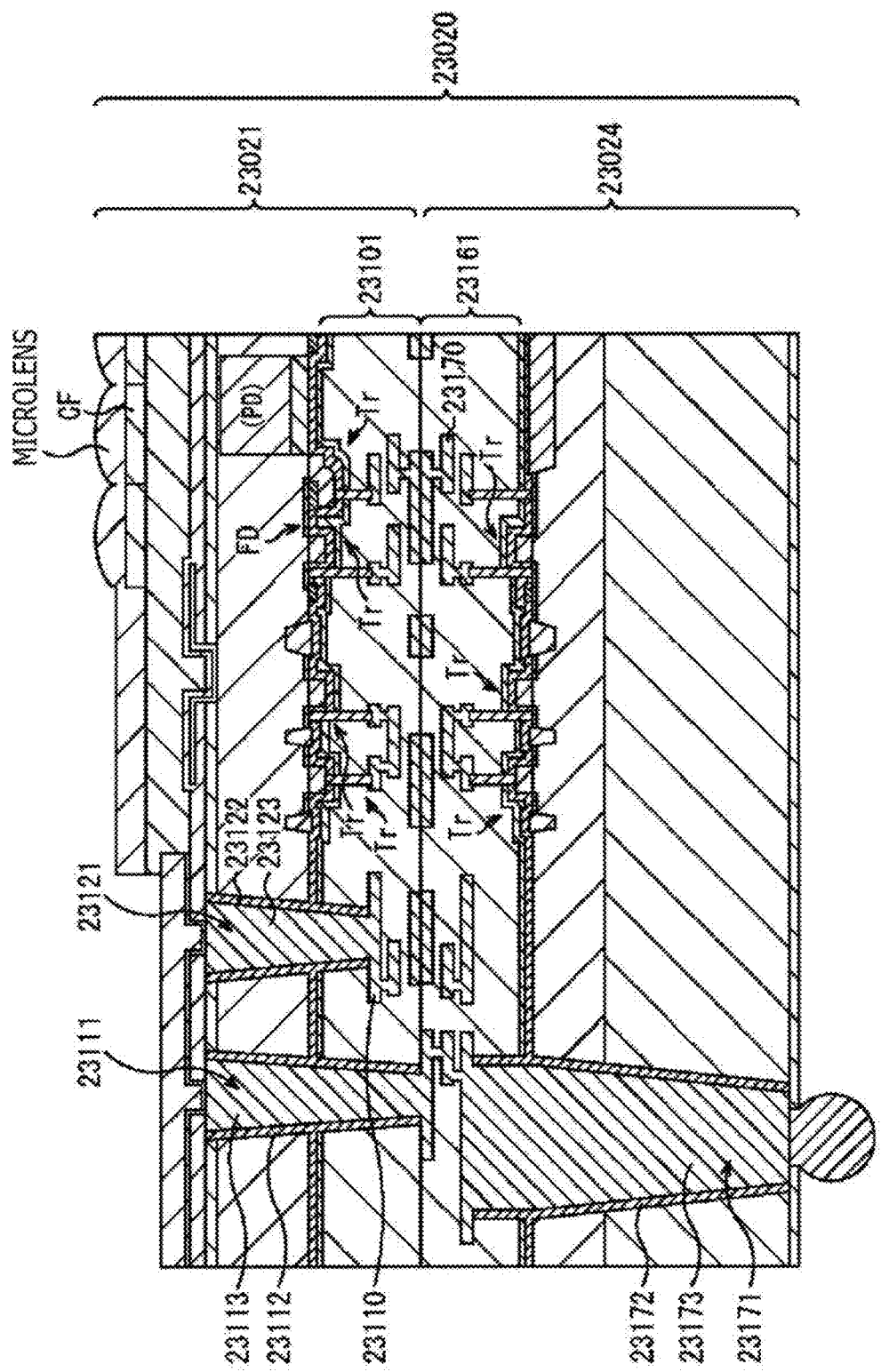
FIG. 5 is a sectional view depicting a third configuration example of the stacked type solid-state imaging apparatus 23020.

FIG. 5 is a sectional view depicting a third configuration example of the stacked type solid-state imaging apparatus 23020.

The solid-state imaging apparatus 23020 of FIG. 5 is different from that in the case of FIG. 3, in which the film 23191 such as a protective film is formed on the faces at which the sensor die 23021 and the logic die 23024 are pasted to each other, in that the film 23191 such as a protective film is not formed on the faces at which the sensor die 23021 and the logic die 23024 are pasted to each other.

The solid-state imaging apparatus 23020 of FIG. 5 is configured by placing the sensor die 23021 and the logic die 23024 one on the other such that the wiring lines 23110 and 23170 contact directly with each other and heating them while a required load is applied to them to directly join the wiring lines 23110 and 23170 to each other.

Figure 6:
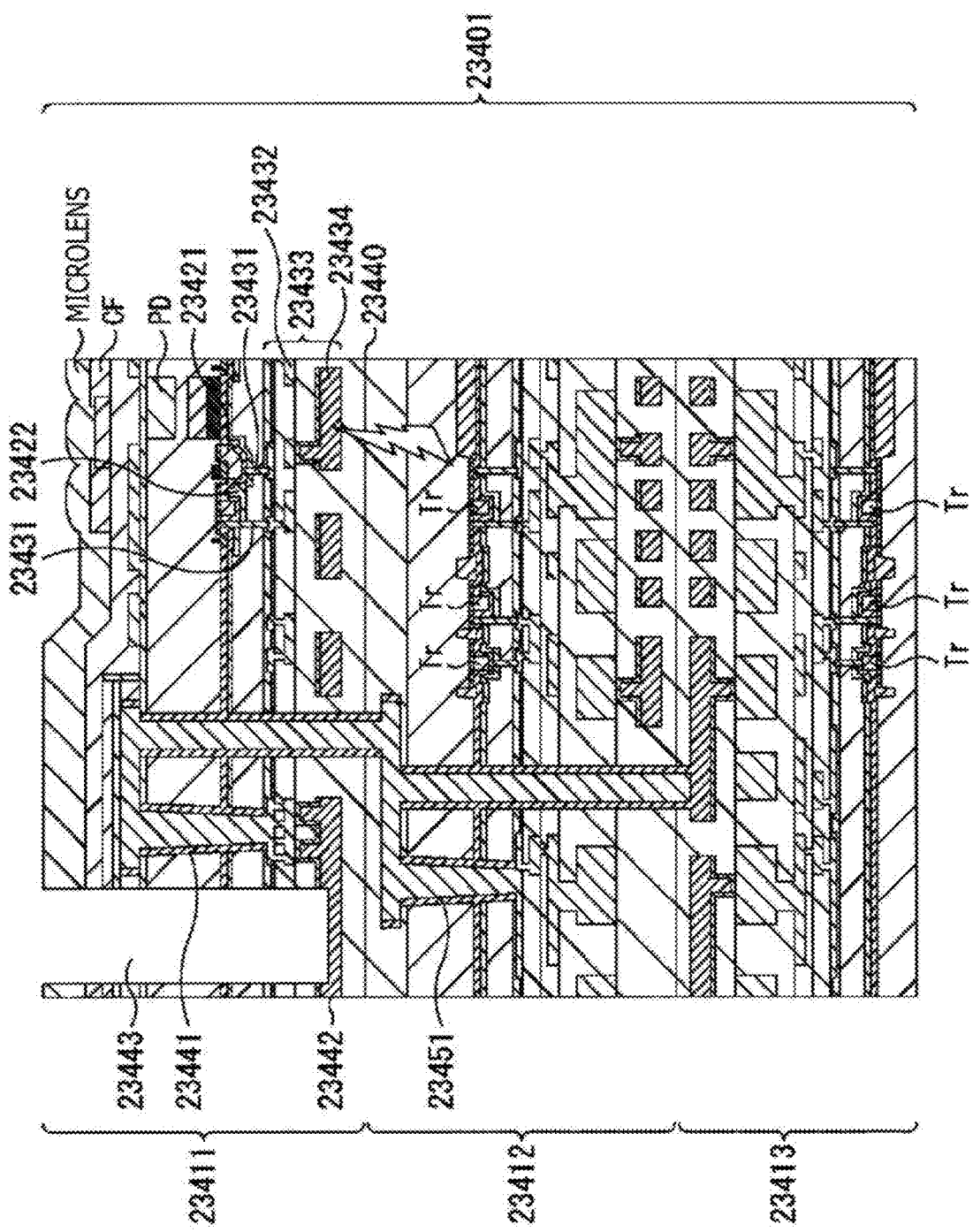
FIG. 6 is a view depicting a different configuration example of a stacked type solid-state imaging apparatus to which the technology according to the present disclosure can be applied.

FIG. 6 is a sectional view depicting a different configuration example of a stacked type solid-state imaging apparatus to which the technology according to the present disclosure can be applied.

In FIG. 6, a solid-state imaging apparatus 23401 has a stacked structure of three layers in which three dies of a sensor die 23411, a logic die 23412 and a memory die 23413 are stacked.

The memory die 23413 includes a memory circuit that stores data to be temporarily required, for example, in signal processing performed by the logic die 23412.

Although, in FIG. 6, the logic die 23412 and the memory die 23413 are stacked in this order under the sensor die 23411, also it is possible to stack the logic die 23412 and the memory die 23413 in the reverse order, namely, in the order of the memory die 23413 and the logic die 23412, under the sensor die 23411.

It is to be noted that, in FIG. 6, in the sensor die 23411, a PD serving as a photoelectric conversion section of a pixel and a source/drain region of a pixel Tr are formed.

A gate electrode is formed around the PD with a gate insulating film interposed therebetween, and a pixel Tr 23421 and a pixel Tr 23422 each include the gate electrode and the source/drain regions paired with each other.

The pixel Tr 23421 neighboring with the PD is a transfer Tr, and one of the paired source/drain regions configuring the pixel Tr 23421 serves as an FD.

Further, in the sensor die 23411, an interlayer insulating film is formed, and a connection hole is formed in the interlayer insulating film. In the connection hole, a connection conductor 23431 connecting to the pixel Tr 23421 and the pixel Tr 23422 is formed.

Furthermore, in the sensor die 23411, a wiring line layer 23433 having a plurality of layers of wiring lines 23432 connecting to the respective connection conductors 23431 is formed.

Further, an aluminum pad 23434 serving as an electrode for external connection is formed in the lowermost layer of the wiring line layer 23433 of the sensor die 23411. In particular, in the sensor die 23411, the aluminum pad 23434 is formed at a position nearer to an adhesion face 23440 to the logic die 23412 than the wiring line 23432. The aluminum pad 23434 is used as one end of a wiring line for inputting and outputting of a signal from and to the outside.

Furthermore, on the sensor die 23411, a contact 23441 that is used for electric connection to the logic die 23412 is formed. The contact 23441 is connected to a contact 23451 of the logic die 23412 and is connected also to an aluminum pad 23442 of the sensor die 23411.

Further, on the sensor die 23411, a pad hole 23443 is formed such that it extends from the rear face side (upper side) of the sensor die 23411 to the aluminum pad 23442.

The technology according to the present disclosure can be applied to such a solid-state imaging apparatus as described above.

It is to be noted that, in the examples described with reference to FIGS. 3 to 6, for example, a copper (Cu) wiring line is used for the various wiring lines. Further, in the following description, a configuration in which wiring lines (for example, the wiring lines 23110 and 23170 depicted in FIG. 5) are directly joined to each other between sensor dies stacked with each other as depicted in FIG. 5 is referred to also as "Cu—Cu joining."

1.2. Functional Configuration

Figure 7:
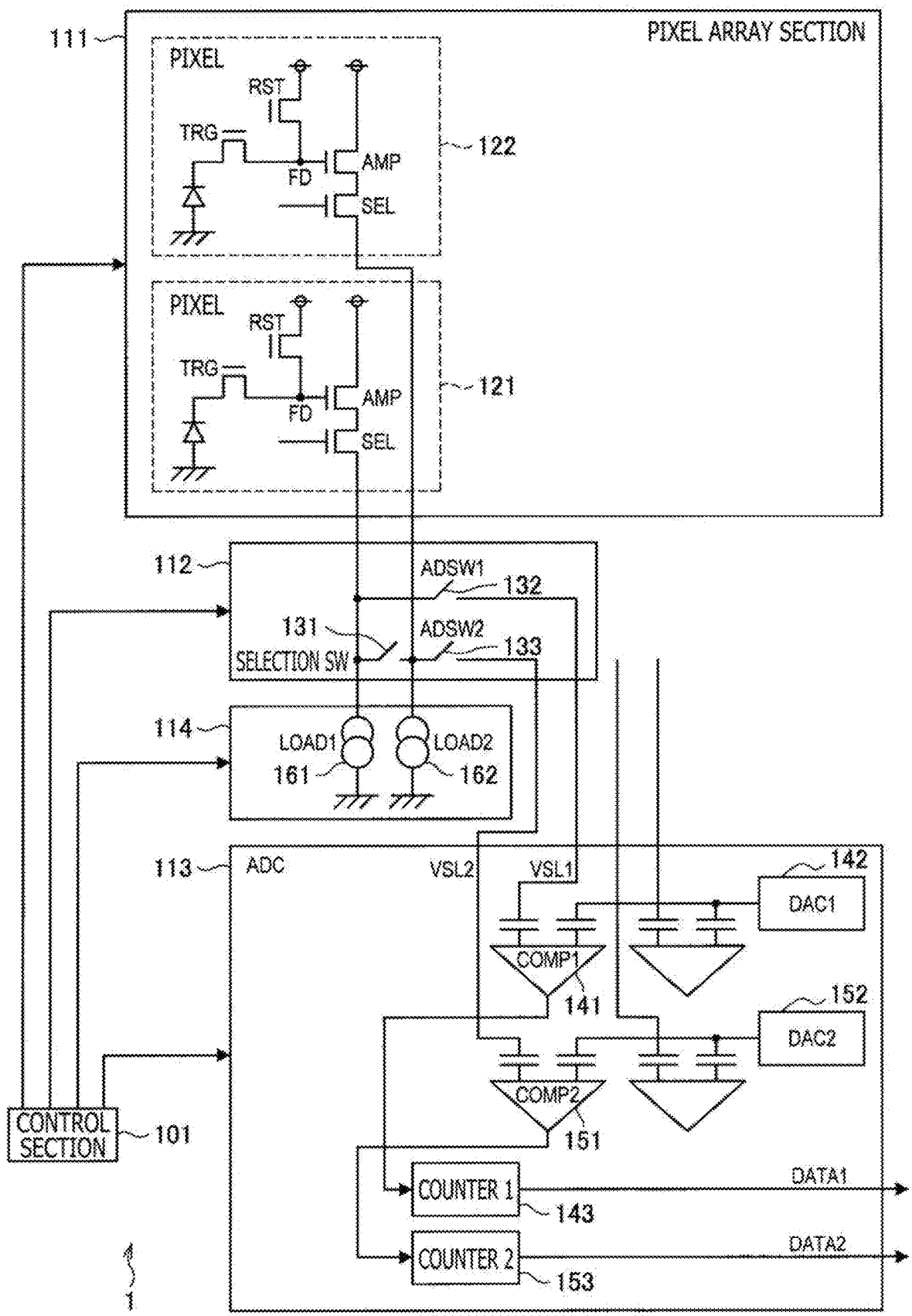
FIG. 7 is a block diagram depicting an example of a functional configuration of part of the solid-state imaging apparatus according to the embodiment of the present disclosure.

Now, an example of a functional configuration of the solid-state imaging apparatus according to the embodiment of the present disclosure is described with reference to FIG. 7. FIG. 7 is a block diagram depicting an example of a functional configuration of part of the solid-state imaging apparatus according to the embodiment of the present disclosure. The solid-state imaging apparatus 1 depicted in FIG. 7 is an imaging device that images an imaging object to obtain digital data of a captured image such as, for example, a CMOS (Complementary Metal Oxide Semiconductor) image sensor or a CCD (Charge Coupled Device) image sensor.

As depicted in FIG. 7, the solid-state imaging apparatus 1 includes a control section 101, a pixel array section 111, a selection section 112, an A/D conversion section (ADC (Analog Digital Converter)) 113 and a fixed current circuit section 114.

The control section 101 controls the components of the solid-state imaging apparatus 1 and causes the components to execute processes relating to reading out and so forth of image data (pixel signal).

The pixel array section 111 is a pixel region in which pixel configurations including a photoelectric conversion element such as a photodiode are arrayed in a matrix (array). The pixel array section 111 is controlled by the control section 101 to cause the pixels to receive light of an imaging object, photoelectrically convert the incident light to accumulate charge, and output the charge accumulated in the pixels as a pixel signal at a predetermined timing.

A pixel 121 and another pixel 122 indicate two pixels neighboring upwardly and downwardly with each other within the pixel group disposed in the pixel array section 111. The pixel 121 and the pixel 122 are pixels in successive rows in a same column with each other. In the case of the example of FIG. 7, as indicated by the pixel 121 and the pixel 122, a photoelectric conversion element and four transistors are used for the circuit of each pixel. It is to be noted that the configuration of the circuit of each pixel is arbitrary and may be different from the example depicted in FIG. 7.

In a general pixel array, an output line for a pixel signal is provided for each column. In the case of the pixel array section 111, two (two systems) of output lines are provided for each one column. The circuits of pixels in one column are connected alternately to the two output lines at every other row. For example, the circuits of the pixels in odd-numbered rows from above are connected to one of the output lines while the circuits of the pixels in even-numbered rows are connected to the other one of the output lines. Although, in the case of the example of FIG. 7, the circuit of the pixel 121 is connected to a first output line (VSL1) and the circuit of the pixel 122 is connected to a second output line (VSL2).

It is to be noted that, although, in FIG. 7, output lines only for one column are depicted for the convenience of description, actually two output lines are provided for each column. To each output line, the circuits of pixels in the column are connected at every other row.

The selection section 112 includes a switch for connecting each output line of the pixel array section 111 to an input of the ADC 113 and controls the connection between the pixel array section 111 and the ADC 113 under the control of the control section 101. In short, a pixel signal read out from the pixel array section 111 is supplied to the ADC 113 through the selection section 112.

The selection section 112 includes a switch 131, another switch 132 and a further switch 133. The switch 131 (selection SW) controls the connection of the two output lines corresponding to the same column. For example, if the switch 131 is placed into an ON state, then the first output line (VSL1) and the second output line (VSL2) are connected to each other, but if the switch 131 is placed into an OFF state, they are disconnected from each other.

Although details are hereinafter described, in the solid-state imaging apparatus 1, one ADC is provided for each of the output lines (column ADC). Accordingly, if it is assumed that the switch 132 and the switch 133 are both in an ON state, then if the switch 131 is placed into an ON state, then the two output lines in the same column are connected to each other, and therefore, the circuit of one pixel is connected to the two ADCs. By contrast, if the switch 131 is placed into an OFF state, then the two output lines of the same column are disconnected from each other, and therefore, the circuit of one pixel is connected to one ADC. In short, the switch 131 selects the number of ADCs (column ADCs) to be made an outputting destination of a signal of one pixel.

Although details are hereinafter described, by controlling the number of ADCs to be made an outputting destination of a pixel signal by the switch 131 in this manner, the solid-state imaging apparatus 1 can output more various pixel signals in response to the number of such ADCs. In short, the solid-state imaging apparatus 1 can implement more various data outputting.

The switch 132 controls the connection between the first output line (VSL1) corresponding to the pixel 121 and the ADC corresponding to the output line. If the switch 132 is placed into an ON state, then the first output line is connected to one of the inputs of a comparator of the corresponding ADC. On the other hand, if the switch 132 is placed into an OFF state, then the connection between them is cancelled.

The switch 133 controls the connection between the second output line (VSL2) corresponding to the pixel 122 and the ADC corresponding to the output line. If the switch 133 is placed into an ON state, then the second output line is connected to one of the inputs of the comparator of the corresponding ADC. On the other hand, if the switch 133 is placed into an OFF state, then the connection between them is cancelled.

The selection section 112 can control the number of ADCs (column ADCs) to be made an outputting destination of a signal of one pixel by switching the state of such switch 131 to switch 133 as described above under the control of the control section 101.

It is to be noted that the switch 132 and/or the switch 133 (one or both of them) may be omitted such that each output line and an ADC corresponding to the output line are normally connected. However, by making it possible to control connection/disconnection of them using the switches described above, the width of selection of the number of ADCs (column ADCs) to be made an outputting destination of a signal of one pixel is expanded. In short, by providing the switches described above, the solid-state imaging apparatus 1 can output more various pixel signals.

It is to be noted that, although FIG. 7 depicts only a configuration of output lines for one column, actually the selection section 112 has a configuration (switch 131 to switch 133) similar to that depicted in FIG. 7 for each column. In short, the selection section 112 performs connection control similar to that described above for each column under the control of the control section 101.

The ADC 113 A/D converts a pixel signal supplied through each output line from the pixel array section 111 and outputs the resulting signal as digital data. The ADC 113 includes an ADC (column ADC) for each output line from the pixel array section 111. In short, the ADC 113 includes a plurality of column ADCs. A column ADC corresponding to one output line is a single slope type ADC including a comparator, a D/A converter (DAC) and a counter.

The comparator compares the DAC output and a signal value of a pixel signal with each other. The counter increments its count value (digital value) until the pixel signal and the DAC output become equal to each other. If the DAC output reaches the signal value, then the comparator stops the counter. Thereafter, signals digitalized by the counters 1 and 2 are outputted to the outside of the solid-state imaging apparatus 1 from DATA1 and DATA2.

The counter returns the count value to its initial value (for example, 0) after the data outputting in order to prepare for next A/D conversion.

The ADC 113 includes two systems of column ADCs for each column. For example, for the first output line (VSL1), a comparator 141 (COMP1), a DAC 142 (DAC1) and a counter 143 (counter 1) are provided and, for the second output line (VSL2), a comparator 151 (COMP2), a DAC 152 (DAC2) and a counter 153 (counter 2) are provided. Though not depicted, the ADC 113 has a similar configuration also for output lines of the other columns.

However, among the components, the DACs can be commonized. Such commonality of the DACs is performed for each system. In other words, the DACs of the systems same as each other in the columns are commonized. In the case of the example of FIG. 7, the DACs corresponding to the first output lines (VSL1) of the columns are commonized as the DAC 142, and the DACs corresponding to the second output lines (VSL2) of the columns are commonized as the DAC 152. It is to be noted that the comparator and the counter are provided for each system of each output line.

The fixed current circuit section 114 is a fixed current circuit connected to each output line and is controlled and driven by the control section 101. The circuit of the fixed current circuit section 114 includes, for example, MOS (Metal Oxide Semiconductor) transistors and so forth. Although this circuit configuration is arbitrary, in FIG. 7, an MOS transistor 161 (LOAD1) is provided on the first output line (VSL1) and an MOS transistor 162 (LOAD2) is provided on the second output line (VSL2).

The control section 101 accepts a request from the outside such as, for example, a user and selects a reading out mode, and controls the selection section 112 to control connection to the output lines. Further, the control section 101 controls, for example, driving of a column ADC in response to the selected reading out mode. Furthermore, the control section 101 controls, in addition to the column ADC, driving of the fixed current circuit section 114 as occasion demands or controls driving of the pixel array section 111 in regard to, for example, a reading out rate, timing and so forth.

In short, the control section 101 can perform not only control of the selection section 112 but can cause the components other than the selection section 112 to operate in more various modes. Accordingly, the solid-state imaging apparatus 1 can output more various pixel signals.

It is to be noted that the number of each of the components depicted in FIG. 7 is arbitrary if not insufficient. For example, for each column, three or more systems of output lines may be provided. Further, the number of pixel signals to be outputted in parallel to the outside may be increased by increasing the number of parallel pixel signals to be outputted from the ADC 132 or the number of the ADCs 132 themselves depicted in FIG. 7.

An example of the functional configuration of the solid-state imaging apparatus according to the one embodiment of the present disclosure is described above with reference to FIG. 7.

1.3. Circuit Configuration of Unit Pixel

Figure 8:
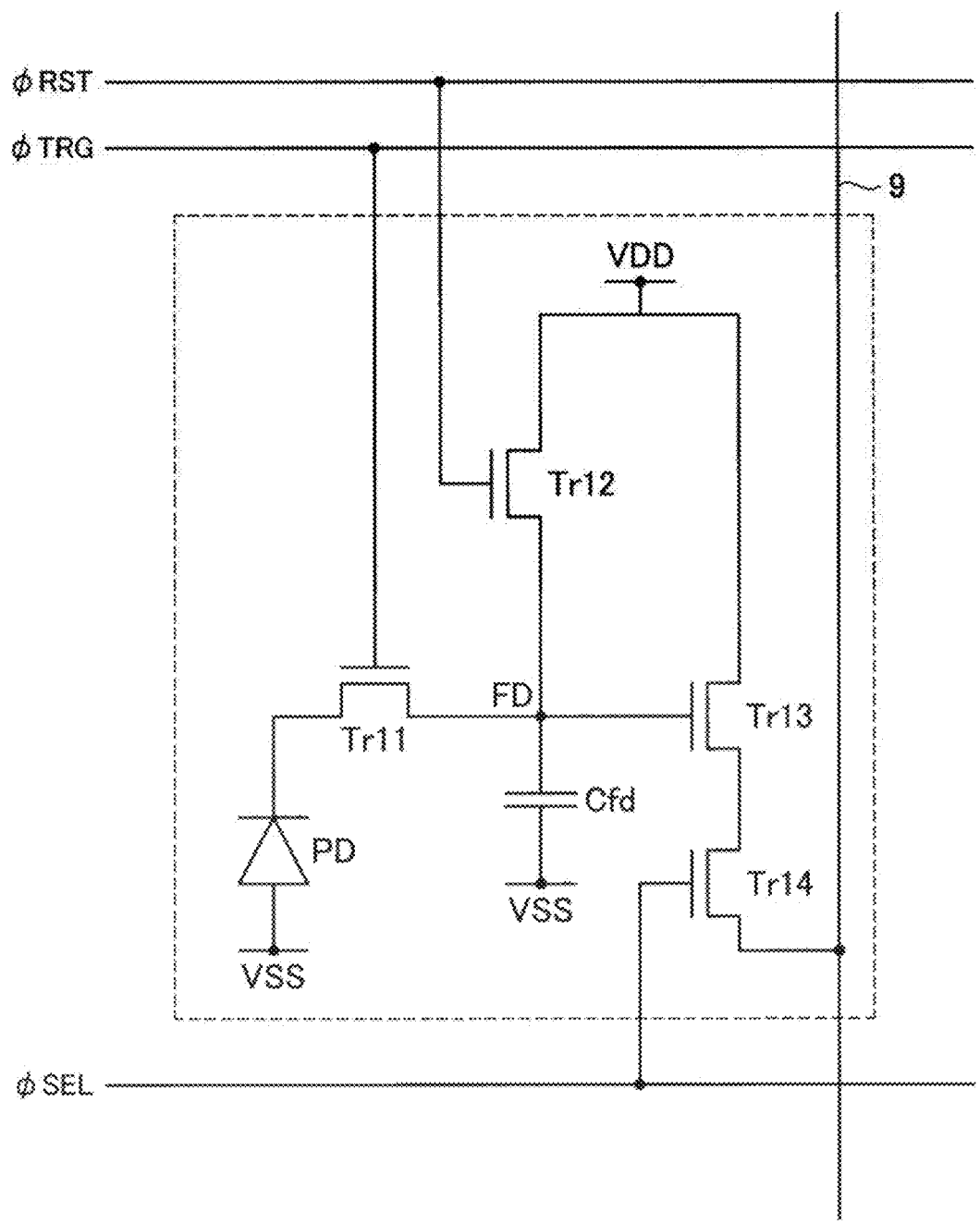
FIG. 8 is a view depicting an example of a circuit configuration of a unit pixel according to the embodiment of the present disclosure.

Subsequently, an example of a circuit configuration of a unit pixel is described with reference to FIG. 8. FIG. 8 is a view depicting an example of a circuit configuration of a unit pixel according to an embodiment of the present disclosure. As depicted in FIG. 8, the unit pixel 121 according to the embodiment of the present disclosure includes a photoelectric conversion section, for example, a photodiode PD, and four pixel transistors. The four pixel transistors are, for example, a transfer transistor Tr11, a reset transistor Tr12, an amplification transistor Tr13 and a selection transistor Tr14. The pixel transistors can include, for example, n-channel MOS transistors.

The transfer transistor Tr11 is connected between the cathode of the photodiode PD and a floating diffusion section FD. Signal charge (here, electrons) obtained by photoelectric conversion by and accumulated in the photodiode PD is transferred to the floating diffusion section FD by application of a transfer pulse φTRG to the gate of the photodiode PD. It is to be noted that reference sign Cfd schematically depicts a parasitic capacitance of the floating diffusion section FD.

The reset transistor Tr12 is connected at the drain thereof to a power supply VDD and at the source thereof to the floating diffusion section FD. Prior to transfer of signal charge from the photodiode PD to the floating diffusion section FD, the potential of the floating diffusion section FD is reset by application of a reset pulse φRST to the gate of the reset transistor Tr12.

The amplification transistor Tr13 is connected at the gate thereof to the floating diffusion section FD, at the drain thereof to the power supply VDD and at the source thereof to the drain of the selection transistor Tr14. The amplification transistor Tr13 outputs the potential of the floating diffusion section FD after reset by the reset transistor Tr12 as a reset level to the selection transistor Tr14. Further, the amplification transistor Tr13 outputs the potential of the floating diffusion section FD after signal charge is transferred by the transfer transistor Tr11 as a signal level to the selection transistor Tr14.

The selection transistor Tr14 is connected, for example, at the drain thereof to the source of the amplification transistor Tr13 and at the source thereof to the vertical signal line 9. The selection transistor Tr14 is placed into an ON state by a selection pulse φSEL applied to the gate thereof and outputs a signal outputted from the amplification transistor Tr13 to the vertical signal line 9. It is to be noted that also it is possible to adopt such a configuration that the selection transistor Tr14 is connected between the power supply VDD and the drain of the amplification transistor Tr13.

It is to be noted that, in the case where the solid-state imaging apparatus 1 according to the present embodiment is configured as a stacked type solid-state imaging apparatus, for example, such elements as a photodiode and a plurality of MOS transistors are formed in the sensor die 23021 in B or C of FIG. 2. Further, a transfer pulse, a reset pulse, a selection pulse and a power supply voltage are supplied from the logic die 23024 in B or C of FIG. 2. Further, elements at succeeding stages to the vertical signal line 9 connected to the drain of the selection transistor, elements at succeeding stages to the vertical signal line 9 connected to the drain of the selection transistor, are configured in the logic circuit 23014 and formed in the logic die 23024.

The example of the circuit configuration of a unit pixel is described above with reference to FIG. 8.

2. Outline of PUF

Now, an outline of the PUF (Physically Unclonable Function) is described. The PUF is a function of outputting a unique value to a device utilizing a physical feature difficult to duplicate. As an example of the PUF, an Arbiter PUF, an SRAM PUB, a Glitch PUF and so forth are listed.

For example, the Arbiter PUF is a technology of utilizing a delay difference between signals arriving at a circuit called Arbiter through two routes to output a value unique to the device. Meanwhile, the SRAM PUF is a technology of utilizing a difference between initial values immediately after the power supply is turned on to an SRAM (Static Random Access Memory) to output a value unique to the device. Further, the Glitch PUF is a technology of utilizing a phenomenon called Glitch that occurs from a delay relation between input and output signals of each of gates configuring a logic circuit to output a value unique to the device.

A value unique to a device generated utilizing such a PUF as described above is expected to be utilized, from its characteristic that it is difficult to duplicate, for example, as an identifier (ID) for identifying an individual device or as so-called key information (for example, a key in encryption).

An outline of the PUF is described above. It is to be noted that, in the description given below, a value unique to a device generated using the PUF described above is referred to also as "PUF value."

3. First Embodiment

As a first embodiment, a solid-state imaging device that internally completes an encryption process is described. A technology for generating a cryptographic key in the inside of an imaging apparatus on the basis of unique information unique to a solid-state imaging device is conventionally available. However, if unique information is outputted from a solid-state imaging device and is encrypted by a function block different from the solid-state imaging device, then there is the possibility that the unique information used in the encryption may leak.

Therefore, the first embodiment described below is directed to a solid-state imaging device that completes an encryption process in the inside thereof using unique information without outputting the unique information to the outside.

3.1. Configuration Example

Figure 9:
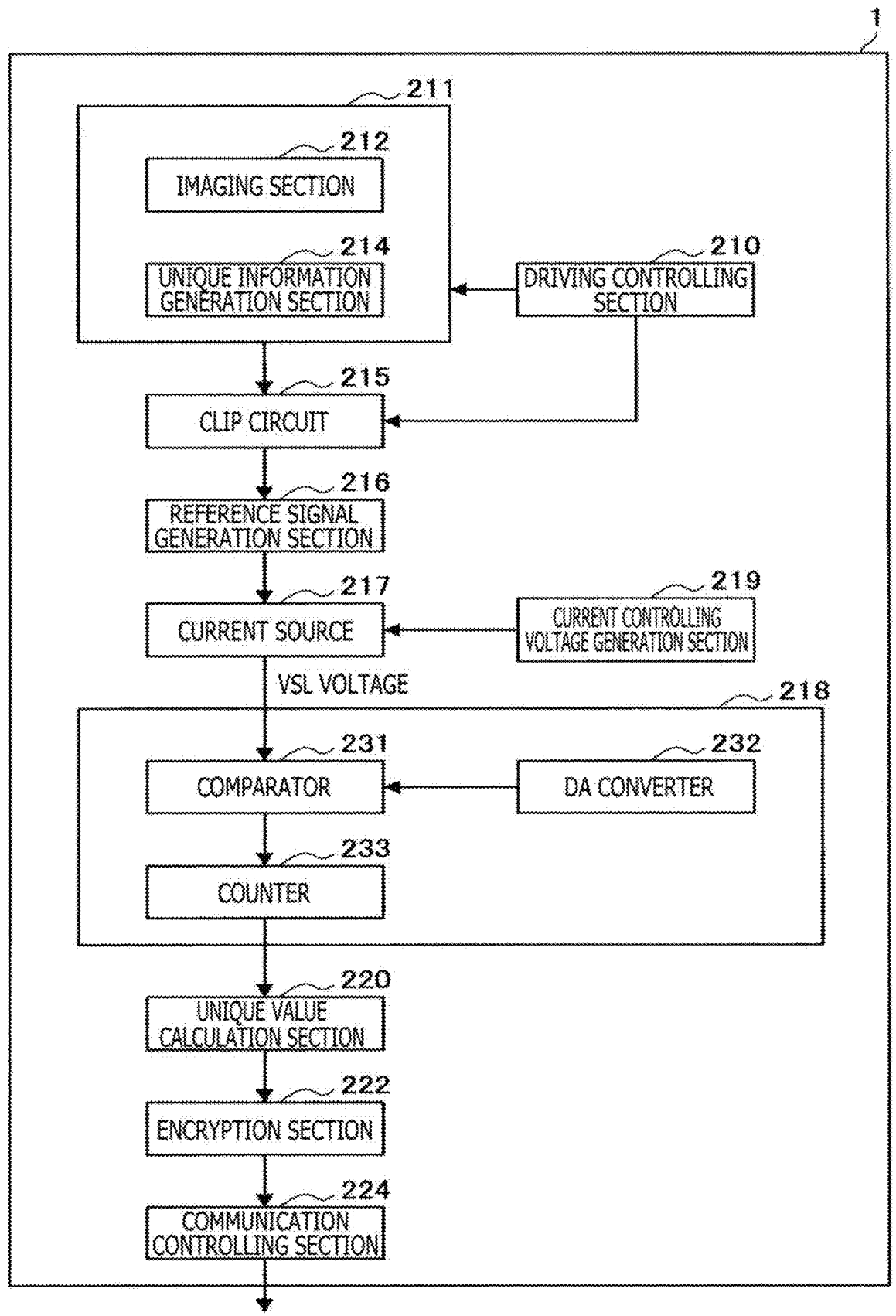
FIG. 9 is an explanatory view depicting a functional configuration example of a solid-state imaging device according to a first embodiment of the present disclosure.

FIG. 9 is an explanatory view depicting a functional configuration example of a solid-state imaging device according to the first embodiment of the present disclosure. What is depicted in FIG. 9 is a functional configuration example of a solid-state imaging apparatus 1 that completes an encryption process using unique information in the inside thereof. In the following, the functional configuration example of the solid-state imaging device according to the first embodiment of the present disclosure is described with reference to FIG. 9.

As depicted in FIG. 9, the solid-state imaging apparatus 1 according to the first embodiment of the present disclosure includes a driving controlling section 210, a pixel array section 211 having predetermined rows and columns and including an imaging section 212 and a unique information generation section 214, a clip circuit 215, a reference signal generation section 216, a current source 217, a detection section 218, a unique value calculation section 220, an encryption section 222 and a communication controlling section 224.

The driving controlling section 210 generates a signal for driving the imaging section 212 or the unique information generation section 214 hereinafter described on the basis of a predetermined input clock and data to drive the imaging section 212 or the unique information generation section 214. The driving controlling section 210 may include, for example, the control circuit 8, the vertical driving circuit 4 and the horizontal driving circuit 6 in the configuration of the solid-state imaging apparatus 1 described hereinabove with reference to FIG. 1. Further, the driving controlling section 210 may be provided in the control circuit 23013 depicted in FIG. 2.

The driving controlling section 210 may have a function for switching, when it drives the pixel array section 211, between driving of the imaging section 212 and driving of the unique information generation section 214. Where the driving controlling section 210 has the function for switching between driving of the imaging section 212 and driving of the unique information generation section 214, commonization of the circuits of the imaging section 212 and the unique information generation section 214 becomes possible. Further, since the driving controlling section 210 has the function for switching between driving of the imaging section 212 and driving of the unique information generation section 214, a unique device for generating unique information is not required and a unique value becomes less likely to be analyzed.

As an alternative, the driving controlling section 210 may have a function for separating a device for being driven when an image is to be outputted and a device for being driven in order to detect device unique information in the pixel array section 211. Where the driving controlling section 210 has the function for separating a device for being driven when an image is to be outputted and a device for being driven in order to detect device unique information, device unique information becomes less likely to leak.

As an alternative, the driving controlling section 210 may control such that, upon driving for detecting device unique information, bias current different from that upon driving when an image is outputted may be used for driving. Where the driving controlling section 210 controls such that, upon driving for detecting device unique information, bias current different from that upon driving when an image is outputted is used for driving, driving suitable to stably obtain a unique value becomes possible. In particular, for example, driving of the MOS transistor 161 (LOAD1) and the MOS transistor 162 (LOAD2) in the circuit depicted in FIG. 7 can be made differ upon driving for detecting device unique information and upon driving for outputting an image. By making driving of the MOS transistor 161 (LOAD1) and the MOS transistor 162 (LOAD2) differ, a characteristic appearing at the amplification transistor AMP can be changed. Where the driving controlling section 210 controls such that driving for detecting device unique information is performed with bias current according to the temperature, driving for obtaining a more stable unique value becomes possible.

When the driving controlling section 210 performs driving for detecting device unique information with bias current different from that upon driving when an image is outputted, the driving controlling section 210 may control such that driving is performed with bias current according to a chip temperature of the solid-state imaging apparatus 1.

The pixel array section 211 is configured such that unit pixels of predetermined rows and columns are arrayed and data is outputted by a source follower circuit.

The imaging section 212 has a pixel array in which a plurality of pixels including a photoelectric conversion section are arrayed in a two-dimensional array and is driven by the driving controlling section 210 to output an analog signal. The circuit configuration of each pixel in the imaging section 212 is, for example, such as depicted in FIG. 8.

In the unique information generation section 214, for example, circuits having a configuration same as that of the pixels provided in the imaging section 212 are arrayed one-dimensionally and are driven by the driving controlling section 210 to output an analog signal. The circuit formed as the unique information generation section 214 may be produced by substantially the same production steps as those of the pixels provided in the imaging section 212. Further, the driving controlling section 210 may perform switching between driving of the imaging section 212 and driving of the unique information generation section 214.

The unique information generation section 214 may be pixels provided in an optical black (OPB) region in the pixel array. The devices in the circuit configured as the unique information generation section 214 have a physical dispersion upon production. In the solid-state imaging apparatus 1 according to the first embodiment of the present disclosure, unique information that cannot be duplicated (device unique information) is based on an analog signal outputted from the unique information generation section 214.

An example of a generation source of an analog signal to be outputted from the unique information generation section 214 is described. In the following description, it is assumed that the unique information generation section 214 has a configuration similar to that of the pixel 121 depicted in FIG. 7 or 8.

(Photodiode PD) The photodiode PD has a noise component arising from crystal defect upon production. The crystal defect gives rise to dispersion of dark current. The crystal defect appears as fixed pattern noise.

(Selection Transistor SEL)

The selection transistor SEL has a noise component arising from a dispersion of a threshold voltage Vth. The dispersion of the threshold voltage Vth arises from a structural dispersion of an oxide film, a channel width, a channel length, impurities and so forth. The dispersion of the threshold voltage Vth appears as fixed pattern noise.

(Reset Transistor RST)

Also the reset transistor RST has a noise component arising from a dispersion of the threshold voltage Vth. The dispersion of the threshold voltage Vth arises from a structural dispersion of an oxide film, a channel width, a channel length, impurities and so forth. The dispersion of the threshold voltage Vth appears as fixed pattern noise.

(Floating Diffusion Section FD)

The floating diffusion section FD has a noise component arising from a crystal defect upon production. The crystal defect gives rise to a dispersion of dark current. The crystal defect appears as fixed pattern noise. When the reset transistor RST switches from ON to OFF, kTC noise (reset noise) appears at the floating diffusion section FD. This kTC noise appears temporarily. When the reset transistor RST switches from ON to OFF, feedthrough appears at the floating diffusion section FD. This feedthrough arises from dispersion or a threshold value of the parasitic capacitance and appears as fixed pattern noise.

(Amplification Transistor AMP)

Also the amplification transistor AMP has a noise component arising from a dispersion of the threshold voltage Vth. The dispersion of the threshold voltage Vth arises from a structural dispersion of an oxide film, a channel width, a channel length, impurities and so forth. The dispersion of the threshold voltage Vth appears as fixed pattern noise. Further, the amplification transistor AMP has a noise component arising from an overdrive voltage, a noise component arising from thermal noise, a noise component arising from 1/f noise and a noise component arising from random telegraph noise (RTN). It is considered that the RTN arises from trap-detrap of charge by a defect in an oxide film. Although presence or absence of a defect in an oxide film is a unique dispersion, what is observed is a temporal signal level variation of two values or multi-values.

Those noise components are transmitted to the detection section 218 at the succeeding stage through a signal line (VSL). Upon ordinary driving, noise components that do not change before and after transfer of a signal from among the noise components are removed by a CDS process. In the present embodiment, when the solid-state imaging apparatus 1 generates a unique value, it does not remove such noise components as described above but uses the noise components as device unique information on which a unique value is based. By using noise components included in an analog signal outputted from the unique information generation section 214 as the basis of a unique value, the solid-state imaging apparatus 1 makes it possible to generate a unique value that is less likely to be analyzed.

The unique information generation section 214 can be provided, for example, at a position that is not reached by light from the outside (shaded position). Since the unique information generation section 214 is provided at a shaded position, the solid-state imaging apparatus 1 can generate stable unique information without being influenced by ambient light. Further, the unique information generation section 214 may include circuits equal in number to the columns of the pixel array of the imaging section 212 in one or a plurality of rows. Further, the unique information generation section 214 may include a row selection switch that operates in accordance with a control signal from the driving controlling section 210.

The clip circuit 215 is a circuit arrayed in n columns equal to the number of columns of the pixel array section 211 and is a source follower circuit connected in parallel to the source follower circuit of the pixel array section 211. The clip circuit 215 has a function for clipping the voltage of an output line for each column (VSL voltage) such that the voltage is included in a predetermined range.

Figure 10A:
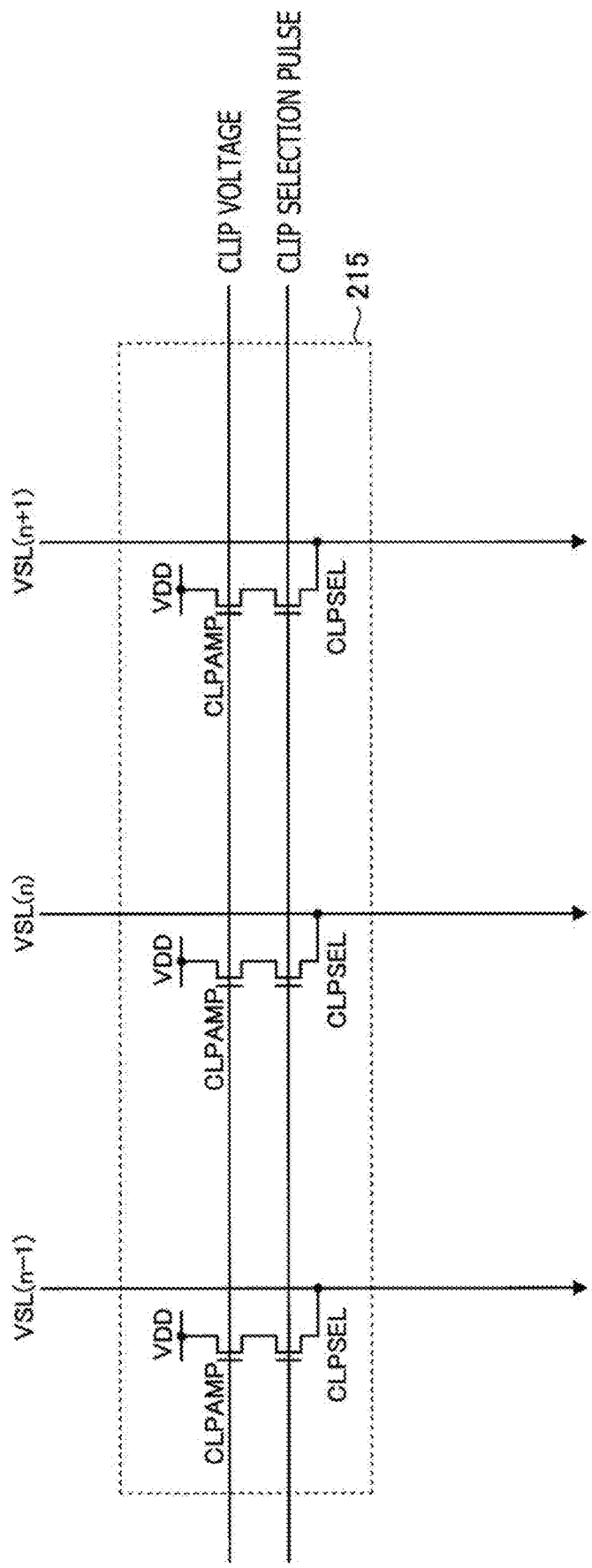
FIG. 10A is an explanatory view depicting a circuit configuration example of a clip circuit in the first embodiment.

FIG. 10A is an explanatory view depicting a circuit configuration example of the clip circuit 215. The clip circuit 215 is a source follower circuit connected to a respective output lines VSL in parallel to a pixel and capable of selecting a row. The clip circuit 215 includes transistors CLPSEL and CLPAMP corresponding to the respective output lines VSL. The transistor CLPSEL is a transistor that operates linearly and performs control for connecting the source of the transistor CLPAMP and the output line VSL. Such control is performed with a clip selection pulse. The transistor CLPAMP is a transistor that performs saturation operation and outputs, if bias current is supplied thereto from a current source, a signal according to the input similarly to the amplification transistor AMP of the pixel. The input is given by a clip voltage and normally is an intermediate potential of approximately 1 to 2 V or the like.

In a selection state, if the output voltage of the source follower (pixel of the selected row) connected to the output line VSL becomes lower than a voltage that is outputted in response to the clip voltage, then bias current flows preferentially to the clip circuit 215. As a result, the source follower output of the pixel of the selected row stops its function and the voltage of the output line VSL is clipped to the output level according to the clip voltage. Although a DC voltage common to the unit clip circuits for each column is supplied as the clip voltage, at this time, the threshold value or the overdrive voltage individually disperses similarly to the pixel source follower.

The reference signal generation section 216 averages the VSL voltages outputted for the individual columns from the clip circuits 215 and outputs the averaged VSL voltage. The current source 217 is a circuit for supplying fixed current to output a VSL voltage and is driven by a current controlling voltage generation section 219. The current source 217 is arrayed in n columns and forms a source follower circuit together with the amplification transistor in the unit pixel. The current controlling voltage generation section 219 generates a current-controlling voltage such that the current value of the current source 217 does not rely upon the temperature by a band gap reference circuit.

The detection section 218 performs signal processing for converting an analog signal outputted from the unique information generation section 214 into a digital signal. The detection section 218 includes a comparator 231, a DA converter 232 and a counter 233. The comparator 231 compares a VSL voltage outputted from the current source 217 and a reference waveform outputted from the DA converter 232 with each other to convert the voltage into a time period. The comparator 231 includes an input capacitor provided on the input side and a switch that short circuits an input and an output of the comparator 231. The DA converter 232 generates a reference waveform to be supplied to the comparator 231. The counter 233 has a function for counting until the output of the comparator 231 is reversed to convert a time period into a count number.

The detection section 218 outputs a digital signal after conversion to the unique value calculation section 220. The detection section 218 can include, in addition to the function for converting an analog signal into a digital signal, a function for difference processing two input signals and a function for removing a dispersion occurring in the detection section 218 itself. Since the detection section 218 includes the function for removing a dispersion that occurs in the detection section 218 itself, a further dispersion is not provided to a signal from the unique information generation section 214, and therefore, the quality of a signal on which a unique value is based can be enhanced. Further, the detection section 218 may perform a column parallel process or may perform a pixel parallel process for an analog signal outputted from the unique information generation section 214.

The detection section 218 may include a capacitor for clamping the potential of a signal line and a switch for setting one end of the capacitor to a reference potential. In particular, the detection section 218 may include a switch that connects one end of a capacitive element provided on the input side of the comparators 141 and 151 of the ADC 113 depicted in FIG. 7 and the output side of the comparators 141 and 151 to each other. Since the one end of the capacitive element and the output side of the comparators 141 and 151 are connected to each other by the switch, transistors that are connected to each other by diode connection appear among the transistors included in the comparators 141 and 151 appear. This makes it possible to remove a dispersion in an analog region because one end of the capacitor that clamps the potential of the signal line is set to a predetermined reference potential. Further, the detection section 218 may perform difference processing of digital values after AD conversion. The detection section 218 can remove a dispersion in a digital region by the difference process of digital values after AD conversion.

Further, the detection section 218 may have a function for shifting the clamp level as hereinafter described. The detection section 218 can optimize, by shifting the clamp level, the distribution of analog values centered at a predetermined reference upon conversion from an analog value into a digital value. By optimizing the distribution of analog values, unique information outputted from the unique information generation section 214 can be obtained without any loss.

In the case where a plurality of detection sections 218 are arrayed, the detection sections 218 may each have a function for calculating a difference between a signal inputted to the detection section 218 and a reference signal common to the plurality of detection sections 218. In this case, the reference signal common to the plurality of detection sections 218 may be substantially the same as an average of signals inputted to the detection sections 218.

Between the unique information generation section 214 and the detection section 218, a memory for temporarily retaining unique information outputted from the unique information generation section 214, especially, an analog memory, may be provided. The analog memory may be a parasitic capacitance of a signal line as hereinafter described. Further, in the case where an analog memory is provided between the unique information generation section 214 and each of the plurality of detection sections 218, a switch for short circuiting the analog memories may be provided. This facilitates generation of unique information, and by short circuiting the analog memories to perform averaging, the unique information retained in the individual analog memories is erased.

Figure 10B:
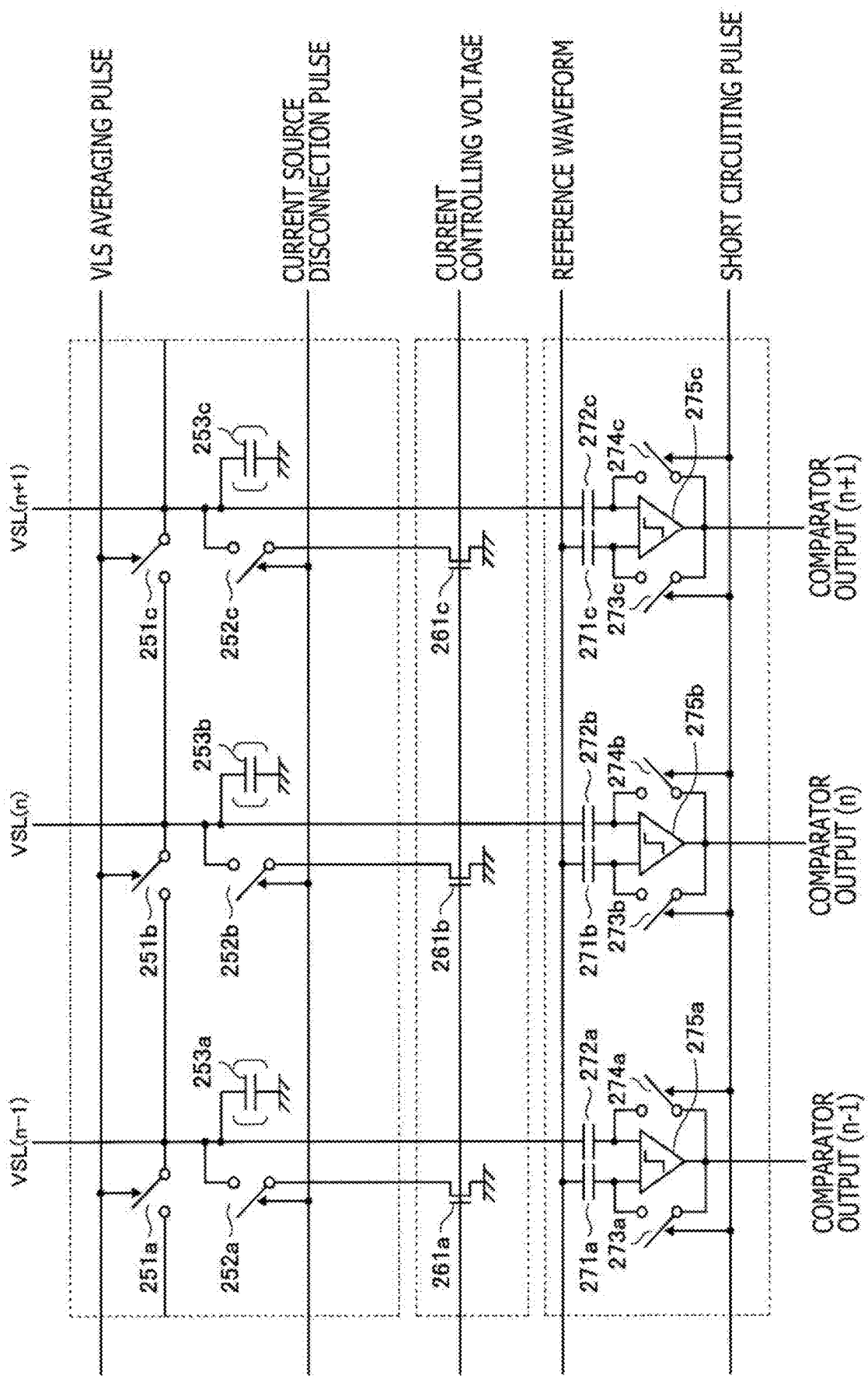
FIG. 10B is an explanatory view depicting a circuit configuration example of a reference signal generation section, a current source and a comparator in the first embodiment.

FIG. 10B is an explanatory view depicting a circuit configuration example of the reference signal generation section 216, the current source 217 and the comparator 231. In FIG. 10B, the (n−1)th output line VSL(n−1), nth output line VSL(n) and (n+1)th output line VSL(n+1) are depicted.

On the output line VSL(n−1), switches 251a and 252a are provided as the reference signal generation section 216, and the output line VSL(n−1) has a parasitic capacitance 253a. On the output line VSL(n), switches 251b and 252b are provided as the reference signal generation section 216, and the output line VSL(n) has a parasitic capacitance 253b. On the output line VSL(n+1), switches 251c and 252c are provided as the reference signal generation section 216, and the output line VSL(n+1) has a parasitic capacitance 253c.

As the current source 217, a transistor 261a is connected to one end of the switch 252a; a transistor 261b is connected to one end of the switch 252b; and a transistor 261c is connected to one end of the switch 252c.

The output line VSL(n−1) has input capacitors 271a and 272a, switches 273a and 274a and a comparator 275a as the comparator 231. The output line VSL(n) has input capacitors 271b and 272b, switches 273b and 274b and a comparator 275b as the comparator 231. The output line VSL(n+1) has input capacitors 271c and 272c, switches 273c and 274c and a comparator 275c as the comparator 231.

Figure 11A:
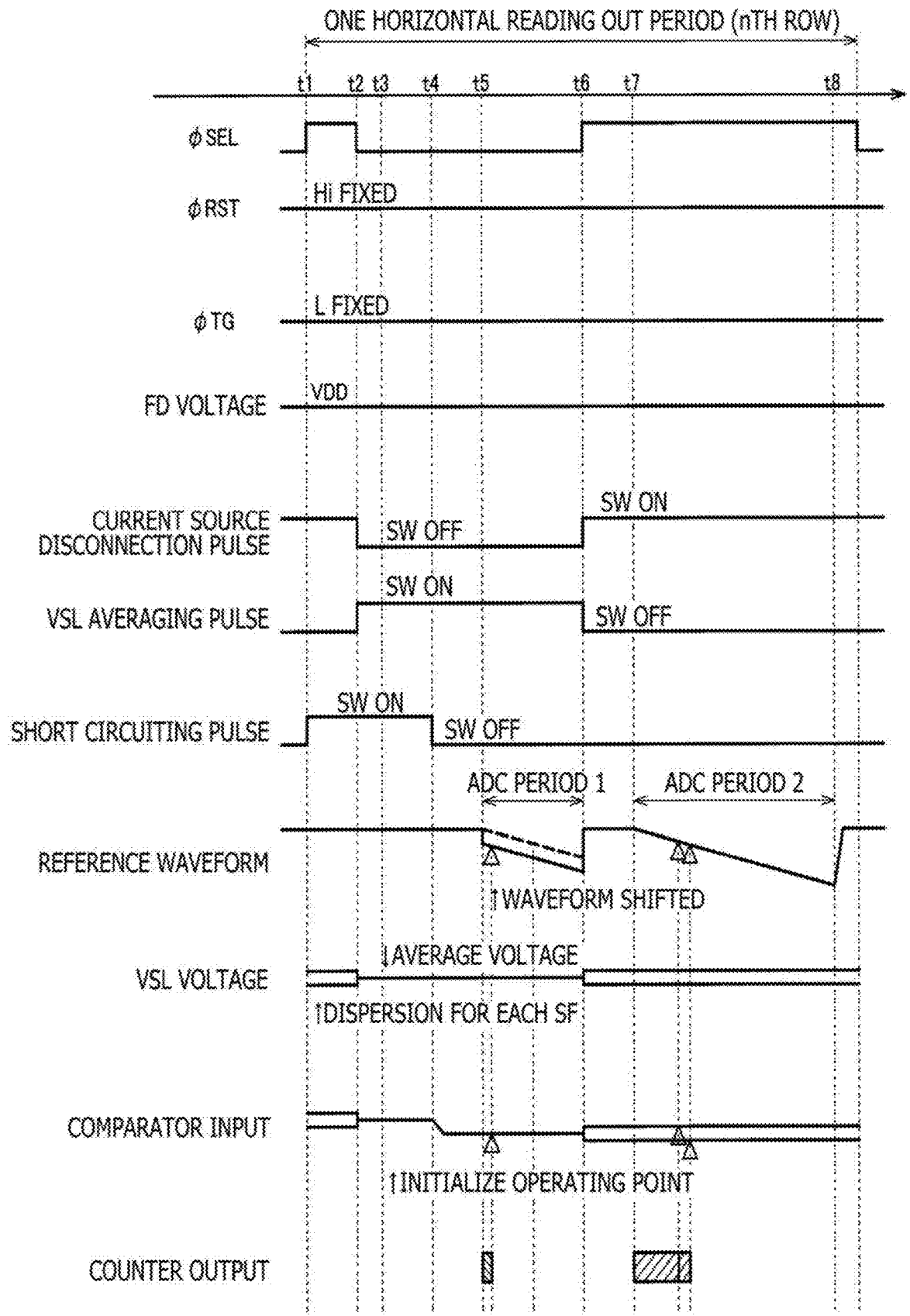
FIG. 11A is an explanatory view depicting, in a timing chart, operation when unique information relating to the first embodiment is generated.

FIG. 11A is an explanatory view depicting, in a timing chart, operation of the reference signal generation section 216, the current source 217 and the comparator 231 when unique information is generated. In the following, operation of elements provided on or along the output line VSL(n−1) is described.

One horizontal reading out period is started at time t1. At this point of time, the row selection signal φSEL becomes high and row selection is started. At this point of time, since the reset transistor RST is in an ON state, the voltage of the floating diffusion section FD is fixed to VDD. Consequently, the dispersion of the floating diffusion section FD is removed. Further, when unique information is to be generated, the transfer pulse φTRG is fixed to the low level. Since the transfer pulse φTRG is fixed to the low level, the transfer transistor TRG becomes OFF, and the dispersion of the photodiode PD can be removed.

Further, at time t1, a current source disconnection pulse for disconnecting the current source 217 is high, and the switch 252a is ON. Further, at time t1, a VSL averaging pulse for averaging the VSL voltage is low, and the switch 251a is OFF. Consequently, even if a source follower operation is performed, dispersion information for each source follower is outputted to the output line VSL.

At time t2, the row selection signal (selection pulse) φSEL and the current source disconnection pulse become the low level simultaneously, and the VSL voltage for each column is retained into the parasitic capacitance 253a of the VSL. Further, at time t2, the VSL averaging pulse becomes high, and the VSL voltage for each column is averaged. This averaged VSL voltage becomes a reference signal.

At the point of time of time t3, an internal offset of the comparator 275a and the difference between the VSL voltage and a reference waveform are charged into the input capacitor 272a, and the operating point of the comparator 275a is initialized.

At time t4, the short circuiting pulse becomes low, and the switches 273a and 274a are turned off. Consequently, kTC noise and feedthrough dispersion at the switches 273a and 274a are generated.

A period from time t5 to time t6 is a first AD conversion period (ADC period 1). During this period, the DA converter 232 changes the reference waveform linearly with a predetermined inclination. Then, the comparator 275a AD converts the reference signal using the reference waveform. The DA converter 232 may have a function for shifting the reference waveform. In other words, the DA converter 232 may have a function for shifting the clamp level. The DA converter 232 can provide an offset to an output of the counter 233 by shifting the reference waveform. Further, within this ADC period 1, reversal delay of the comparator 275a, delay of the reference waveform and clock delay of the counter occur. It is to be noted that what is indicated by a triangle in FIG. 11A is a reversal timing of the comparator 275a.

When the ADC period 1 ends at time t6, the row selection signal φSEL becomes high; the current source disconnection pulse becomes high, and the VSL averaging pulse becomes low. In particular, the switch 251a becomes OFF and the switch 252a becomes ON. Consequently, even if a source follower operation is performed, dispersion information for each source follower (dispersion of an output of the amplification transistor) is outputted to the output line VSL.

A period from time t7 to time t8 is a second AD conversion period (ADC period 2). Also during the period, the DA converter 232 changes the reference waveform linearly with a predetermined inclination. Thus, the comparator 275a AD converts the reference signal using the reference waveform. Here, the digital value after the conversion includes kTC noise and feedthrough dispersion at the switches 273a and 274a generated at time t4 and reversal delay of the comparator 275a, delay of the reference waveform and clock delay of the counter occurring within the ADC period 1 similarly. It is to be noted that what is indicated by a triangle in FIG. 11A is a reversal timing of the comparator 275a.

Therefore, after the ADC period 2 ends, a difference process between the count value of the counter 233 during the ADC period 1 and the count value of the counter 233 during the ADC period 2 is performed. By this difference process, a dispersion occurring in the detection section 218 can be removed. Accordingly, a dispersion occurring in the detection section 218 can be prevented from being included in the device unique information.

Further, since an offset is applied to the output of the counter 233 within the ADC period 1, even if the difference process is performed, the dispersion by the unique information generation section 214 is not lost. The dispersion by the unique information generation section 214 indicates a normal distribution centered at the reference signal. Accordingly, if the offset is not applied, then a negative value appears with the dispersion by the unique information generation section 214, and the values equal to or lower than 0 all become 0.

Preferably, the inclination of the reference waveform upon AD conversion is adjusted (analog gain adjustment) such that a desired digital value is obtained. Further, upon reading out of device unique information, the current of the current source (drain current Id) may be made smaller than that upon ordinary reading out. Although the overdrive voltage can be calculated by 2×Id/gm, since also the dispersion increases in proportion to the overdrive voltage, if the drain current Id is reduced, then the dispersion component of the overdrive voltage included in the source follower relatively decreases. In short, information of the dispersion principally of the threshold value of the amplification transistor AMP can be detected. Further, upon reading out of the device unique information, the current of the current source (drain current Id) may be made higher than that upon ordinary reading out. By increasing the current of the current source, also it is possible to make the dispersion component of the overdrive voltage from within the dispersion information included in the source follower relatively great.

Although temporal noise includes thermal noise of the amplification transistor AMP, 1/f noise, RTN and thermal noise of peripheral circuits, if reading out is performed by a plural number of times and results are added (averaged), then they can be suppressed.

In order to suppress time-dependent deterioration, the solid-state imaging apparatus 1 preferably performs driving control in accordance with the following conditions. Taking hot carrier injection into consideration, preferably the current upon operation is low. In other words, the bias current is preferably controlled so as to become low. Similarly, taking hot carrier injection into consideration, preferably the operating time period is short. For example, it is preferable to perform control such that driving is performed only upon activation or upon request. Similarly, taking hot carrier injection into consideration, it is preferable not to supply current when the solid-state imaging apparatus 1 is not used. In particular, it is preferable to turn off the selection transistor SEL when the solid-state imaging apparatus 1 is not used. Further, taking destruction of an oxide film into consideration, when the solid-state imaging apparatus 1 is not used, the voltage difference between the gate and the source or the drain of a target device is small. In other words, when the solid-state imaging apparatus 1 is not used, it is preferable to turn on the reset transistor RST. Further, taking substrate hot carrier injection into consideration, preferably the unique information generation section 214 is shielded.

Although the potential of the high level of the selection pulse φSEL may be approximately VDD (2.7 V), it may otherwise be an intermediate potential (approximately 1 to 1.5 V). If the potential difference (VDS) between the drain and the source of the selection transistor SEL is applied such that saturation operation is to be performed, then a source follower is formed. For example, where the drain voltage of the selection transistor SEL is 2.7 V, the voltage of the drain side of the selection transistor SEL (source side of the amplification transistor AMP) normally is approximately 2.2 V. In contrast, if VDS of the selection transistor SEL is sufficient (if there is a difference of at least approximately several hundreds to 700 mV), then saturation operation can be achieved. Consequently, an output according to the gate voltage of the selection transistor SEL is transmitted to the output line VSL. If also the selection transistor SEL is caused to perform saturation operation similarly to the amplification transistor AMP, then since the threshold value and the overdrive voltage disperse for each device, a dispersion of the threshold value and the overdrive voltage of the selection transistor SEL can be detected. Thereupon, the pixels and the clip circuit 215 in a non-selected row do not participate in reading out because the selection switch is turned off.

The current controlling voltage generation section 219 can change the overdrive voltage by driving the current controlling voltage that is different between the ADC period 1 and the ADC period 2. Since the changing amount of the overdrive voltage at this time disperses, the changing amount of the overdrive voltage can be detected as device unique information.

Figure 11B:
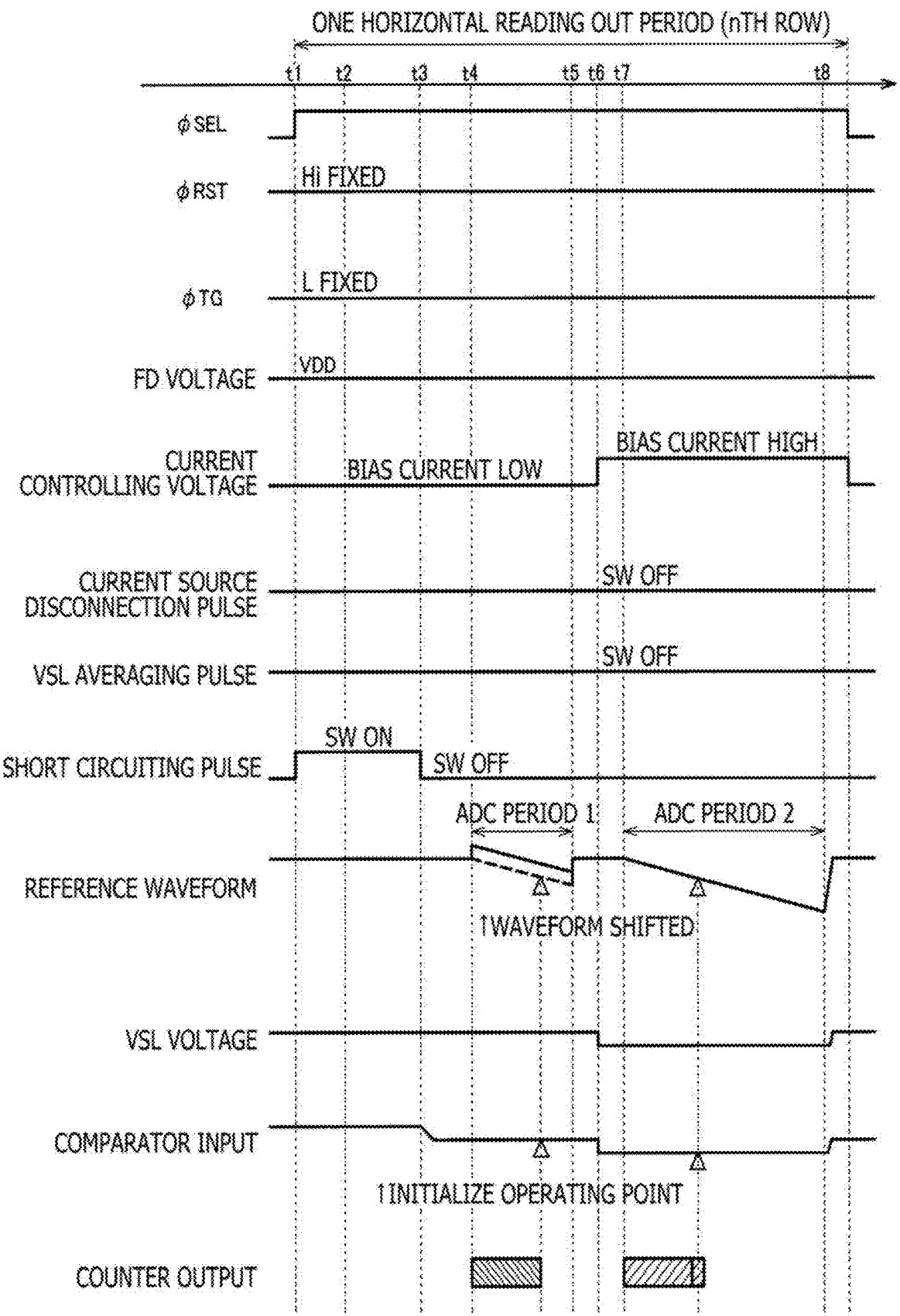
FIG. 11B is an explanatory view depicting, in a timing chart, operation when unique information relating to the first embodiment is generated.

FIG. 11B is an explanatory view depicting, in a timing chart, operation of the reference signal generation section 216, the current source 217 and the comparator 231 when unique information is generated. In the following, operation of elements provided on the output line VSL(n−1) or along the output line VSL(n−1) is described. The timing chart of FIG. 11B is different from the timing chart of FIG. 11A in that the current source disconnection pulse and the VSL averaging pulse are normally in the low level.

One horizontal reading out period is started at time t1. At this point of time, the row selection signal φSEL becomes high and row selection is started. At this point of time, since the reset transistor RST is in an ON state, the voltage of the floating diffusion section FD is fixed to VDD. Consequently, the dispersion of the floating diffusion section FD is removed. Further, when unique information is generated, the transfer pulse φTRG is fixed to the low level. Since the transfer pulse φTRG is fixed to the low level, the transfer transistor TRG is turned off and the dispersion of the photodiode PD can be removed.

At the point of time of time t2, the internal offset of the comparator 275a and the difference between the VSL voltage and the reference waveform are charged into the input capacitor 272a, and the operating point of the comparator 275a is initialized.

At time t3, the short-circuiting pulse becomes low, and the switches 273a and 274a are turned off. Consequently, kTC noise and feedthrough dispersion at the switches 273a and 274a are generated.

The period from time t4 to time t5 is a first AD conversion period (ADC period 1). During this period of time, the DA converter 232 changes the reference waveform linearly with a predetermined inclination. Then, the comparator 275a AD converts the reference signal using the reference waveform. Within this ADC period 1, reversal delay of the comparator 275a, delay of the reference waveform and clock delay of the counter occur. It is to be noted that what is indicated by a triangle in FIG. 11B is a reversal timing of the comparator 275a.

Then, at the point of time of time t6, the current controlling voltage generation section 219 controls the current controlling voltage such that the bias current increases.

The period from time t7 to time t8 is a second AD conversion period (ADC period 2). Also during this period, the DA converter 232 changes the reference waveform linearly with a predetermined inclination. Then, the comparator 275a AD converts the reference signal using the reference waveform. Here, the digital value after the conversion similarly includes kTC noise and feedthrough dispersion at the switches 273a and 274a having occurred at time t4, reversal delay of the comparator 275a, delay of the reference waveform and clock delay of the counter having occurred within the ADC period 1. It is to be noted that what is indicated by a triangle in FIG. 11B is a reversal timing of the comparator 275a.

Therefore, after the ADC period 2 ends, a difference process between the count value of the counter 233 during the ADC period 1 and the count value of the counter 233 during the ADC period 2 is performed. By this difference process, a dispersion occurring in the detection section 218 can be removed. Since only the bias current value is different between the ADC period 1 and the ADC period 2, the threshold value information is cancelled and extraction of a component of the overdrive voltage becomes possible. Here, the gain coefficient β of the transistor is $(W/L) \times \mu \times C_{ox}$. W is the gate width; L the gate length; μ the mobility of electrons; and $C_{ox}$ the oxide film capacitance per unit area. Further, the mutual inductance gm is approximately $2^{1/2} \times \beta \times Id$. Accordingly, the overdrive voltage is $2 \times Id/gm = (2 \times Id/\beta)^{1/2}$. Since β has dispersion unique to the device, an output according to the bias current and the device dispersion is obtained. β includes the mobility μ, and the mobility μ includes a temperature characteristic. Accordingly, by adjusting the bias current or the inclination of the reference waveform and the shift amount in response to the temperature as hereinafter described, it becomes possible to moderate the characteristic change by the temperature and perform AD conversion in an appropriate range. Since lattice scattering is dominant at the operating temperature of the solid-state imaging apparatus 1, the temperature characteristic of the mobility relies upon the absolute temperature $T^{-3/2}$.

Although, even in the case where the solid-state imaging apparatus 1 operates in accordance with the timing chart depicted in FIG. 11B, the potential of the high level of the selection pulse φSEL may be approximately VDD (2.7 V), it may otherwise be an intermediate potential (approximately 1 to 1.5 V). If the potential difference (VDS) between the drain and the source of the selection transistor SEL is applied such that saturation operation is performed, then a source follower is obtained.

Although the RTN is a component that varies with respect to time, a device in which the RTN occurs is determined (FPN component). Accordingly, also detection of the RTN is possible.

Generally, the RTN occurs in a capturing or emitting process of electrons to a defect level and generates an output of two values or multi values because the amplitude is great. Since the RTN usually includes a temporal change, detection of the RTN is performed by continuous observation or by a plural number of times of sampling. Here, the temporal change indicates that the RTN has a time constant that originates from the difference between the energy level the defect has and the Fermi level of channel electrons of the amplification transistor AMP of the pixel and that a state of two values or plural values occurs at an arbitrary timing.

Figure 11C:
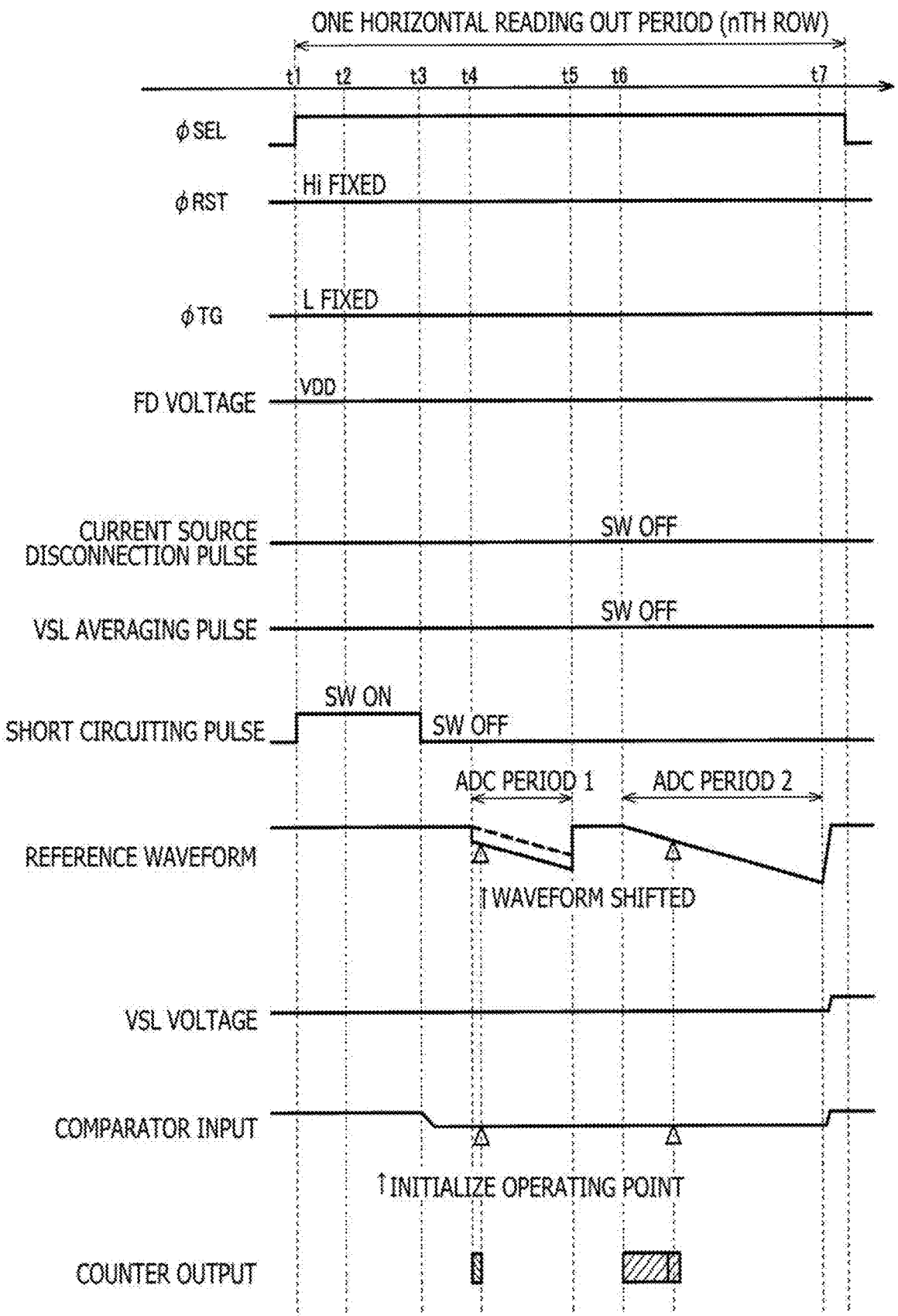
FIG. 11C is an explanatory view depicting, in a timing chart, operation when unique information relating to the first embodiment is generated.

FIG. 11C is an explanatory view depicting, in a timing chart, operation of the reference signal generation section 216, the current source 217 and the comparator 231 when unique information is generated. In the following, operation of elements provided on the output line VSL(n−1) or along the output line VSL(n−1) is described.

One horizontal reading out period is started at time t1. At this point of time, the row selection signal φSEL becomes high and row selection is started. At this point of time, since the reset transistor RST is in an ON state, the voltage of the floating diffusion section FD is fixed to VDD. Consequently, the dispersion of the floating diffusion section FD is removed. Further, when unique information is to be generated, the transfer pulse φTRG is fixed to the low level. Since the transfer pulse φTRG is fixed to the low level, the transfer transistor TRG is turned off and the dispersion of the photodiode PD can be removed.

At the point of time of time t2, the internal offset of the comparator 275a and the difference between the VSL voltage and the reference waveform are charged into the input capacitor 272a, and the operating point of the comparator 275a is initialized.

At time t3, the short-circuiting pulse becomes low, and the switches 273a and 274a are turned off. Consequently, kTC noise and feedthrough dispersion at the switches 273a and 274a are generated.

The period from time t4 to time t5 is a first AD conversion period (ADC period 1). During this period of time, the DA converter 232 changes the reference waveform linearly with a predetermined inclination. Then, the comparator 275a AD converts the reference signal using the reference waveform. Within this ADC period 1, reversal delay of the comparator 275a, delay of the reference waveform and clock delay of the counter occur. It is to be noted that what is indicated by a triangle in FIG. 11C is a reversal timing of the comparator 275a.

Then, at the point of time of time t6, the current controlling voltage generation section 219 controls the current controlling voltage such that the bias current increases.

The period from time t7 to time t8 is a second AD conversion period (ADC period 2). Also during this period, the DA converter 232 changes the reference waveform linearly with a predetermined inclination. Then, the comparator 275a AD converts the reference signal using the reference waveform. Here, the digital value after the conversion similarly includes kTC noise and feedthrough dispersion at the switches 273a and 274a having occurred at time t4 and reversal delay of the comparator 275a, delay of the reference waveform and clock delay of the counter having occurred during the ADC period 1. It is to be noted that what is indicated by a triangle in FIG. 11C is a reversal timing of the comparator 275a.

Therefore, after the ADC period 2 ends, a difference process between the count value of the counter 233 during the ADC period 1 and the count value of the counter 233 during the ADC period 2 is performed. By this difference process, a dispersion occurring in the detection section 218 can be removed. Further, data regarding whether or not the RTN occurs can be acquired by the difference process. By performing this data acquisition by a plural number of times, an occurrence frequency of the RTN for each of the amplification transistors AMP of the pixels can be evaluated. Accordingly, in the case where a voltage amplitude greater than the voltage amplitude generated by thermal noise the amplification circuit has or 1/f is detected, it is possible to have the address of the element by which the voltage amplitude can be detected as device unique information. In this case, in regard to the RTN, since the time constant changes on the basis of the energy difference as described above, namely, since the detection probability changes, it is desirable to have a table of addresses for each temperature.

Even in the case where the solid-state imaging apparatus 1 operates in accordance with the timing chart depicted in FIG. 11C, the potential of the high level of the selection pulse φSEL may be approximately VDD (2.7 V), it may otherwise be an intermediate potential (approximately 1 to 1.5 V). If the potential difference (VDS) between the drain and the source of the selection transistor SEL is applied such that saturation operation is performed, then a source follower is obtained.

As described hereinabove, also the clip circuit 215 is a source follower circuit and can obtain device unique information by operation similar to the operation depicted in FIG. 11A.

Figure 11D:
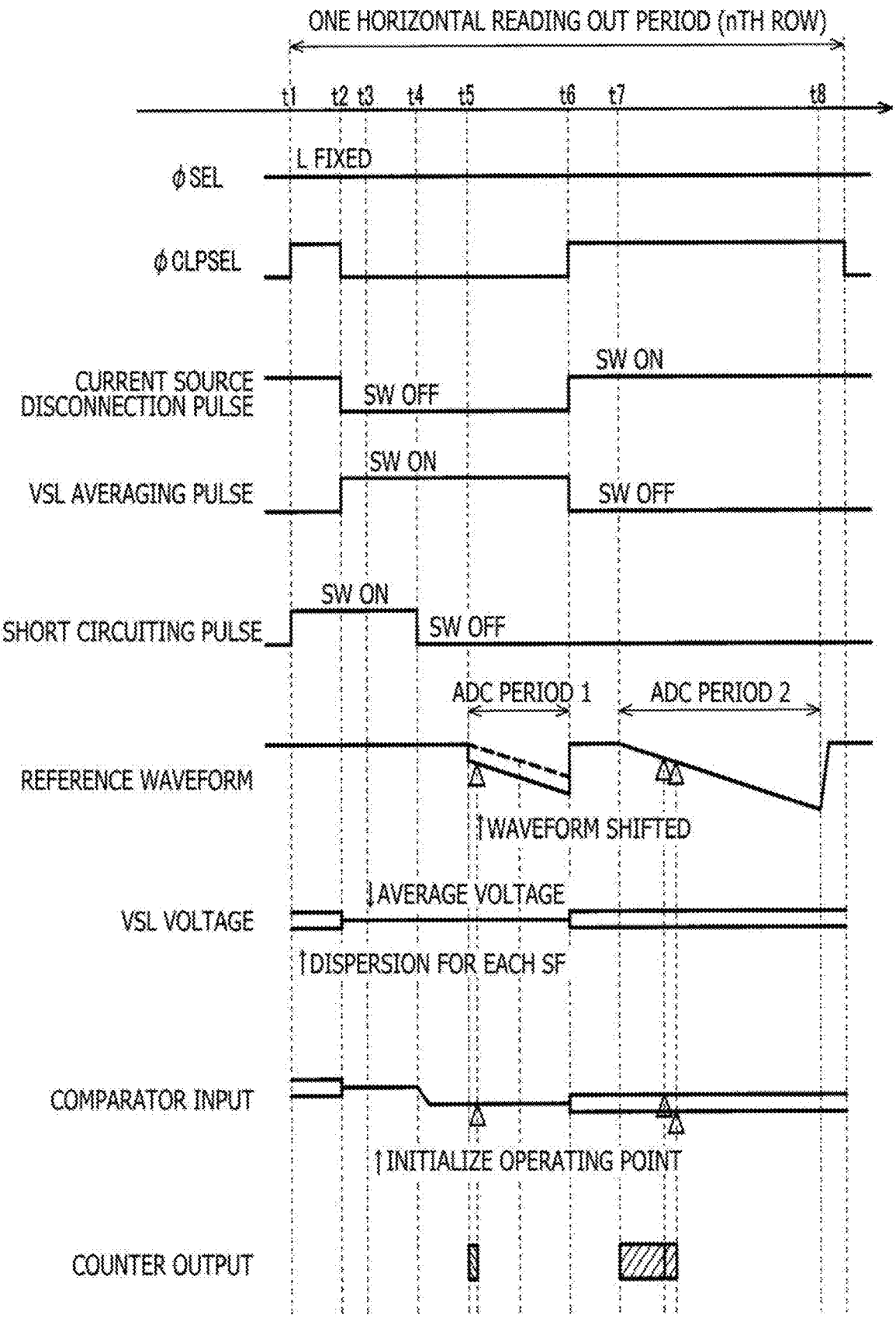
FIG. 11D is an explanatory view depicting, in a timing chart, operation when unique information relating to the first embodiment is generated.

FIG. 11D is an explanatory view depicting, in a timing chart, operation of the clip circuit 215, the reference signal generation section 216, the current source 217 and the comparator 231 when unique information is generated. In the following, operation of elements provided on the output line VSL(n−1) or along the output line VSL(n−1) is described.

In the timing chart of FIG. 11D, the pixels are not selected in all rows. In particular, the row selection signal φSEL is fixed to the low level. The state of a pulse for driving any other pixel is arbitrary. One horizontal reading out period is started at time t1. At this point of time, the clip selection pulse φCLPSEL becomes high and the clip circuit 215 is selected. Further, the short circuiting pulse becomes the high level and the switches 273a and 274a are connected. Since the switch 252a for disconnecting the current source 217 is ON and the switch 251a for averaging the VSL voltage is OFF, a source follower operation is performed, and dispersion information for each source follower of the clip circuit 215 (dispersion of the output of the transistor CLPAMP) is outputted to the output line VSL.

At the point of time of time t2, the clip selection pulse φCLPSEL and the current source disconnection pulse are made the low level simultaneously. Consequently, the VSL voltage is retained into the parasitic capacitance 253a. Since averaging of the VSL voltage is performed here, the VSL voltages of the columns are averaged. The averaged VSL voltage becomes a reference signal.

At the point of time of time t3, the internal offset of the comparator 275a and the difference between the VSL voltage and the reference waveform are charged into the input capacitor 272a, and the operating point of the comparator 275a is initialized.

At time t4, the short-circuiting pulse becomes low, and the switches 273a and 274a are turned off. Consequently, the initialization of the operating point of the comparator 275a ends. Further, since the switches 273a and 274a are turned off, kTC noise and feedthrough dispersion by the switches 273a and 274a are generated.

The period from time t5 to time t6 is a first AD conversion period (ADC period 1). During this period of time, the DA converter 232 changes the reference waveform linearly with a predetermined inclination. Then, the comparator 275a AD converts the reference signal using the reference waveform. The DA converter 232 may have a function for shifting the reference waveform. In other words, the DA converter 232 may have a function for shifting the clamp level. The DA converter 232 can provide an offset to an output of the counter 233 by shifting the reference waveform. Within this ADC period 1, reversal delay of the comparator 275a, delay of the reference waveform and clock delay of the counter occur. It is to be noted that what is indicated by a triangle in FIG. 11D is a reversal timing of the comparator 275a.

Then, at the point of time of time t6, the clip selection pulse φCLPSEL becomes high and the clip circuit 215 is selected. At this point of time, since the switch 252a for disconnecting the current source 217 is ON and the switch 251a for averaging the VSL voltage is OFF, a source follower operation is performed, and the dispersion information for each source follower of the clip circuit 215 (dispersion of the output of the transistor CLPAMP) is outputted to the output line VSL.

The period from time t7 to time t8 is a second AD conversion period (ADC period 2). Also during this period, the DA converter 232 changes the reference waveform linearly with a predetermined inclination. Then, the comparator 275a AD converts the reference signal using the reference waveform. Here, the digital value after the conversion similarly includes kTC noise and feedthrough dispersion at the switches 273a and 274a having occurred at time t4 and reversal delay of the comparator 275a, delay of the reference waveform and clock delay of the counter having occurred during the ADC period 1. It is to be noted that what is indicated by a triangle in FIG. 11D is a reversal timing of the comparator 275a.

Therefore, after the ADC period 2 ends, a difference process between the count value of the counter 233 during the ADC period 1 and the count value of the counter 233 during the ADC period 2 is performed. By this difference process, a dispersion occurring in the detection section 218 can be removed. Accordingly, it is possible to prevent a dispersion occurring in the detection section 218 from being included in the device unique information.

Further, since an offset is applied to the output of the counter 233 within the ADC period 1, even if the difference process is performed, the dispersion by the unique information generation section 214 is not lost. The dispersion by the unique information generation section 214 indicates a normal distribution centered at the reference signal. Accordingly, if the offset is not applied, then a negative value appears with the dispersion by the unique information generation section 214, and the values equal to or lower than 0 all become 0.

It is to be noted that, in the case where operation according to the timing chart depicted in FIG. 11D is to be performed, if not the transistor CLPAMP but the transistor CLPSEL is saturated, then a source follower circuit is formed. Although the potential of the high level of the pulse for selecting the transistor CLPSEL may be approximately VDD (2.7 V), it may otherwise be an intermediate potential (approximately 1 to 1.5 V). If the potential difference (VDS) between the drain and the source of the transistor CLPSEL is applied such that saturation operation is to be performed, then a source follower is formed. For example, where the drain voltage of the transistor CLPSEL is 2.7 V, the voltage of the drain side of the transistor CLPSEL (source side of the transistor CLPAMP) normally is approximately 2.2 V. In contrast, if the VDS of the transistor CLPSEL is sufficient (if there is a difference of at least approximately several hundreds to 700 mV), then saturation operation can be achieved. Consequently, an output according to the gate voltage of the transistor CLPSEL is transmitted to the output line VSL. If also the transistor CLPSEL is caused to perform saturation operation similarly to the transistor CLPAMP, then since the threshold value and the overdrive voltage disperse for each device, a dispersion of the threshold value and the overdrive voltage of the transistor CLPSEL can be detected.

The current controlling voltage generation section 219 can change the overdrive voltage of the transistor CLPAMP by driving the current controlling voltage that is different between the ADC period 1 and the ADC period 2. Since the changing amount of the overdrive voltage at this time disperses, the changing amount of the overdrive voltage can be detected as device unique information.

Figure 11E:
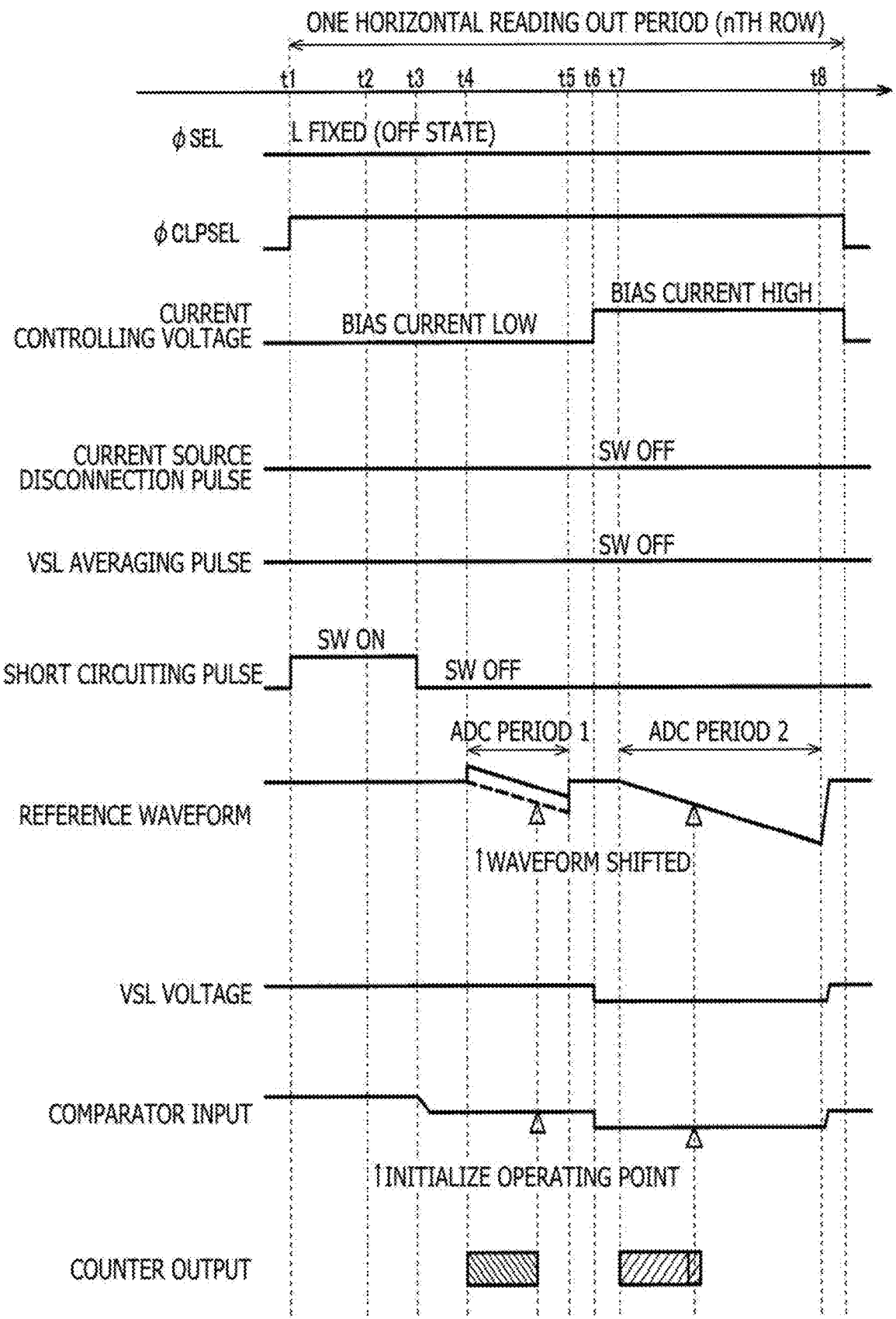
FIG. 11E is an explanatory view depicting, in a timing chart, operation when unique information relating to the first embodiment is generated.

FIG. 11E is an explanatory view depicting, in a timing chart, operation of the clip circuit 215, the reference signal generation section 216, the current source 217 and the comparator 231 when unique information is generated. In the following, operation of elements provided on the output line VSL(n−1) or along the output line VSL(n−1) is described. The timing chart of FIG. 11E is different from the timing chart of FIG. 11D in that the current source disconnection pulse and the VSL averaging pulse normally have the low level.

In the timing chart of FIG. 11E, the pixels are not selected in all rows. In particular, the row selection signal φSEL is fixed to the low level. The state of a pulse for driving any other pixel is arbitrary. One horizontal reading out period is started at time t1. At this point of time, the clip selection pulse φCLPSEL becomes high and the clip circuit 215 is selected. Further, the short circuiting pulse becomes the high level and the switches 273a and 274a are connected.

At the point of time of time t2, the internal offset of the comparator 275a and the difference between the VSL voltage and the reference waveform are charged into the input capacitor 272a, and the operating point of the comparator 275a is initialized.

At time t3, the short-circuiting pulse becomes low, and the switches 273a and 274a are turned off. Consequently, the initialization of the operating point of the comparator 275a ends. Further, since the switches 273a and 274a are turned off, kTC noise and feedthrough dispersion by the switches 273a and 274a are generated.

The period from time t4 to time t5 is a first AD conversion period (ADC period 1). During this period of time, the DA converter 232 changes the reference waveform linearly with a predetermined inclination. Then, the comparator 275a AD converts the reference signal using the reference waveform. Within this ADC period 1, reversal delay of the comparator 275a, delay of the reference waveform and clock delay of the counter occur. It is to be noted that what is indicated by a triangle in FIG. 11E is a reversal timing of the comparator 275a.

Then, at the point of time of time t6, the current controlling voltage generation section 219 controls the current controlling voltage such that the bias current increases.

The period from time t7 to time t8 is a second AD conversion period (ADC period 2). Also during this period, the DA converter 232 changes the reference waveform linearly with a predetermined inclination. Then, the comparator 275a AD converts the reference signal using the reference waveform. Here, the digital value after the conversion similarly includes kTC noise and feedthrough dispersion at the switches 273a and 274a having occurred at time t4 and reversal delay of the comparator 275a, delay of the reference waveform and clock delay of the counter having occurred during the ADC period 1. It is to be noted that what is indicated by a triangle in FIG. 11E is a reversal timing of the comparator 275a.

Therefore, after the ADC period 2 ends, a difference process between the count value of the counter 233 during the ADC period 1 and the count value of the counter 233 during the ADC period 2 is performed. By this difference process, a dispersion occurring in the detection section 218 can be removed. Since only the bias current value is different between the ADC period 1 and the ADC period 2, the threshold value information is cancelled and extraction of a component of the overdrive voltage becomes possible. Here, the gain coefficient β of the transistor is $(W/L) \times p \times \mu C_{ox}$. W is the gate width; L the gate length; μ the mobility of electrons; and $C_{ox}$ the oxide film capacitance per unit area. Further, the mutual inductance gm is approximately $2^{1/2} \times \beta \times Id$. Accordingly, the overdrive voltage is $2 \times Id/gm = (2 \times Id/\beta)^{1/2}$. Since β has a dispersion unique to the device, an output according to the bias current and the device dispersion is obtained. β includes the mobility μ, and the mobility μ includes a temperature characteristic. Accordingly, by adjusting the bias current or the inclination of the reference waveform and the shift amount in response to the temperature as hereinafter described, it becomes possible to moderate the characteristic change by the temperature and perform AD conversion in an appropriate range. Since lattice scattering is dominant at the operating temperature of the solid-state imaging apparatus 1, the temperature characteristic of the mobility relies upon the absolute temperature $T^{-3/2}$.

If, in the case where operation is performed in accordance with the timing chart depicted in FIG. 11E, not the transistor CLPAMP but the transistor CLPSEL is saturated, then a source follower circuit is formed. Although the potential of the high level of the pulse for selecting the transistor CLPSEL may be approximately VDD (2.7 V), it may otherwise be an intermediate potential (approximately 1 to 1.5 V).

Also such detection of the RTN as described above is possible with the transistor CLPAMP. When the RTN is to be detected by the transistor CLPAMP, the clip voltage is set to an intermediate potential (for example, approximately 1.5 V to the power supply VDD).

Figure 11F:
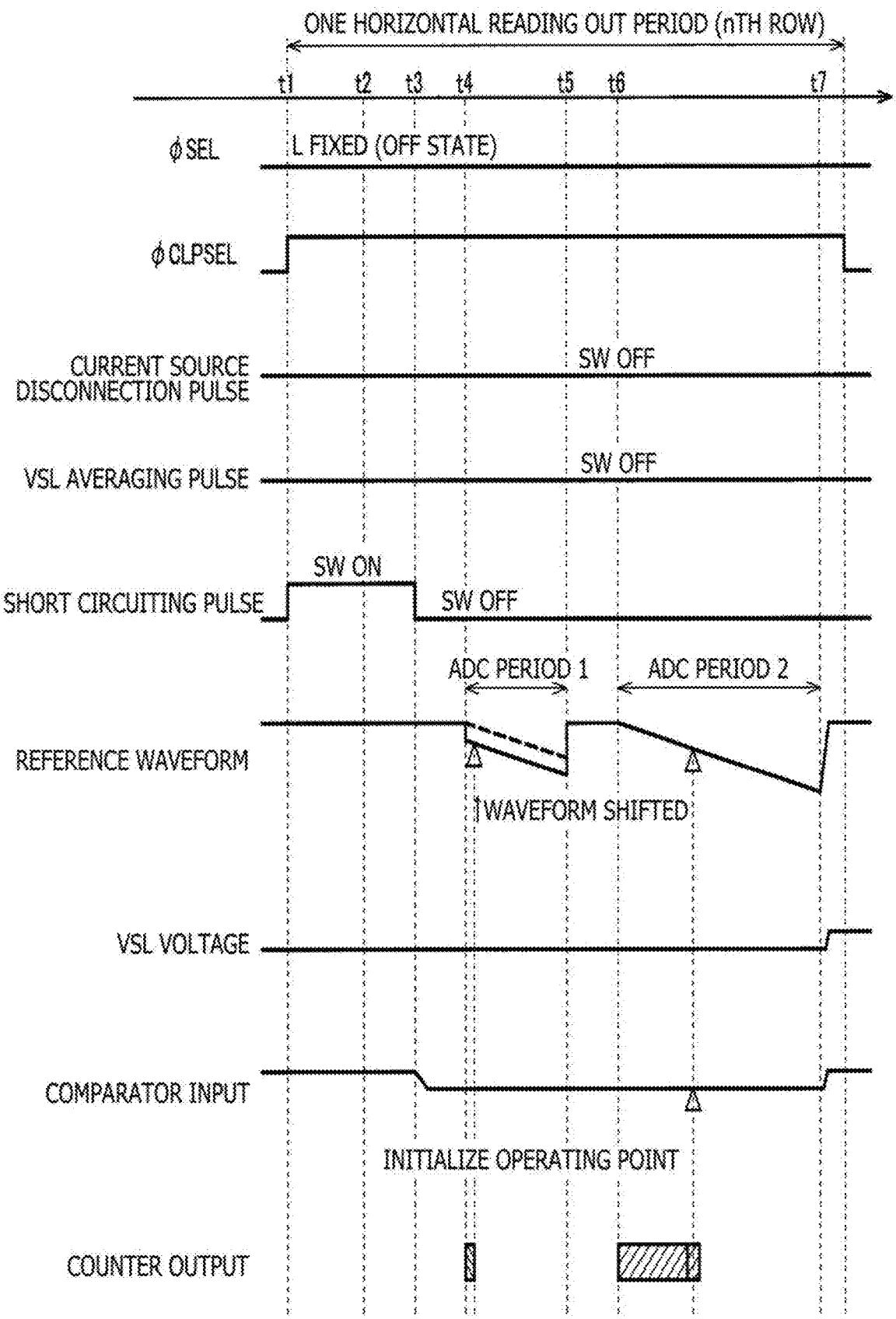
FIG. 11F is an explanatory view depicting, in a timing chart, operation when unique information relating to the first embodiment is generated.

FIG. 11F is an explanatory view depicting, in a timing chart, operation of the clip circuit 215, the reference signal generation section 216, the current source 217 and the comparator 231 when unique information is generated. In the following, operation of elements provided on the output line VSL(n−1) or along the output line VSL(n−1) is described.

In the timing chart of FIG. 11F, the pixels are not selected in all rows. In particular, the row selection signal φSEL is fixed to the low level. The state of a pulse for driving any other pixel is arbitrary. One horizontal reading out period is started at time t1. At this point of time, the clip selection pulse φCLPSEL becomes high and the clip circuit 215 is selected. Further, the short circuiting pulse becomes high and the switches 273a and 274a are connected.

At the point of time of time t2, the internal offset of the comparator 275a and the difference between the VSL voltage and the reference waveform are charged into the input capacitor 272a, and the operating point of the comparator 275a is initialized.

At time t3, the short-circuiting pulse becomes low, and the switches 273a and 274a are turned off. Consequently, the initialization of the operating point of the comparator 275a ends. Further, since the switches 273a and 274a are turned off, kTC noise and feedthrough dispersion by the switches 273a and 274a are generated.

The period from time t4 to time t5 is a first AD conversion period (ADC period 1). During this period of time, the DA converter 232 changes the reference waveform linearly with a predetermined inclination. Then, the comparator 275a AD converts the reference signal using the reference waveform. Within this ADC period 1, reversal delay of the comparator 275a, delay of the reference waveform and clock delay of the counter occur. It is to be noted that what is indicated by a triangle in FIG. 11F is a reversal timing of the comparator 275a.

The period from time t6 to time t7 is a second AD conversion period (ADC period 2). Also during this period, the DA converter 232 changes the reference waveform linearly with a predetermined inclination. Then, the comparator 275a AD converts the reference signal using the reference waveform. Here, the digital value after the conversion similarly includes kTC noise and feedthrough dispersion at the switches 273a and 274a having occurred at time t4 and reversal delay of the comparator 275a, delay of the reference waveform and clock delay of the counter having occurred during the ADC period 1. It is to be noted that what is indicated by a triangle in FIG. 11F is a reversal timing of the comparator 275a.

Therefore, after the ADC period 2 ends, a difference process between the count value of the counter 233 during the ADC period 1 and the count value of the counter 233 during the ADC period 2 is performed. By this difference process, a dispersion occurring in the detection section 218 can be removed. Further, data regarding whether or not the RTN occurs can be acquired by the difference process. By performing this data acquisition by a plural number of times, an occurrence frequency of the RTN for each of the transistors CLPAMP can be evaluated. Accordingly, in the case where the voltage amplitude greater than a voltage amplitude generated by thermal noise the amplification circuit has or 1/f is detected, it is possible to have the address of the element by which the voltage amplitude can be detected as device unique information. In this case, in regard to the RTN, since the time constant changes on the basis of the energy difference as described above, that is, since the detection probability changes, it is desirable to have a table of addresses for each temperature.

If, in the case where operation is performed in accordance with the timing chart depicted in FIG. 11F, not the transistor CLPAMP but the transistor CLPSEL is saturated, then a source follower circuit is formed. Although the potential of the high level of the pulse for selecting the transistor CLPSEL may be approximately VDD (2.7 V), it may otherwise be an intermediate potential (approximately 1 to 1.5 V).

The solid-state imaging apparatus 1 can use a feedthrough dispersion of the comparator 275a as device unique information.

Figure 11G:
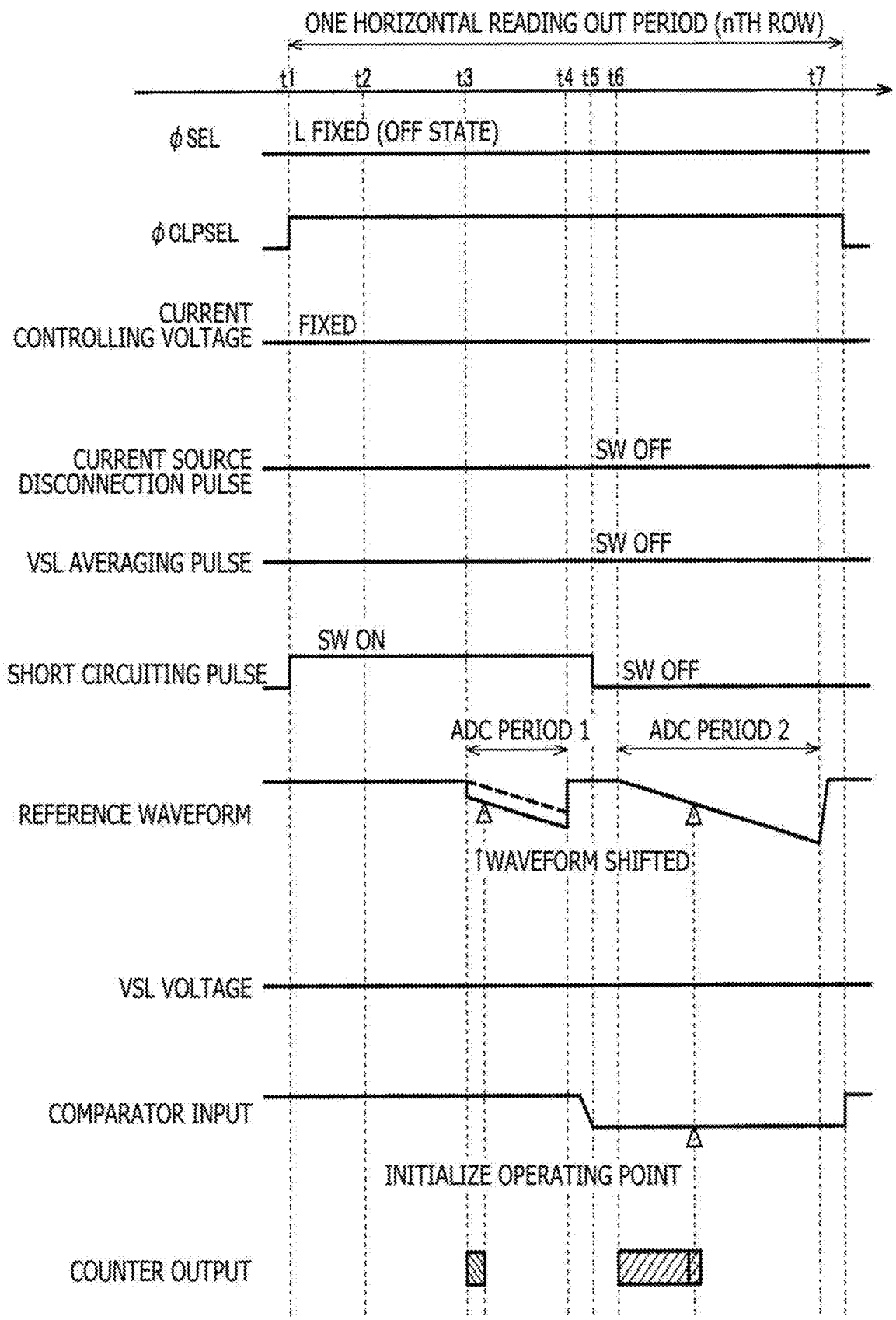
FIG. 11G is an explanatory view depicting, in a timing chart, operation when unique information relating to the first embodiment is generated.

FIG. 11G is an explanatory view depicting, in a timing chart, operation of the clip circuit 215, the reference signal generation section 216, the current source 217 and the comparator 231 when unique information is generated. In the following, operation of elements provided on the output line VSL(n−1) or along the output line VSL(n−1) is described.

In the timing chart of FIG. 11G, the pixels are not selected in all rows. In particular, the row selection signal φSEL is fixed to the low level. The state of a pulse for driving any other pixel is arbitrary. One horizontal reading out period is started at time t1. At this point of time, the clip selection pulse φCLPSEL becomes high and the clip circuit 215 is selected. Further, the short circuiting pulse becomes the high level and the switches 273a and 274a are connected.

At the point of time of time t2, the internal offset of the comparator 275a and the difference between the VSL voltage and the reference waveform are charged into the input capacitor 272a, and the operating point of the comparator 275a is initialized.

The period from time t3 to time t4 is a first AD conversion period (ADC period 1). During this period of time, the DA converter 232 changes the reference waveform linearly with a predetermined inclination. Then, the comparator 275a AD converts the reference signal using the reference waveform. Within this ADC period 1, reversal delay of the comparator 275a, delay of the reference waveform and clock delay of the counter occur. It is to be noted that what is indicated by a triangle in FIG. 11G is a reversal timing of the comparator 275a.

At time t5, the short-circuiting pulse becomes low and the switches 273a and 274a are turned off. Consequently, the initialization of the operating point of the comparator 275a ends. Further, since the switches 273a and 274a are turned off, kTC noise and feedthrough dispersion by the switches 273a and 274a are generated.

The period from time t6 to time t7 is a second AD conversion period (ADC period 2). Also during this period, the DA converter 232 changes the reference waveform linearly with a predetermined inclination. Then, the comparator 275a AD converts the reference signal using the reference waveform. Here, the digital value after the conversion similarly includes kTC noise and feedthrough dispersion at the switches 273a and 274a having occurred at time t4 and reversal delay of the comparator 275a, delay of the reference waveform and clock delay of the counter having occurred during the ADC period 1. It is to be noted that what is indicated by a triangle in FIG. 11G is a reversal timing of the comparator 275a.

Therefore, after the ADC period 2 ends, a difference process between the count value of the counter 233 during the ADC period 1 and the count value of the counter 233 during the ADC period 2 is performed. By this difference process, kTC noise and feedthrough dispersion at the switches 273a and 274a are detected.

By performing detection of kTC noise and a feedthrough dispersion at the switches 273a and 274a by a plural number of times and averaging, the kTC noise can be suppressed and feedthrough dispersion (FPN component) can be extracted.

The solid-state imaging apparatus 1 can use also a feedthrough dispersion of the column ADC as device unique information.

Figure 11H:
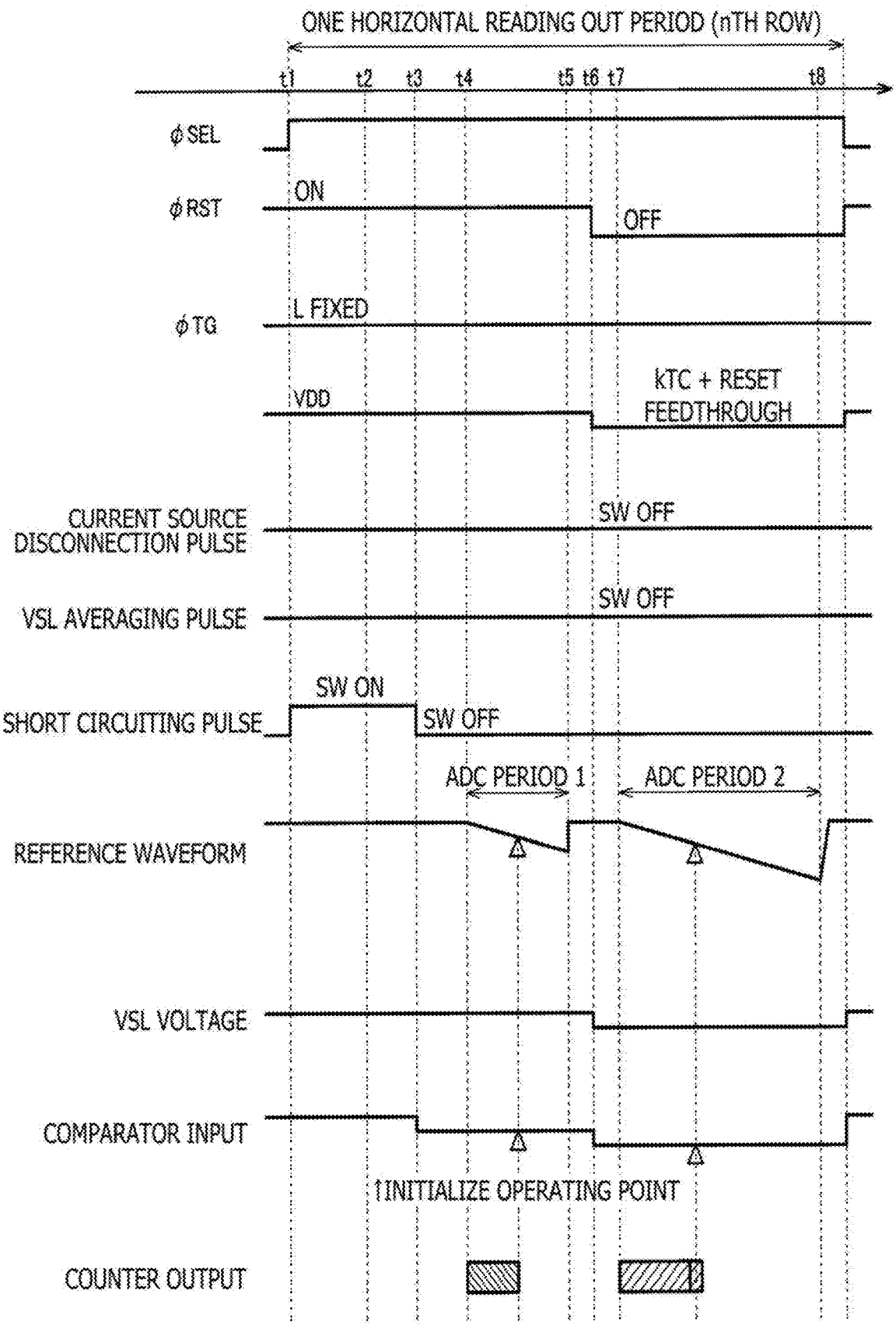
FIG. 11H is an explanatory view depicting, in a timing chart, operation when unique information relating to the first embodiment is generated.

FIG. 11H is an explanatory view depicting, in a timing chart, operation of the clip circuit 215, the reference signal generation section 216, the current source 217 and the comparator 231 when unique information is generated. In the following, operation of elements provided on the output line VSL(n−1) or along the output line VSL(n−1) is described.

One horizontal reading out period is started at time t1. At this point of time, the row selection signal φSEL becomes high and row selection is started. At this point of time, since the reset transistor RST is in an ON state, the voltage of the floating diffusion section FD is fixed to VDD. Consequently, the dispersion of the floating diffusion section FD is removed. Further, when unique information is generated, the transfer pulse φTRG is fixed to the low level. Since the transfer pulse φTRG is fixed to the low level, the transfer transistor TRG is turned off and the dispersion of the photodiode PD can be removed. Further, the short-circuiting pulse becomes high and the switches 273a and 274a are connected to each other.

At the point of time of t2, the internal offset of the comparator 275a and the difference between the VSL voltage and the reference waveform are charged into the input capacitor 272a, and the operating point of the comparator 275a is initialized.

At time t3, the short-circuiting pulse becomes low, and the switches 273a and 274a are turned off. Consequently, kTC noise and feedthrough dispersion at the switches 273a and 274a are generated.

The period from time t4 to time t5 is a first AD conversion period (ADC period 1). During this period of time, the DA converter 232 changes the reference waveform linearly within a predetermined inclination. Then, the comparator 275a AD converts the reference signal using the reference waveform. Within this ADC period 1, reversal delay of the comparator 275a, delay of the reference waveform and clock delay of the counter occur. It is to be noted that what is indicated by a triangle in FIG. 11H is a reversal timing of the comparator 275a.

At the point of time of time t6, since the reset transistor RST is in an ON state, kTC noise (temporal component) and reset feedthrough noise (FPN component) are retained in the voltage of the floating diffusion section FD.

The period from time t7 to time t8 is a second AD conversion period (ADC period 2). Also during this period, the DA converter 232 changes the reference waveform linearly with a predetermined inclination. Then, the comparator 275a AD converts the reference signal using the reference waveform. Here, the digital value after the conversion similarly includes kTC noise and feedthrough dispersion at the switches 273a and 274a having occurred at time t4 and reversal delay of the comparator 275a, delay of the reference waveform and clock delay of the counter having occurred during the ADC period 1. It is to be noted that what is indicated by a triangle in FIG. 11H is a reversal timing of the comparator 275a.

Therefore, after the ADC period 2 ends, a difference process between the count value of the counter 233 during the ADC period 1 and the count value of the counter 233 during the ADC period 2 is performed. By this difference process, a dispersion occurring in the detection section 218 is removed and the kTC noise and reset feedthrough noise retained in the floating diffusion section FD are detected. By performing detection of this kTC noise and feedthrough dispersion by a plural number of times and averaging, the kTC noise can be suppressed and a feedthrough dispersion (FPN component) can be extracted.

Also a defect of the photodiode PD can be used as the device unique information. The defect of the photodiode PD can be read out by ordinary driving. When a defect of the photodiode PD is read out by ordinary driving, also defect information of the optical signal and the floating diffusion section FD is read out simultaneously. The FPN components other than them and the kTC noise when the floating diffusion section FD is reset are removed by a CDS process. The defect information of the floating diffusion section FD is excepted because driving is performed such that the detection period becomes as short as possible and besides the defect is corrected. If an optical signal is present, then since the defect information of the photodiode PD is not extracted easily, in the case where a defect of the photodiode PD is used as the device unique information, a signal of the photodiode PD is preferably accumulated in a shielded state. In the case where a defect of the photodiode PD is used as the device unique information, a photodiode PD of a shielded pixel (optical black pixel) may be used.

Since a dark signal by a defect of the photodiode PD has a time dependency, preferably the shutter time is set as long as possible to accumulate a signal. Further, the photodiode PD generally has a HAD structure (Hole Accumulated Diode structure) and is formed and driven in such a manner as to be surrounded by Holes. In driving, a negative bias is applied such that the channel of the transfer transistor becomes an accumulation state (pinning state). This makes it possible to suppress the dark signal arising from a defect in the proximity of the transfer transistor low.

In the case where the signal is very low or the number of defects is very small, it is sufficient if, upon signal accumulation, the potential of the transfer transistor when it is off is set to an intermediate potential in the positive direction to perform changing from a pinning state to a depleted state. The dark output arising from a defect in the proximity of the transfer transistor occurs. This makes it possible to detect defect information in the proximity of the photodiode PD and the transfer transistor and, for example, to handle, for example, a pixel address of a level equal to or higher than a desired threshold value level, which is handled as a defect, as device unique information.

Since such defect information has a temperature characteristic (activation energy is approximately 0.55 to 1.1 eV), in order to stabilize the output, it is desirable to set the accumulation time period and the analog gain appropriately on the basis of the temperature information and have and use a temperature correction table for each defect to perform correction.

The unique value calculation section 220 calculates a value unique to the solid-state imaging apparatus 1 (unique value) on the basis of a digital signal sent from the detection section 218. The unique value calculation section 220 generates a value having a predetermined bit length as the unique value. An example of a calculation method of a unique value of the solid-state imaging apparatus 1 by the unique value calculation section 220 is hereinafter described in detail. After the unique value calculation section 220 calculates a unique value of the solid-state imaging apparatus 1, it sends the unique value to the encryption section 222. The unique value generated by the unique value calculation section 220 can become a seed that is used in an encryption process by the encryption section 222 or a key itself.

The unique value calculation section 220 may select which one of a plurality of kinds of device unique information is to be adopted. When the unique value calculation section 220 selects device unique information, it may select which one of kinds of device unique information is to be adopted by an arithmetic operation on the basis of the device unique information or may select which one of kinds of device unique information is to be adopted depending upon a random number. As an alternative, a selection condition when device unique information is to be selected may be stored in a nonvolatile memory. Writing of the selection condition into the nonvolatile memory may be performed only once. The timing of writing into the nonvolatile memory may possibly be time, for example, upon inspection, upon shipment, upon first use or the like. The unique value calculation section 220 can repetitively calculate a unique value using device unique information based on any production dispersion that may occur in a chip of the solid-state imaging apparatus 1 including device unique information whose information amount is comparatively small. In other words, the information amount of the device unique information can be increased.

Further, the unique value calculation section 220 may calculate a unique value by combining a plurality of kinds of device unique information from within device unique information generated by the unique information generation section 214. By calculating a unique value by combining a plurality of kinds of device unique information, it becomes less likely to be analyzed in what manner the unique value is calculated.

Further, a unique value generated by the unique value calculation section 220 may be temporarily stored in a memory. By storing the unique value generated by the unique value calculation section 220 into the memory, the calculation timing of the unique value is less likely to be analyzed. In particular, the solid-state imaging apparatus 1 may not generate a unique value at a timing of a request for encryption but may use a unique value generated in advance in response to a request for encryption. For example, the solid-state imaging apparatus 1 may calculate a unique value, for example, after a predetermined period of time elapses after driving upon ordinary imaging is performed. As an alternative, the solid-state imaging apparatus 1 may generate a unique value not at a timing of a request for encryption but at a timing at which a request for generation of a unique value is received.

Further, the unique value calculation section 220 may average unique values obtained in accordance with the same driving condition. By averaging unique values obtained in accordance with the same driving condition, noise in the time direction can be suppressed.

The encryption section 222 executes an encryption process of data using a unique value generated by the unique value calculation section 220. The encryption section 222 may possibly be provided, for example, in the logic circuit 23014 depicted in FIG. 2. In particular, the encryption section 222 uses the unique value generated by the unique value calculation section 220 as a seed or a key itself to perform an encryption process of data. What becomes a target of encryption may be the unique value itself, image information, a feature amount based on the image information or the like. By performing the encryption process using the unique value generated by the unique value calculation section 220, the solid-state imaging apparatus 1 can encrypt the data very securely.

The communication controlling section 224 transmits data to the outside of the solid-state imaging apparatus 1. The communication controlling section 224 may perform different processes depending upon whether captured image data is outputted or data encrypted by the encryption section 222 is outputted.

From within the configuration of the solid-state imaging apparatus 1 depicted in FIG. 9, at least the path for processing unique information is formed such that it does not appear on the surface of the solid-state imaging apparatus 1. For example, the path for processing unique information is disposed such that it is covered with a metal film of an upper layer including the outermost layer. The path for processing unique information may be covered with a predetermined shield layer or may be covered with a wiring line for VDD or VSS. The path for processing the unique information may possibly include, for example, the unique information generation section 214, the detection section 218, the unique value calculation section 220 and the encryption section 222. Further, the solid-state imaging apparatus 1 is formed such that a pad for monitoring unique information is not provided on the path for processing unique information. By forming the solid-state imaging apparatus 1 in this manner, not only leak of unique information of the solid-state imaging apparatus 1, which is used for an encryption process, to the outside can be prevented, but if it is tried to analyze the unique information, then destruction of the solid-state imaging apparatus 1 cannot be avoided, and as a result, analysis of the unique information is impossible. Further, the solid-state imaging apparatus 1 according to the present embodiment generates unique information every time without retaining the unique information in the inside thereof and performs an encryption process using a unique value based on the generated unique information. Accordingly, the solid-state imaging apparatus 1 according to the present embodiment can carry out a very secure encryption process.

Since the solid-state imaging apparatus 1 according to the present embodiment does not retain unique information in the inside thereof, if the unique value generated on the basis of the unique information changes at each generation, then decoding of encrypted data is disabled. Accordingly, it is demanded that the unique value indicates the same value at any time. Accordingly, the solid-state imaging apparatus 1 according to the present embodiment may include a function for correcting a unique value calculated by the unique value calculation section 220 on the basis of a signal outputted from the unique information generation section 214 in response to the temperature of the chip in which the unique information generation section 214 is provided. Further, the solid-state imaging apparatus 1 according to the present embodiment may include a function for detecting the temperature of the chip in which the unique information generation section 214 is provided.

Figure 12:
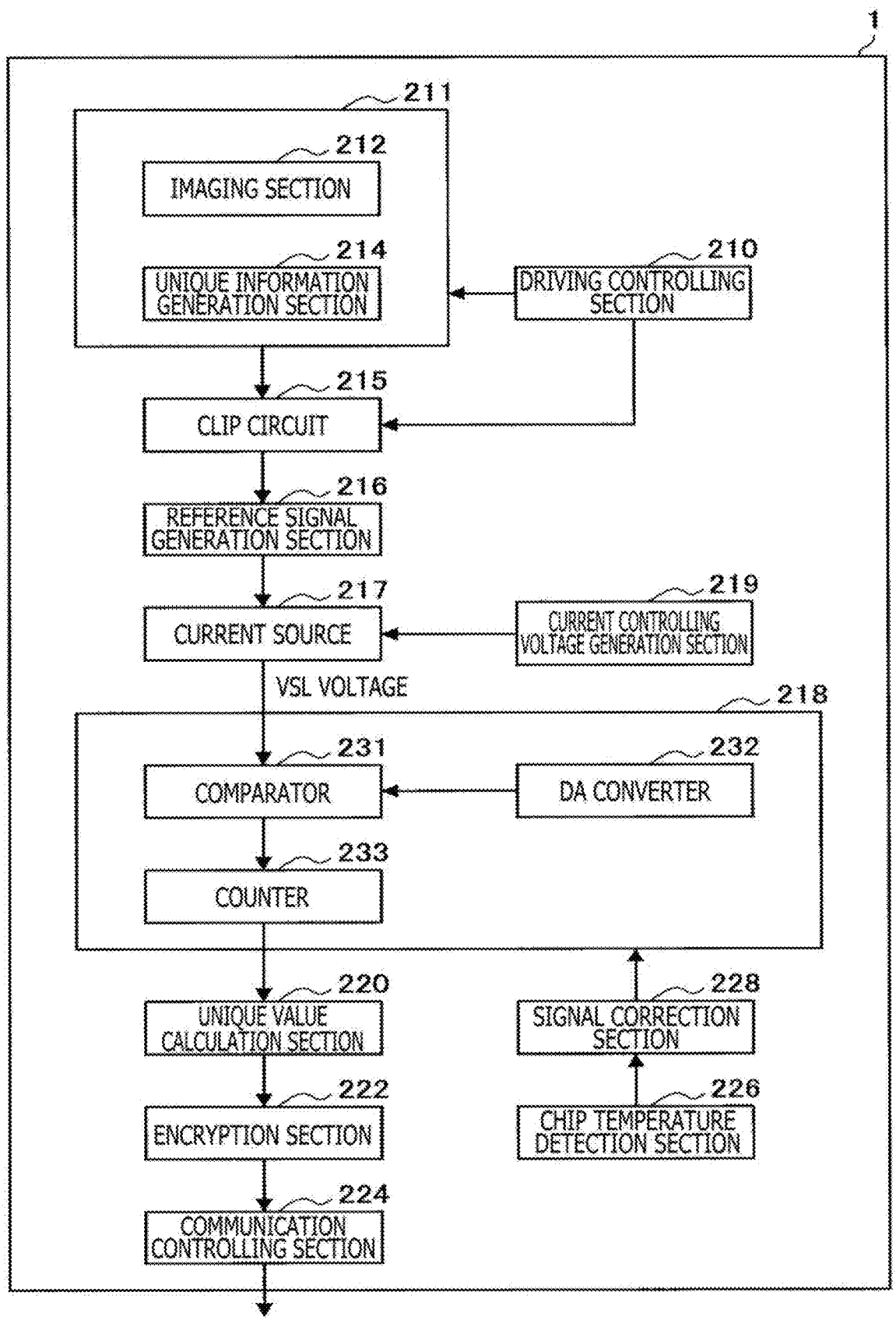
FIG. 12 is an explanatory view depicting a functional configuration example of the solid-state imaging device according to the first embodiment.

FIG. 12 is an explanatory view depicting a different functional configuration example of the solid-state imaging apparatus 1 according to the present embodiment. FIG. 12 depicts a configuration including a chip temperature detection section 226 and a signal correction section 228 in addition to the configuration of the solid-state imaging apparatus 1 depicted in FIG. 9.

The chip temperature detection section 226 detects the temperature of the chip in which the unique information generation section 214 is provided. The chip temperature detection section 226 sends information of the detected temperature of the chip to the signal correction section 228. The signal correction section 228 corrects the unique value calculated by the unique value calculation section 220 on the basis of the temperature, detected by the chip temperature detection section 226, of the chip in which the unique information generation section 214 is provided. The signal correction section 228 may retain a table in which correction values according to temperatures are stored and determine a correction value on the basis of the temperature detected by the chip temperature detection section 226.

3.2. Operation Example

Figure 13:
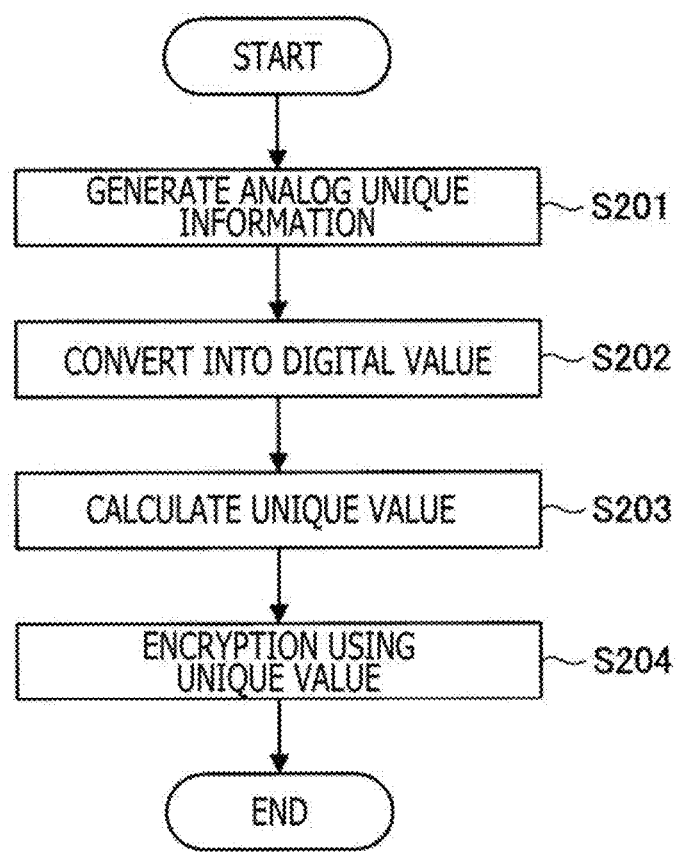
FIG. 13 is a flow chart depicting an operation example of the solid-state imaging device according to the first embodiment.

An operation example of the solid-state imaging apparatus according to the present embodiment is described. FIG. 13 is a flow chart depicting an operation example of the solid-state imaging apparatus according to the present embodiment. What is depicted in FIG. 13 is an operation example when the solid-state imaging apparatus 1 calculates a unique value and performs an encryption process using the unique value.

The solid-state imaging apparatus 1 first generates analog unique information on which a unique value is to be based (step S201). The analog unique information is generated by the unique information generation section 214 driven by the driving controlling section 210.

After the analog unique information is generated, the solid-state imaging apparatus 1 subsequently converts the analog unique information into a digital value (step S202). The conversion of the analog unique information into a digital value is performed by the detection section 218. The conversion process of the analog unique information into a digital value by the detection section 218 is such as described hereinabove.

After the analog unique information is converted into a digital value, the solid-state imaging apparatus 1 subsequently calculates a unique value of the solid-state imaging apparatus 1 using the digital value after the conversion (step S203). The calculation of a unique value of the solid-state imaging apparatus 1 is performed by the unique value calculation section 220.

After the calculation of a unique value of the solid-state imaging apparatus 1 is performed, the solid-state imaging apparatus 1 subsequently performs an encryption process of data using the unique value (step S204). The encryption process of data using the unique value is performed by the encryption section 222.

The solid-state imaging apparatus 1 according to present embodiment can complete, by executing the series of operations described above, an encryption process using unique information in the inside thereof without outputting the unique information to the outside. The solid-state imaging apparatus 1 according to the present embodiment can encrypt and output important information very safely by performing an encryption process using unique information that does not leak to the outside.

4. Second Embodiment

Subsequently, as a second embodiment of the present disclosure, an example of a technology that utilizes a physical feature (namely, a hardware feature) of the solid-state imaging apparatus 1 described hereinabove and generates a unique value (namely, a PUF value) that is unique to the solid-state imaging apparatus 1 and is difficult to duplicate.

4.1. Basic Idea>

First, a characteristic required for the PUF is described, and thereafter, an outline of a basic idea of the technology for generation of a PUF value according to the present embodiment is described.

As described hereinabove, the PUF is a function for outputting a value unique to a device utilizing a physical feature difficult to duplicate. In the case where it is supposed to utilize a value unique to a device generated utilizing such PUF as just described (namely, a PUF value), for example, as an identifier for identifying an individual device or as key information for an encryption process or the like, reproducibility and individual differences are demanded as characteristics of the PUF value.

Here, the reproducibility indicates a characteristic that, even if various states such as the temperature or the voltage change or conditions regarding time-dependent degradation and so forth of a device itself change upon generation or re-calculation of a PUF value, a same output is obtained every time with respect to a predetermined input. In particular, ideally it is desirable that, even if such a change of a condition as described above occurs, the same output can be reproduced perfectly every time with respect to a predetermined input. On the other hand, upon generation and re-calculation of a PUF value, also it is possible to apply such a technology as error-correcting codes. In this case, if the dispersion of an output obtained every time remains within a range correctable with error-correcting codes or the like, the reproducibility of the output may not necessarily be perfect.

Meanwhile, as regards the individual differences, it is preferable that PUF values generated for a plurality of devices have sufficient differences to such a degree that the individual devices can be distinguished from each other with the PUF values. In the present embodiment, as regards the individual differences, it is desirable that entropy of, for example, 128 bits can be secured.

From such presumptions as described above, in the present embodiment, targeting the amplification transistor Tr13 among the transistors configuring each pixel 2 of the solid-state imaging apparatus 1, the dispersion of the threshold voltage Vth of the amplification transistor Tr13 is utilized for generation of a PUF value. More particularly, for the threshold voltage of a transistor, many factors exist which provide a dispersion for each device in a production procedure like the film thickness of the gate oxide film, the size of the transistor or the ion implantation. Therefore, it is possible to satisfy the required characteristic of the individual differences described above. Further, since the amplification transistor Tr13 is positioned at a comparatively later stage among the transistors configuring the pixel 2, it is inclined to be influenced less likely by composite factors. From such a characteristic as just described, it is possible to satisfy also the required characteristic for the reproducibility described above. Further, as regards the dispersion of the threshold voltage Vth, it is possible to acquire the dispersion as an output result of a pixel signal from the pixel 2 (in other words, a pixel value), for example, in a process for performing compensation for the threshold voltage Vth.

Further, in the present embodiment, it is sufficient if a PUF value is generated utilizing a characteristic of a pixel 2 that operates more stably among the pixels 2 of the solid-state imaging apparatus 1. As a particular example, a characteristic of a pixel 2 included in at least part of a so-called OPB (Optical Black) region from within the pixel region 3 (in other words, an imaging plane) may be utilized for generation of a PUF value.

Figure 14:
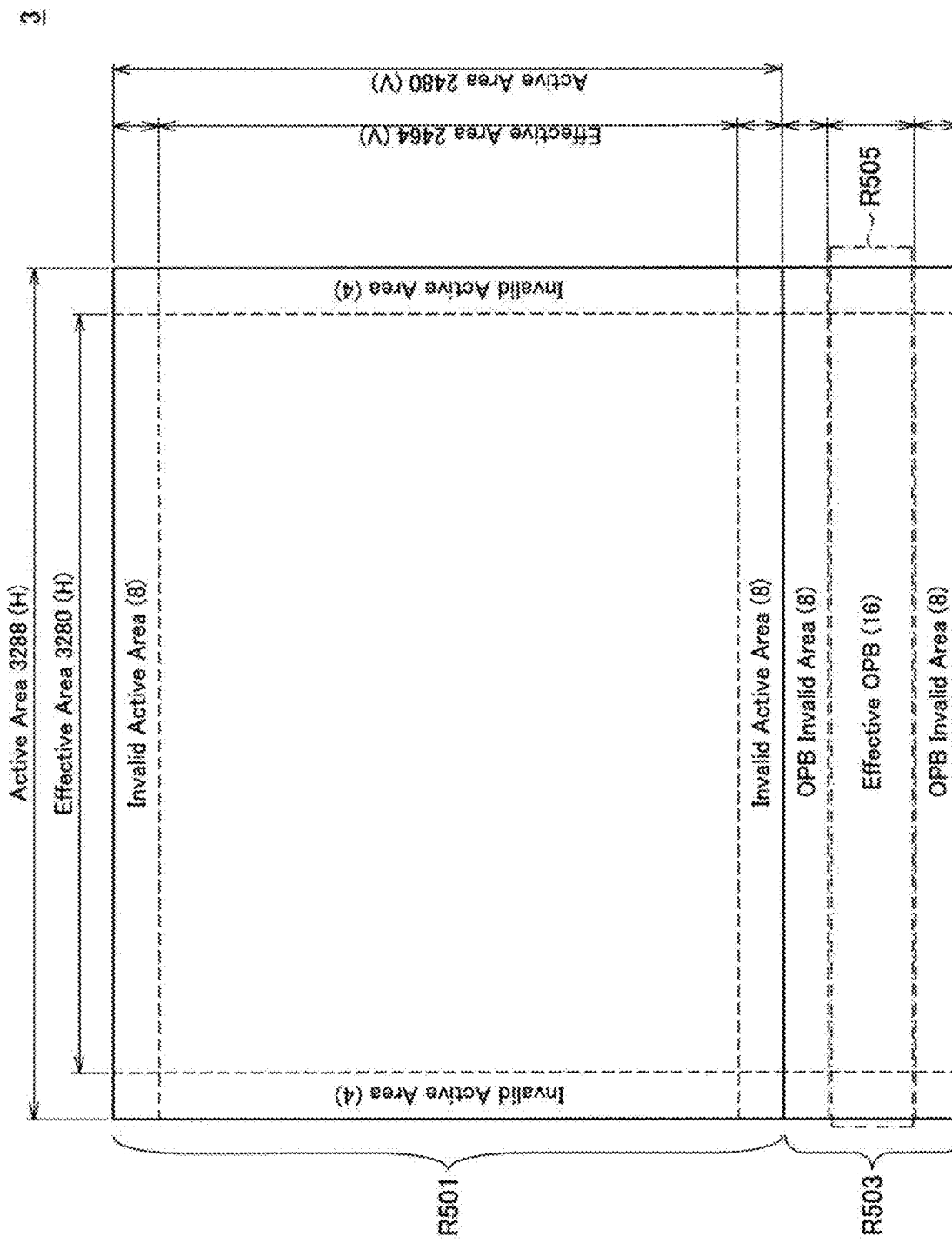
FIG. 14 is an explanatory view illustrating an example of a technology relating to generation of a PUF value according to a second embodiment of the present disclosure.

For example, FIG. 14 is an explanatory view illustrating an example of the technology for generation of a PUF value according to the present embodiment and depicts an example of a configuration of the pixel region 3 of the solid-state imaging apparatus 1. As depicted in FIG. 14, the pixel region 3 of the solid-state imaging apparatus 1 according to the present embodiment includes, for example, an effective pixel region R501 and an OPB region R503.

The effective pixel region R501 corresponds to a region in which an imaging object image is formed through an optical system such as a lens from within the pixel region 3 of the solid-state imaging apparatus 1. In particular, an image signal based on pixel signals (in other words, pixel values) read out from the pixels 2 included in the effective pixel region R501 from within the pixel region 3 of the solid-state imaging apparatus 1 is outputted as an imaging result of an image.

The OPB region R503 is a region provided in the proximity of the effective pixel region R501 and shielded by metal or the like. The pixels 2 included in the OPB region R503 are utilized, for example, for measurement of a level of a pixel signal that becomes a reference for correcting the black level. In particular, by measuring the level of a pixel signal outputted from a pixel 2 included in the OPB region R503, it is possible to recognize the level (offset amount) of a signal that includes an influence of dark current in a state in which no light is incident or reading out noise. Therefore, ideally the black level can be corrected to 0 by subtracting the measurement value of the level of a pixel signal outputted from a pixel 2 in the OPB region R503 (namely, an offset amount) from an image signal read out from a pixel 2 in the effective pixel region R501.

As described above, a pixel 2 included in the OPB region R503 is less likely to be influenced by light incident through an optical system such as a lens from the characteristic that it is shielded by the metal or the like. From such a characteristic as just described, it is possible to obtain, from a pixel 2 included in the OPB region R503, a comparatively stable output as a light reception result in comparison with a pixel 2 included in the effective pixel region R501. In other words, utilization of a characteristic of a pixel 2 included in the OPB region R503 is more effective than that in an alternative case in which a characteristic of a pixel 2 included in the effective pixel region R501 is utilized from the point of view that the requirement for reproducibility of a PUF value is satisfied.

Further, a pixel signal outputted from any pixel 2 included in the OPB region R503 is not outputted as an imaging result of an image. Therefore, it is difficult to infer a characteristic of a pixel 2 included in the OPB region R503 from an analysis result of an image obtained as a result of the imaging. In other words, even if a characteristic of a pixel 2 included in the OPB region R503 is utilized for generation of a PUF value, it is difficult to infer the PUF value from an analysis result of an image obtained as a result of imaging.

Further, since the pixels 2 included in the OPB region R503 need not necessarily operate normally, they are less likely to be deteriorated in comparison with the pixels 2 included in the effective pixel region R501. Therefore, the characteristic of the device to be utilized for generation of a PUF value is more effective also from the point of view of the reliability.

Further, the OPB region R503 is a region provided already in the existing solid-state imaging apparatus 1. Therefore, by utilizing a characteristic of a pixel 2 included in the OPB region R503 for generation of a PUF value, the necessity for providing a region for exclusive use or a device for exclusive use for generating the PUF value is eliminated.

For example, in the example depicted in FIG. 14, a characteristic of a pixel 2 included in the region indicated by reference sign R505 from among the pixels 2 included in the OPB region R503 is utilized for generation of a PUF value.

Thus, after the characteristics required for the PUF are described, an outline of the basic idea of the technology for generation of a PUF value according to the present embodiment has been described.

4.2. Generation Method of PUF Value

Subsequently, an outline of a generation method of a PUF value in the solid-state imaging apparatus 1 according to the present embodiment is described.

Figure 15:
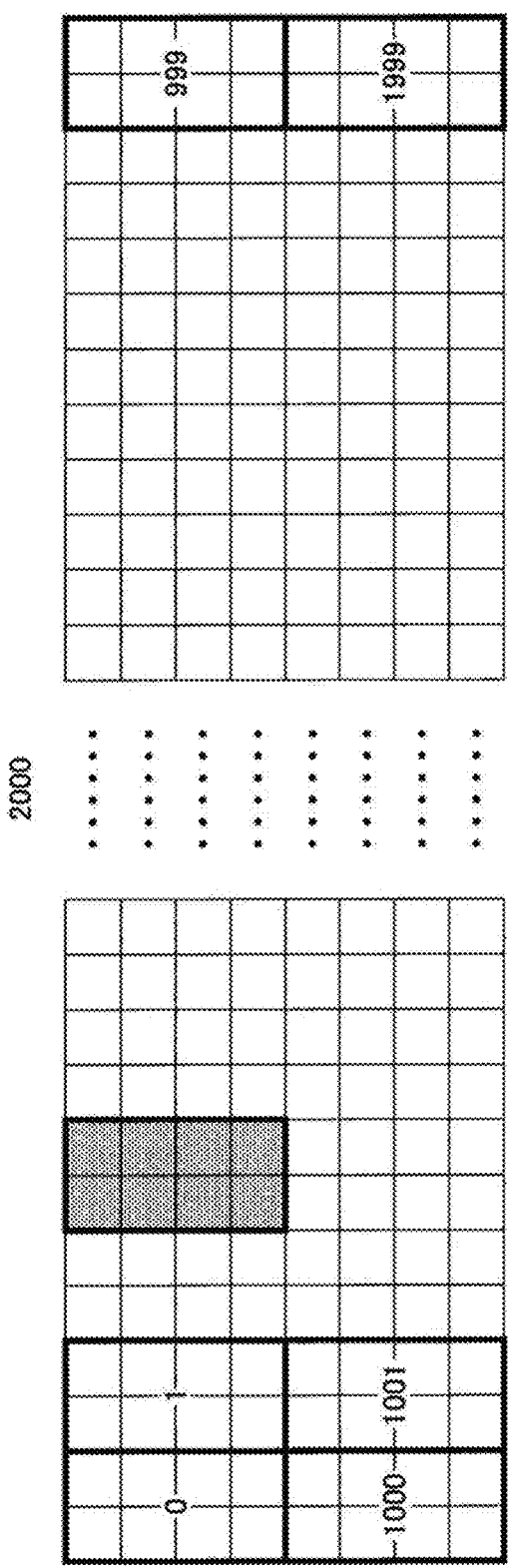
FIG. 15 is an explanatory view illustrating an example of a technology relating to generation of a PUF value relating to the second embodiment.

In the solid-state imaging apparatus 1 according to the present embodiment, pixels included in a predetermined region (for example, the OPB region) are divided into a plurality of blocks each including one or more pixels. On the basis of such a configuration as just described, in the solid-state imaging apparatus 1 according to the present embodiment, one or more blocks specified in accordance with a predetermined condition from among the plurality of blocks are utilized for generation of a PUF value. For example, FIG. 15 is an explanatory view illustrating an example the technology for generation of a PUF value in the present embodiment and depicts an example of the blocks described above. In particular, in the example depicted in FIG. 15, 2000×8 pixels are divided into blocks each including 2×4 pixels, and in this case, the number of blocks is 2000.

It is to be noted that, in the case where pixels included in a predetermined region are to be divided into a plurality of blocks, it is sufficient if each block is defined such that a plurality of pixels that share a predetermined circuit like a so-called AMP circuit are included in a common block. By adopting such a configuration as just described, the pixels included in each block come to indicate a same tendency of a dispersion arising from the circuit shared by the pixels from among dispersions of output signals from the pixels (namely, of pixel values).

Further, in the solid-state imaging apparatus 1 according to the present embodiment, a pixel value corresponding to each block is calculated on the basis of pixel values of one or more pixels included in the block. As a particular example, the total of pixel values of one or more pixels included in each block may be set as a pixel value corresponding to the block. For example, in the case where, in the example depicted in FIG. 15, the pixel value of each pixel is indicated by 10 bits, since one block includes 2×4 pixels, the pixel value that is calculated for each block and corresponds to the block can be represented as a value of 13 bits. It is to be noted that the pixel value calculated for each block and corresponding to the block is hereinafter referred to also merely as "pixel value for each block." Further, the pixel value of each pixel corresponds to a "first pixel value" and the pixel value for each block corresponds to a "second pixel value." It is to be noted that, in the case where it is defined that each block includes one pixel, the pixel value for each block corresponds to the pixel value for each pixel.

Figure 16:
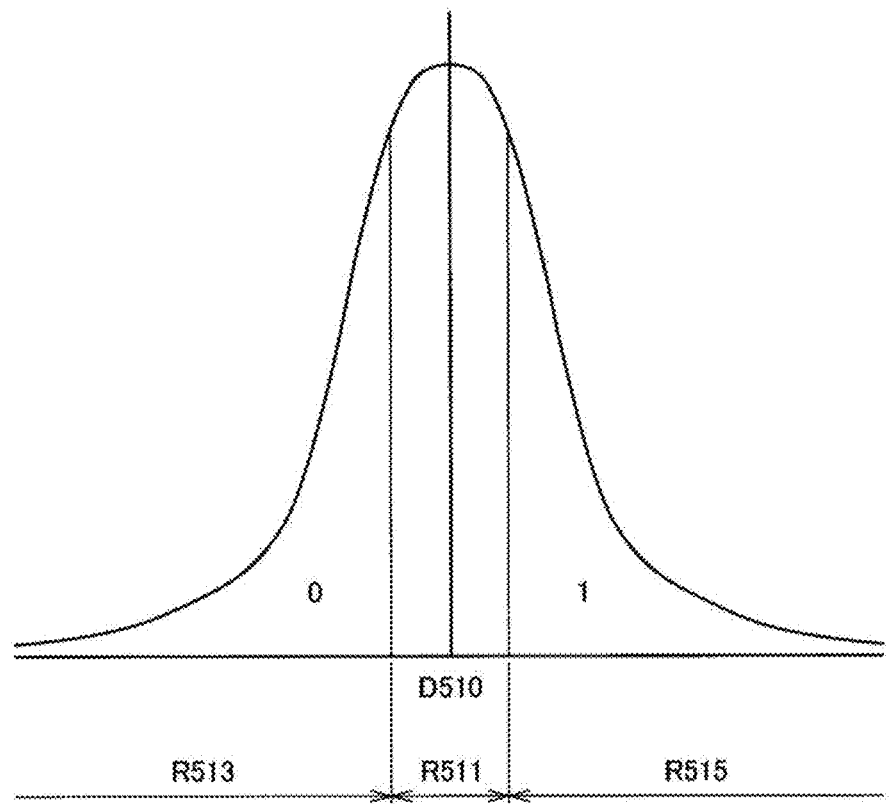
FIG. 16 is an explanatory view illustrating an example of the technology relating to generation of a PUF value relating to the second embodiment.

On the basis of such a configuration as described above, in the solid-state imaging apparatus 1 according to the present embodiment, from among a plurality of blocks defined in such a manner as described above, a block in which the pixel value for each block is not included in a predetermined range including an average of the pixel values among the plurality of blocks is utilized for generation of a PUF value. For example, FIG. 16 is an explanatory view illustrating an example of the technology for generation of a PUF value according to the present embodiment and depicts an example of a distribution of pixel values for each block among a plurality of blocks. Further, in FIG. 16, reference sign D510 indicates an average value of pixel values for each block among the plurality of blocks.

As depicted in FIG. 16, the distribution of pixel values for each block has a tendency that it indicates a so-called normal distribution with reference to the average D510 of the pixel values among the plurality of blocks. On the basis of such a configuration as just described, in the solid-state imaging apparatus 1 according to the present embodiment, for a block that indicates a pixel value higher than the average D510, "1" is set as a value for generating a PUF value, but for a block that indicates a pixel value lower than the average D510, "0" is set.

On the other hand, the pixel value for each block sometimes changes every time (for example, for each frame) by an influence of random noise and so forth. Therefore, for example, in regard to a block in which the pixel value indicates a value in the proximity of the average D510, there are a case in which the pixel value indicates a value higher than the average D510 (namely, "1" is set as a value for generating a PUF value) for each frame and another case in which the pixel value indicates a value lower than the average D510 (namely, "0" is set as a value for generating a PUF value) for each frame. Taking such a characteristic as just described into consideration, in the solid-state imaging apparatus 1 according to the present embodiment, a block in which the pixel value for each block is included in a predetermined range R511 including the average D510 is excluded from the utilization target for PUF value generation. In other words, a block in which the pixel value for each block is not included in the range R511, that is, a block in which the pixel value is included in one of the ranges R513 and R515 is specified as a utilization target for PUF value generation. In particular, as a value for generating a PUF value, "0" is set to a block in which the pixel value is included in the range R513, and "1" is set to a block in which the pixel value is included in the range R515.

It is to be noted that it is sufficient if the range R511 depicted in FIG. 16 is set, for example, in response to the standard deviation σ of pixel values for each block among the plurality of blocks. In this case, a block in which the absolute value of the difference between the pixel value for each block and the average D510 of the pixel values among the blocks (namely, the distance between the pixel value for each block and the average D510) is equal to or higher than a predetermined threshold value is specified as a utilization target for PUF value generation.

Here, in the case where the standard deviation of pixel values of the pixels in a block is represented by σ', the standard deviation σ' sometimes becomes, for example, approximately ½₀ the standard deviation σ of the pixel values for each block among the blocks. Thereupon, it is sufficient if the threshold value for the distance between the pixel value for each block and the average D510 is set, for example, around 0.3σ. In this case, in order for the value set in response to the pixel value to vary between "0" and "1" in a block in which the distance between the pixel value for each block and the average D510 exceeds the threshold value, it is necessary for the dispersion of the pixel value to exceed 6σ'.

From such a characteristic as just described, in the solid-state imaging apparatus 1 according to the present embodiment, a block in which the pixel value indicates a value around the average D510 is excluded from the utilization target for PUF value generation, and a block in which the distance between the pixel value and the average D510 is equal to or greater than the threshold value is made a utilization target for PUF value generation.

It is to be noted that, as the range R511 depicted in FIG. 16 is set narrower, while the number of blocks that can become a candidate for a utilization target for PUF value generation increases, there is a tendency that the probability that an error may occur in PUF values to be generated becomes higher. In contrast, as the range R511 is set wider, while the number of blocks that can become a candidate for a utilization target for PUF value generation decreases, it becomes possible to suppress lower the probability that an error may occur in PUF values to be generated. Therefore, for example, the range R511 to be excluded from the utilization target for PUF value generation may be set in response to an error rate permitted for PUF values to be generated.

It is to be noted that, since information itself of a block specified as a utilization target for PUF value generation is not information that becomes a protection target (information having confidentiality) like so-called secret information, it is sufficient if the information of the block is stored, for example, into a predetermined storage region in the solid-state imaging apparatus 1 (for example, into a nonvolatile storage region).

Now, an example of a method of calculating a value unique to the solid-state imaging apparatus 1 (namely, a PUF value) in response to pixel values for each block is described with reference to FIGS. 16 to 18. For example, FIGS. 17 and 18 are explanatory views illustrating an example of a generation method of a PUF value according to the present embodiment.

Figure 17:
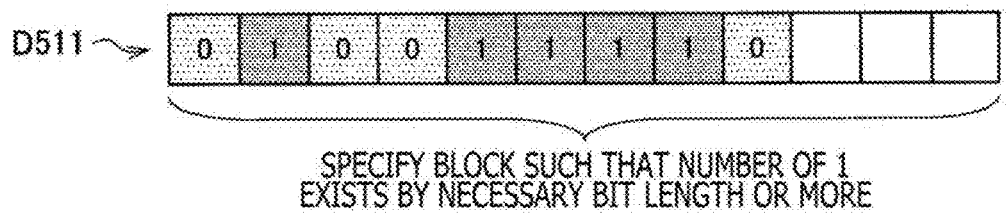
FIG. 17 is an explanatory view illustrating an example of a generation method of a PUF value relating to the second embodiment.
Figure 18:
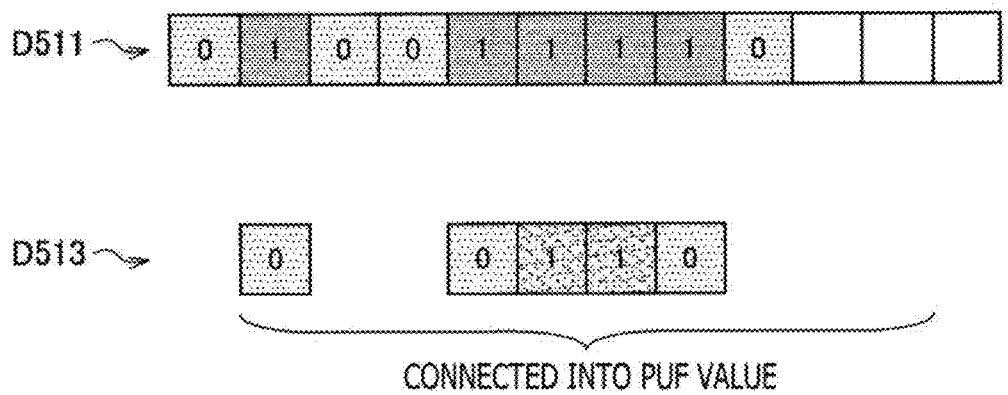
FIG. 18 is an explanatory view illustrating an example of the generation method of a PUF value relating to the second embodiment.

Referring to FIG. 17, reference sign D511 schematically indicates a plurality of blocks into which pixels included in a predetermined region are divided as described hereinabove with reference to FIG. 15. Further, the numerical value indicated in each block denoted by reference sign D511 indicates whether or not the pixel values corresponding to the block are included in a predetermined range including an average of the pixel values (namely, the range R511 depicted in FIG. 16).

In particular, the solid-state imaging apparatus 1 according to the present embodiment successively decides, for each block from a predetermined start position, whether or not the pixel values for each block are included in the predetermined range R511 including an average of the pixel values and associates a value of "0" or "1" with the block in response to a result of the decision. For example, in the example depicted by reference sign D511 of FIG. 17, "0" is associated with a block in which the pixel value is included in the range R511, and "1" is associated with a block in which the pixel value is not included in the range R511 (namely, included in the range R513 or R515). In such a manner as described above, the solid-state imaging apparatus 1 sequentially executes the decision described above until the number of blocks in which the pixel value for each block is not included in the range R511 (namely, the number of blocks with which "1" is associated) is specified by a predetermined bit length or more. Then, the solid-state imaging apparatus 1 causes the positions of the blocks with which the "1" is associated to be stored in a predetermined storage region. It is to be noted that the blocks with which "1" is associated are made a utilization target for PUF value generation.

Thereafter, the solid-state imaging apparatus 1 compares the pixel values of the blocks in which the pixel value for each block is not included in the range R511 with the average D510 of pixel values among the blocks as depicted in FIG. 17 to specify a value for generating a PUF value corresponding to the block (hereinafter referred to also as "bit value"). In particular, the solid-state imaging apparatus 1 sets "0" as the bit value to each of the target blocks in which the pixel value for each block is lower than the average D510 and sets "1" as the bit value to each of the target blocks in which the pixel value is higher than the average D510. For example, in FIG. 17, reference sign D513 schematically depicts a bit value set to each of the blocks that become a utilization target for PUF value generation.

In such a manner as described above, the solid-state imaging apparatus 1 secures bit values equal to or greater than the predetermined bit length and connects the bit values to generate a PUF value. It is to be noted that, upon generation of a PUF value, the solid-state imaging apparatus 1 may utilize part of the secured series of bit values to calculate an error-correcting code (ECC) for correcting an error of the PUF value re-calculated separately and cause the error-correcting code to be stored in a predetermined storage region. In this case, it is sufficient if a rather great number of blocks that become a utilization target for PUF value generation are specified such that bit values that are used for calculation of an error-correcting code are secured.

Further, in the case where a PUF value is used, the solid-state imaging apparatus 1 re-calculates the PUF value on the basis of the information stored in the predetermined storage region. In particular, the solid-state imaging apparatus 1 specifies blocks that become a utilization target for PUF value generation on the basis of the information stored in the storage region and reads out pixel values corresponding to the blocks (namely, the pixel values for each block). The solid-state imaging apparatus 1 compares the pixel values corresponding to the specified blocks with the average D510 of the pixel values among the blocks to specify bit values corresponding to the blocks and connects the specified bit values to re-generate a PUF value. Further, at this time, in the case where the error-correcting code for correcting an error of the PUF value is stored in the predetermined storage region, it is sufficient if the solid-state imaging apparatus 1 executes error correction for the PUF value generated again on the basis of the error-correcting code.

The PUF value generated (calculated) in such a manner as described above can be utilized, for example, as an identifier for identifying the solid-state imaging apparatus 1 or as key information for encrypting predetermined information generated in the solid-state imaging apparatus 1.

It is to be noted that, as the pixel value for each block utilized for generation of a PUF value, an average of pixel values for each block between a plural number of times of imaging may be utilized. Where such a configuration as just described is used, it is possible to reduce the influence of the dispersion of pixel values for each block by random noise or the like (in other words, it is possible to reduce the error rate of pixel values for each block).

An outline of the generation method of a PUF value in the solid-state imaging apparatus 1 according to the present embodiment has been described above with reference to FIGS. 15 to 18.

4.3. Functional Configuration>

Figure 19:
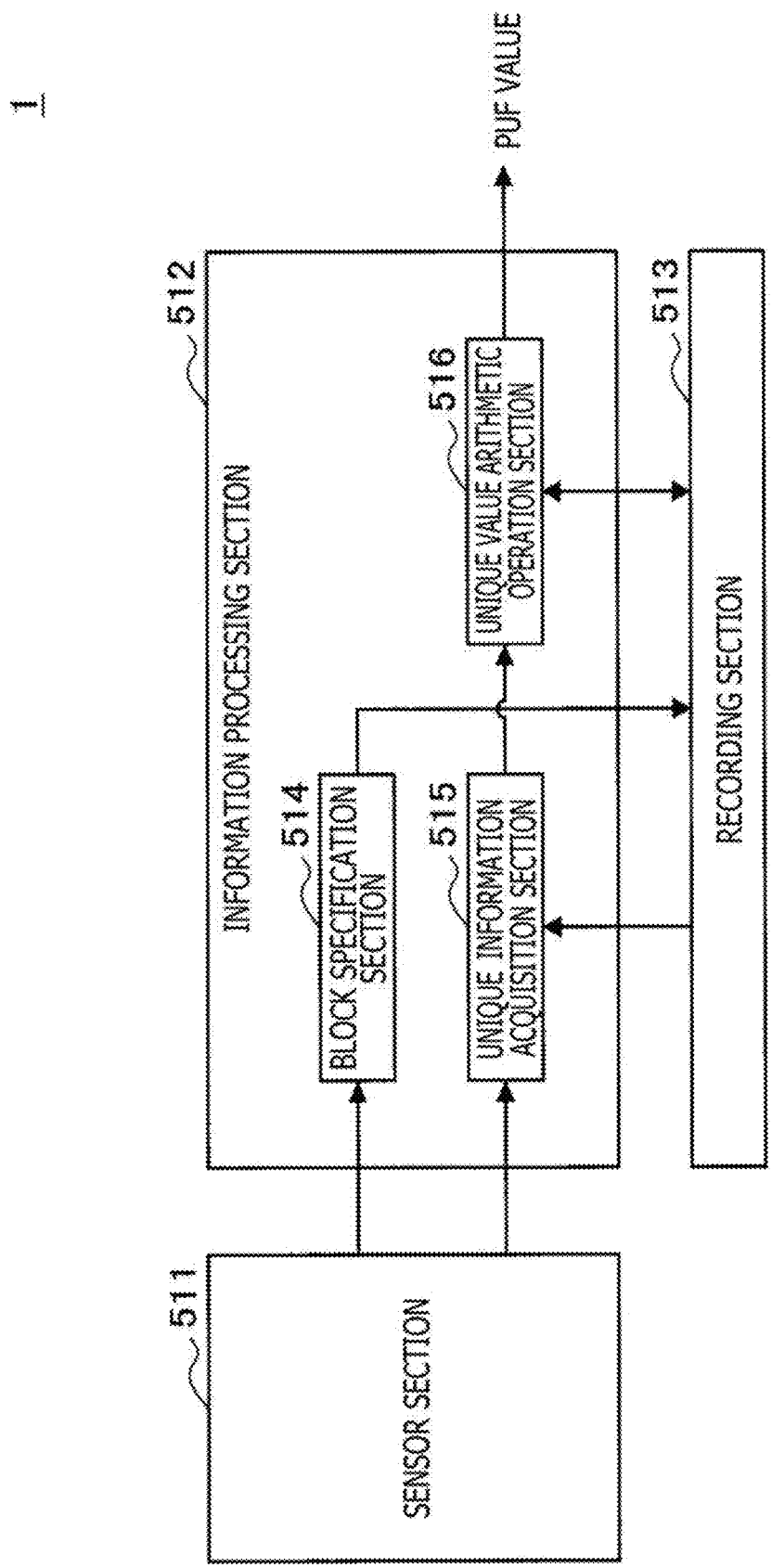
FIG. 19 is a block diagram depicting an example of a functional configuration of a solid-state imaging apparatus according to the second embodiment.

Now, an example of a functional configuration of the solid-state imaging apparatus 1 according to the present embodiment is described especially noticing a portion relating to generation and re-calculation of a PUF value unique to the solid-state imaging apparatus 1. For example, FIG. 19 is a block diagram depicting an example of a functional configuration of the solid-state imaging apparatus 1 according to the present embodiment. It is to be noted that, in FIG.

19, in order to further facilitate understanding of a feature of the solid-state imaging apparatus 1 according to the present embodiment, a configuration relating to generation of a PUF value unique to the solid-state imaging apparatus 1 is depicted while the configuration of the other part is not depicted.

As depicted in FIG. 19, the solid-state imaging apparatus 1 according to the present embodiment includes a sensor section 511, an information processing section 512 and a storage section 513.

The sensor section 511 corresponds to the pixel array 3 described hereinabove with reference to FIG. 1 and photoelectrically converts light from an imaging object into an electric signal.

The information processing section 512 executes various processes relating to generation of a PUF value unique to the solid-state imaging apparatus 1. As depicted in FIG. 19, the information processing section 512 includes, for example, a block specification section 514, a unique information acquisition section 515 and a unique value arithmetic operation section 516. It is to be noted that operation of the components of the information processing section 512 is described separately in regard to a case in which a PUF value is generated and another case in which a PUF value is re-calculated. First, noticing the case in which a PUF value is generated, operation of the associated components is described.

The block specification section 514 specifies one or more blocks that become a utilization target for PUF value generation in response to a predetermined condition from among a plurality of blocks into which pixels included in at least part of regions (for example, the OPB region) from among a plurality of pixels configuring the sensor section 511 are divided. As a particular example, the block specification section 514 may specify a block that becomes a utilization target for PUF value generation depending upon whether or not the pixel value for each value is included in a predetermined range including an average of the pixel values among the plurality of blocks. Then, the block specification section 514 causes information relating to the specified block to be stored in the storage section 513 hereinafter described. It is to be noted that the block specification section 514 corresponds to an example of the "specification section."

The unique information acquisition section 515 acquires, as unique information, the pixel value for each block from a predetermined number of blocks or more that become a utilization target for PUF value generation from among a plurality of blocks into which pixels included in the predetermined region (for example, the OPB region) are divided. It is to be noted that, at this time, the unique information acquisition section 515 may specify a block that becomes a utilization target for PUF value generation on the basis of the information stored in the storage section 513. Then, the unique information acquisition section 515 outputs unique information acquired from the predetermined number of blocks or more that become a utilization target for PUF value generation (namely, pixel values for each block) to the unique value arithmetic operation section 516.

The unique value arithmetic operation section 516 acquires the unique information acquired from the predetermined number of blocks or more that become a utilization target for PUF value generation from the unique information acquisition section 515 and generates a PUF value on the basis of the acquired unique information. As a particular example, the unique value arithmetic operation section 516 may specify, in response to whether or not the unique information acquired for each block is greater than a predetermined threshold value (for example, an average of pixel values among the blocks), a bit value corresponding to the block and connect the bit values specified for the individual blocks to generate a PUF value. It is to be noted that the unique value arithmetic operation section 516 corresponds to an example of the "generation section" that generates (calculates) a value unique to a device.

Further, when the unique value arithmetic operation section 516 generates a PUF value, it may utilize part of the bit values specified for each block to calculate an error-correcting code for correcting an error of the PUF value re-calculated separately and cause the error-correcting code to be stored in the storage section 513.

The unique value arithmetic operation section 516 generates a PUF value in such a manner as described above and outputs the generated PUF value to a predetermined outputting destination.

The storage section 513 temporarily or permanently retains various kinds of information for allowing the components of the solid-state imaging device 1 to execute various processes. The storage section 513 can be configured, for example, from a nonvolatile recording medium (for example, a memory or the like) that can retain storage content even if power is not supplied thereto. The storage section 513 may store, for example, information relating to a block that becomes a utilization target for PUF value generation. Further, an error-correcting code for correcting an error of a PUFF value may be stored in the storage section 513.

Now, operation of associated components is described noticing a case in which a PUF value is re-calculated.

The unique information acquisition section 515 acquires a pixel value for each block as unique information from a predetermined number of blocks or more that become a utilization target for PUF value generation similarly as upon generation of a PUF value. Then, the unique information acquisition section 515 outputs the unique information acquired individually from the predetermined number of blocks or more that become a utilization target for PUF value generation to the unique value arithmetic operation section 516.

The unique value arithmetic operation section 516 re-calculates a PUF value on the basis of the unique information for the individual blocks acquired from the unique information acquisition section 515 similarly as upon generation of a PUF value. Further, at this time, in the case where an error-correcting code for correcting an error of a PUF value is stored in the storage section 513, the unique value arithmetic operation section 516 may perform error correction of the re-calculated PUF value on the basis of the error-correcting code. Then, the unique value arithmetic operation section 516 outputs the re-calculated PUF value to a predetermined outputting destination.

An example of a functional configuration of the solid-state imaging apparatus 1 according to the present embodiment has been described above with reference to FIG. 19 especially noticing a portion that relates to generation and re-calculation of a PUF value unique to the solid-state imaging apparatus 1.

<4.4. Processing>

Subsequently, as an example of a flow of a series of processes of the solid-state imaging apparatus 1 according to the present embodiment, processing relating to generation and re-calculation of a PUF value unique to the solid-state imaging apparatus 1 is described.

Figure 20:
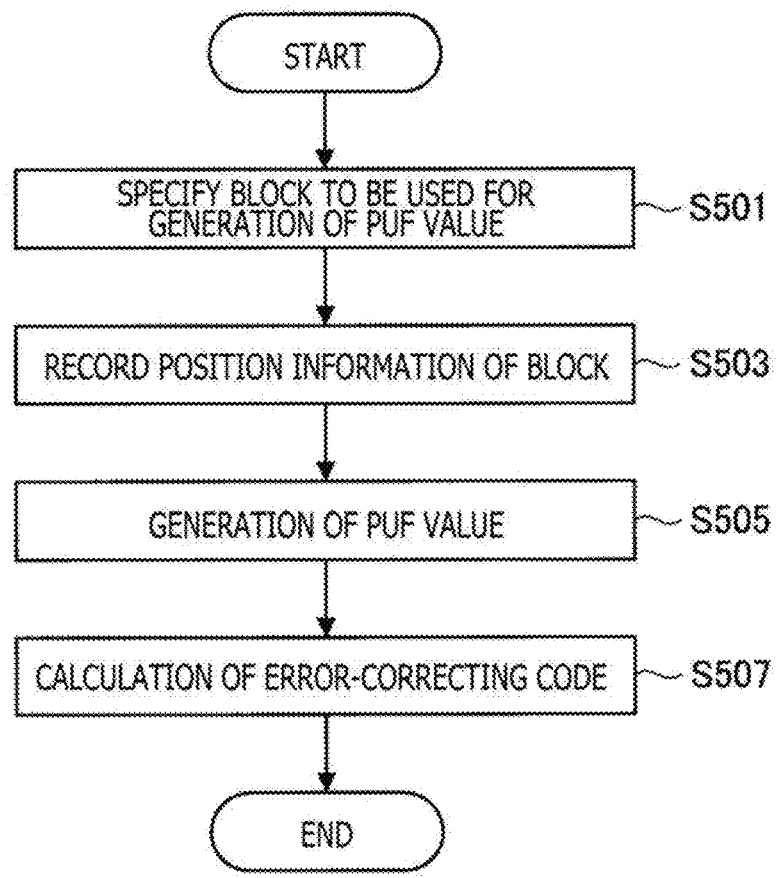
FIG. 20 is a flow chart depicting an example of a flow of a series of processes of the solid-state imaging apparatus according to the second embodiment.

First, referring to FIG. 20, an example of processing relating to generation of a PUF value is described. FIG. 20 is a flow chart depicting an example of a flow of a series of processes of the solid-state imaging apparatus 1 according to the present embodiment and depicts a flow of processing relating to generation of a PUF value.

As depicted in FIG. 20, the solid-state imaging apparatus 1 (block specification section 514) first specifies blocks of a predetermined number or greater (at least one or more blocks) that are made a utilization target for PUF value generation from among a plurality of blocks into which pixels included in a predetermined region are divided from among a plurality of pixels configuring the sensor section 511 (S501). Then, the solid-state imaging apparatus 1 causes information relating to the specified blocks (for example, information indicative of the position of each of the blocks) to be stored in a predetermined storage region (S503).

Then, the solid-state imaging apparatus 1 (unique information acquisition section 515) acquires, on the basis of the information stored in the predetermined storage region, pixel values for each block as unique information from the blocks specified as the utilization target for PUF value generation. Then, the solid-state imaging apparatus 1 (unique value arithmetic operation section 516) generates a PUF value on the basis of the unique information acquired from the predetermined number of blocks or more that become a utilization target. As a particular example, the solid-state imaging apparatus 1 may specify, depending upon whether or not the unique information acquired for each block is equal to or greater than a predetermined threshold value, a bit value corresponding to the block and connect the bit values specified for the individual blocks to generate a PUF value (S507).

Further, the solid-state imaging apparatus 1 (unique value arithmetic operation section 516) may utilize part of the bit values specified for the individual blocks to calculate an error-correcting code for correcting an error of a PUF value calculated separately. In this case, the solid-state imaging apparatus 1 may cause the calculated error-correcting code to be stored in a predetermined storage region (S507).

A PUF value is generated in such a manner as described above, and the generated PUF value is outputted to a predetermined outputting destination.

An example of processing relating to generation of a PUF value has been described with reference to FIG. 20.

Figure 21:
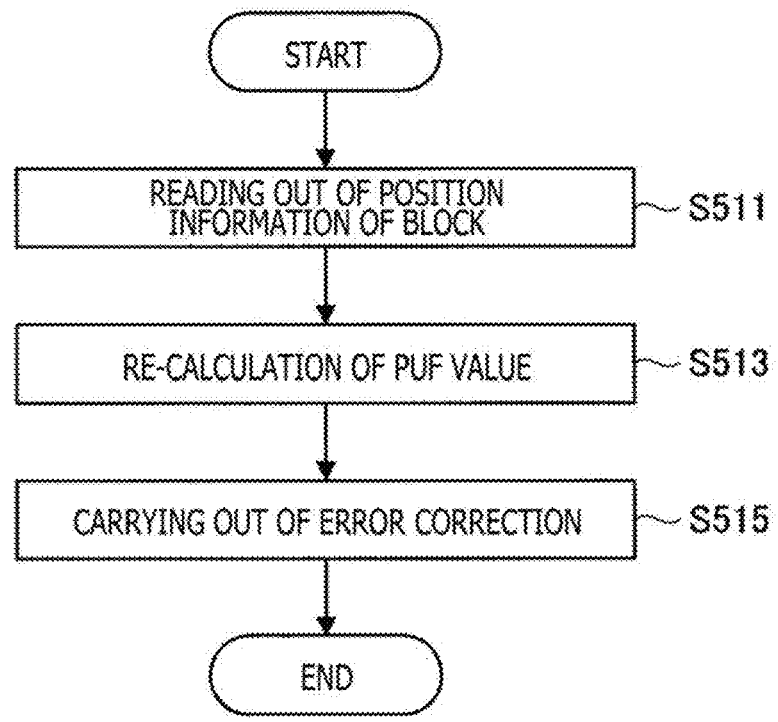
FIG. 21 is a flow chart depicting an example of a flow of a series of processes of the solid-state imaging apparatus 1 according to the second embodiment.

Now, an example of processing relating to re-calculation of a PUF value is described with reference to FIG. 21. FIG. 21 is a flow chart depicting an example of a flow of a series of processes of the solid-state imaging apparatus 1 according to the present embodiment and depicts a flow of processing relating to re-calculation of a PUF value.

As depicted in FIG. 21, the solid-state imaging apparatus 1 (unique information acquisition section 515) first specifies the position of blocks that become a utilization target for PUF value generation on the basis of the information stored in the predetermined storage region (S511).

Then, the solid-state imaging apparatus 1 (unique information acquisition section 515) acquires, from the blocks specified as the utilization target for PUF value generation, pixel values for each block as unique information. Then, the solid-state imaging apparatus 1 (unique value arithmetic operation section 516) re-calculates a PUF value on the basis of the unique information acquired individually from the predetermined number of blocks or more that become a utilization target similarly as upon generation of a PUF value (S513)

Further, in the case where an error-correcting code for correcting an error of a PUF value is stored in a predetermined storage region, the solid-state imaging apparatus 1 (unique information acquisition section 515) may perform error correction of the PUF value re-calculated on the basis of the error-correcting code (S515).

A PUF value is re-calculated in such a manner as described above, and the re-calculated PUF value is outputted to a predetermined outputting destination.

An example of processing relating to re-calculation of a PUF value has been described with reference to FIG. 21.

4.5. Evaluation

As described above, the solid-state imaging apparatus 1 according to the present embodiment specifies, as a target for PUF value generation, at least one or more blocks from among a plurality of blocks set by dividing pixels included in at least part of a region (for example, an OPB region) of an imaging plane on which a plurality of pixels are arrayed. It is to be noted that each block includes at least one or more pixels. Thus, the solid-state imaging apparatus 1 generates a value unique to the solid-state imaging apparatus 1 (for example, a PUF value) on the basis of pixel values of pixels included in the specified blocks and a dispersion of pixel values of the pixels among the plurality of blocks.

By such a configuration as described above, a value unique to the solid-state imaging apparatus 1 is generated utilizing a physical feature (namely, a hardware feature) of the solid-state imaging apparatus 1 difficult to duplicate. Therefore, it is possible to utilize the unique value, for example, as an identifier for identifying an individual device or as key information for an encryption process or the like. Further, since a value unique to the solid-state imaging apparatus 1 is generated on the basis of the configuration described above, in the case where the unique value is utilized as the identifier or the key information, a condition for reproducibility or individual differences required for the identifier or the key information can be satisfied sufficiently.

It is to be noted that the example described above is an example to the last, and if a physical feature can be detected for each pixel 2 and besides it is possible to satisfy a condition for reproducibility or individual differences required for the PUF value, then the physical feature is not necessarily limited only to the dispersion of the threshold voltage Vth for the amplification transistor Tr13. For example, a physical feature of a different transistor other than the amplification transistor Tr13 from among the transistors configuring the pixel 2 may be utilized, and the physical feature is not necessarily limited only to the dispersion of the threshold voltage Vth. As a particular example, a detection result of noise generated arising from a device like a so-called RTS (Random Telegraph Signal) or the like may be utilized for generation of a PUF value.

5. Application Example

Now, an application example of a solid-state imaging apparatus according to the present disclosure is described.

5.1. Application Example to Biometric Authentication

As an application example of the technology according to the present disclosure, an example of a case in which the solid-state imaging apparatus 1 according to an embodiment of the present disclosure is applied to biometric authentication for which biometric information is utilized is described. It is to be noted that, in the present set-up, it is assumed that "biometric information" signifies information representing a feature of a human body such as, for example, an iris, a fingerprint, a vein, the face, a handprint, a voice print, a pulse wave and a retina.

Figure 22:
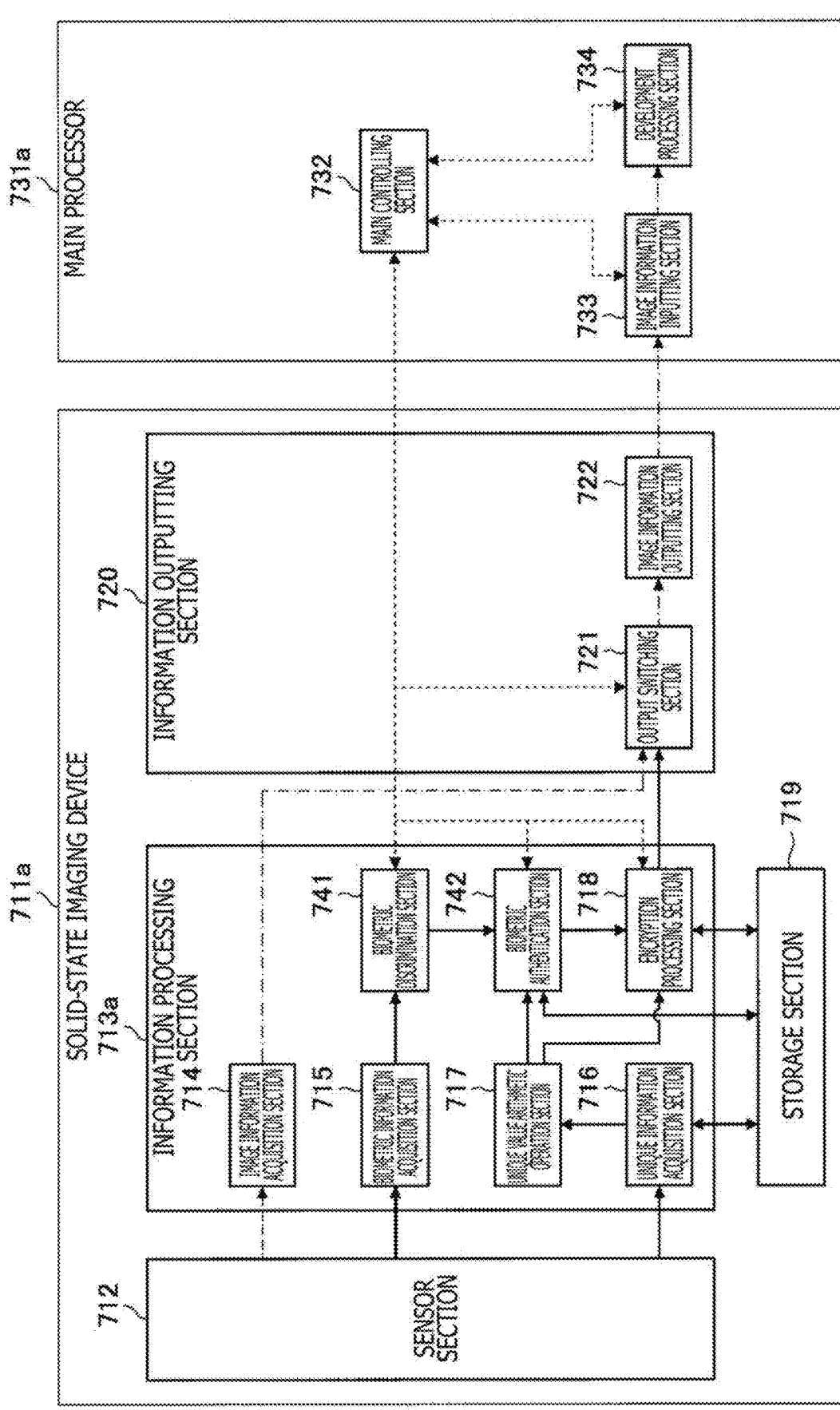
FIG. 22 is a block diagram depicting an example of a schematic functional configuration of an imaging apparatus in the case where it is applied to biometric authentication.

Configuration Example 1: Example of Configuration in which Biometric Authentication is Performed by Solid-State Imaging Apparatus First, an example of a functional configuration of an imaging apparatus to which the solid-state imaging apparatus according to the present application example is applied, especially, an example of a case in which biometric authentication is performed in the solid-state imaging apparatus, is described with reference to FIG. 22. FIG. 22 is an explanatory view illustrating an application example of the technology according to the present disclosure and is a block diagram depicting an example of a schematic functional configuration of the imaging apparatus according to the present application example.

As depicted in FIG. 22, the imaging apparatus 710a according to the present application example includes a solid-state imaging device 711a and a main processor 731a.

The solid-state imaging device 711a corresponds to the solid-state imaging apparatus 1 according to the embodiment of the present disclosure described hereinabove. As depicted in FIG. 22, the solid-state imaging device 711a includes a sensor section 712, an information processing section 713, a storage section 719 and an information outputting section 720. Further, though not depicted in FIG. 22, the solid-state imaging device 711a may include a register interface that transmits and receives a set value to and from the outside. Here, the "outside" signifies a recording medium into which image information generated by an image sensor is stored, a network for transmitting the image information, an imaging apparatus main body such as a main processor or a digital camera that processes the image information, a personal computer (PC), a portable terminal, a game machine, a non-contacting type IC card such as a FeliCa (registered trademark) card or a USB memory.

The sensor section 712 corresponds to the pixel array 3 described hereinabove with reference to FIG. 1 and performs photoelectric conversion of light from an imaging object into an electric signal.

The information processing section 713a performs processing for acquired information as occasion demands. As depicted in FIG. 22, the information processing section 713a includes, for example, an image information acquisition section 714, a biometric information acquisition section 715, a biometric discrimination section 741, a biometric authentication section 742, a unique information acquisition section 716, a unique value arithmetic operation section 717 and an encryption processing section 718.

The image information acquisition section 714 performs analog to digital conversion (A/D conversion) for converting the electric signal after photoelectric conversion by the sensor section 712 from an analog signal into a digital signal on the basis of light of an imaging object captured by a user to acquire image information.

The biometric information acquisition section 715 performs A/D conversion of an electric signal after photoelectric conversion by the sensor section 712 on the basis of light of an imaging object captured in order to perform biometric authentication of a user to acquire biometric information.

The unique information acquisition section 716 acquires information unique to a device configuring the solid-state imaging device 711 (hereinafter referred to also as "unique information"). For example, as described hereinabove as the second embodiment, the unique information acquisition section 716 may acquire pixel values of one or more pixels included in at least part of a region (for example, OPB region) from among a plurality of pixels configuring the sensor section 712 as unique information. Further, at this time, the unique information acquisition section 716 may specify pixels that become an acquisition target of unique information or a block including one or more pixels, for example, on the basis of information retained in advance in the storage section 719 hereinafter described.

The unique value arithmetic operation section 717 generates (or calculates) a value unique to the solid-state imaging device 711 on the basis of a predetermined function (for example, the PUF described above) using the unique information acquired by the unique information acquisition section 716 as an input thereto. As a particular example, as described above as the second embodiment, the unique value arithmetic operation section 717 may generate a PUF value unique to the solid-state imaging device 711 taking a pixel value of a predetermined pixel acquired as the unique information as an input thereto.

The biometric discrimination section 751 discriminates whether or not the biometric information acquired by the biometric information acquisition section 715 is capable of being used for authentication of the user.

The biometric authentication section 752 compares the biometric information discriminated as information with which the user can be authenticated and reference information stored in a predetermined storage region (for example, the storage section 719 hereinafter described) with each other to authenticate whether or not the user has eligibility for use. It is to be noted that the reference information may be in the form encrypted on the basis of a value unique to the solid-state imaging device 711 (for example, a PUF value) generated by the unique value arithmetic operation section 717. In this case, the biometric authentication section 752 may acquire the value unique to the solid-state imaging device 711 from the unique value arithmetic operation section 717 and decrypt the reference information on the basis of the acquired value.

The encryption processing section 718 encrypts the biometric authentication information representing that the user is authenticated as having eligibility for use to generate cryptographic information and transmits the cryptographic information to the information outputting section 720. It is to be noted that key information for the encryption may be encrypted, for example, on the basis of a value (for example, a PUF value) unique to the solid-state imaging device 711 generated by the unique value arithmetic operation section 717. In this case, the encryption processing section 718 may acquire the value unique to the solid-state imaging device 711 from the unique value arithmetic operation section 717 such that the key information is decrypted on the basis of the acquired value.

The information outputting section 720 outputs various kinds of information outputted from the information processing section 713a to the outside of the solid-state imaging device 711a, and includes, for example, an output switching section 721 and an image information outputting section 722.

The output switching section 721 performs switching in regard to which information is to be outputted to the outside of the solid-state imaging device 711a in response to the type of the information inputted from the information processing section 713a. In other words, the output switching section 721 has a role of a switch for switching the outputting destination. Since the solid-state imaging device 711a includes the output switching section 721, the user can select whether image information described below is to be outputted or cryptographic information is to be outputted.

For example, in the case where it is selected that the cryptographic information is to be outputted, the output switching section 721 performs control such that cryptographic information generated by the encryption processing section 718 (for example, encrypted biometric authentication information) is transmitted to the main processor 731a through a register interface (not depicted) or the like.

In the case where it is selected in the output switching section 721 that the image information is to be outputted, the image information outputting section 722 receives the image information acquired by the image information acquisition section 714 and outputs the received image information to the outside of the solid-state imaging device 711a.

The main processor 731a receives image information or cryptographic information from the solid-state imaging device 711a and executes various processes in response to the type of the received information. As depicted in FIG. 22, the main processor 731a includes a main controlling section 732, an image information inputting section 733 and a development processing section 734.

The main controlling section 732 controls operation of the various components of the imaging apparatus 710a. For example, in order to cause the solid-state imaging device 711a to execute the various functions, the main controlling section 732 transmits control signals corresponding to the functions to the solid-state imaging device 711a. Further, in order to implement the various functions of the main processor 731a, the main controlling section 732 transmits control signals corresponding to the functions to various sections in the main processor 731a.

The image information inputting section 733 acquires image information outputted from the solid-state imaging device 711a in accordance with the control signal from the main controlling section 732.

The development processing section 734 performs a development process of an output image on the basis of the image information acquired from the solid-state imaging device 711a by the image information inputting section 733 in accordance with the control signal from the main controlling section 732.

An example of the functional configuration of the imaging apparatus to which the solid-state imaging apparatus according to the present application example is applied, especially, an example of a case in which biometric authentication is performed in the solid-state imaging apparatus, is described above with reference to FIG. 22.

Figure 23:
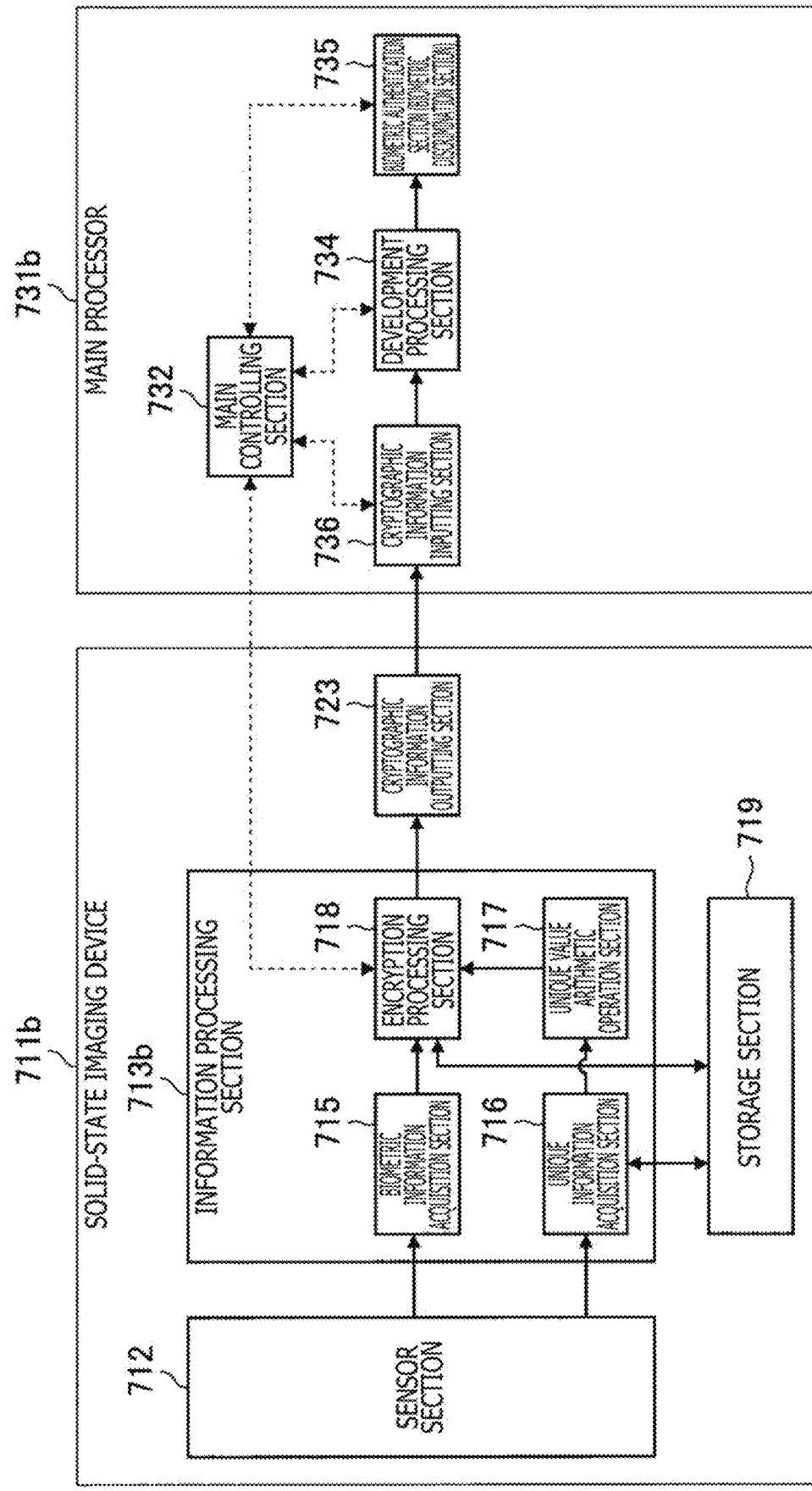
FIG. 23 is a block diagram depicting another example of the schematic functional configuration of the imaging apparatus in the case where it is applied to biometric authentication.

Configuration Example 2: Example of Configuration in which Biometric Information is Encrypted and Outputted Now, an example of a functional configuration of an imaging apparatus to which the solid-state imaging apparatus according to the present application example is applied, especially, an example of a case in which an encryption process is performed for biometric information acquired by the solid-state imaging apparatus and the resulting biometric information is outputted to the outside, is described with reference to FIG. 23. FIG. 23 is an explanatory view illustrating an application example of the technology according to the present disclosure and is a block diagram depicting a different example of a schematic functional configuration of the imaging apparatus according to the present application example. It is to be noted that, in the present description, the functional configuration of the imaging apparatus 710b depicted in FIG. 23 is described especially noticing a configuration different from that of the imaging apparatus 710a described with reference to FIG. 22, and detailed description of the configuration substantially similar to that of the imaging apparatus 710a is omitted.

As depicted in FIG. 23, the imaging apparatus 710b according to the present application example includes a solid-state imaging device 711b and a main processor 731b. It is to be noted that the solid-state imaging device 711b and the main processor 731b correspond to the solid-state imaging device 711a and the main processor 731a in the imaging apparatus 710a depicted in FIG. 22, respectively. It is to be noted that, in the example depicted in FIG. 23, in order to make features easier to understand, principally a configuration relating to a process that targets biometric information is indicated while illustration of the configuration relating to the process that targets the image information described above is omitted. Therefore, for example, also in the example depicted in FIG. 23, the imaging apparatus 710b may include the configuration of the image information acquisition section 714, the output switching section 721, the image information outputting section 722, the image information inputting section 733 and so forth similarly as in the example depicted in FIG. 22.

As depicted in FIG. 23, the solid-state imaging device 711b includes a sensor section 712, an information processing section 713b, a cryptographic information outputting section 723 and a storage section 719. The information processing section 713b further includes, for example, a biometric information acquisition section 715, a unique information acquisition section 716, a unique value arithmetic operation section 717 and an encryption processing section 718. It is to be noted that the sensor section 712, the storage section 719, the biometric information acquisition section 715, the unique information acquisition section 716 and the unique value arithmetic operation section 717 are substantially similar to the sensor section 712, the storage section 719, the biometric information acquisition section 715, the unique information acquisition section 716 and the unique value arithmetic operation section 717 in the imaging apparatus 710a depicted in FIG. 22, respectively.

The encryption processing section 718 encrypts biometric information (for example, image information of an iris, a fingerprint, a vein, a face, a handprint, a voice print, a pulse wave, a retina and so forth) acquired by the biometric information acquisition section 715 to generate cryptographic information and transmits the generated cryptographic information to the cryptographic information outputting section 723. It is to be noted that key information for the encryption may be encrypted, for example, on the basis of a value unique to the solid-state imaging device 711 (for example, a PUF value) generated by the unique value arithmetic operation section 717. In this case, the encryption processing section 718 may acquire the value unique to the solid-state imaging device 711 from the unique value arithmetic operation section 717 and decrypt the key information on the basis of the acquired value.

The cryptographic information outputting section 723 receives the cryptographic information generated by performing the encryption process for the biometric information by the encryption processing section 718 and outputs the cryptographic information to the outside of the solid-state imaging device 711b.

The main processor 731b includes a main controlling section 732, a cryptographic information inputting section 736, a development processing section 734 and a biometric authentication section 735.

The main controlling section 732 controls operation of the various components of the imaging apparatus 710b. For example, in order to cause the solid-state imaging device 711b to execute each function, the main controlling section 732 transmits a control signal corresponding to the function to the solid-state imaging device 711b. Further, in order to implement the functions of the main processor 731b, the main controlling section 732 transmits, to each section in the main processor 731b, a control signal corresponding to the function.

The cryptographic information inputting section 736 acquires the cryptographic information outputted from the solid-state imaging device 711b in accordance with the control signal from the main controlling section 732.

The development processing section 734 decrypts the cryptographic information acquired from the solid-state imaging device 711b by the cryptographic information inputting section 736 in accordance with the control signal from the main controlling section 732, and performs a development process of an output image to be utilized for biometric authentication on the basis of the biometric information (image information) obtained as a result of the decryption. It is to be noted that, relating to the key information for decryption of the cryptographic information, it is sufficient if key information similar to the key information utilized for generation of the cryptographic information is acquired and stored in a predetermined storage region in advance. Then, the development processing section 734 outputs the output image obtained as a result of the development process to the biometric authentication section 735.

The biometric authentication section 735 discriminates whether or not the output image outputted from the development processing section 734 is capable of being used for authentication of the user. The biometric authentication section 735 compares the output image that is discriminated as an image capable of being used for authentication of the user (in other words, biometric information) and reference information stored in a predetermined storage region with each other to authenticate whether or not the user has eligibility for use.

An example of a functional configuration of the imaging apparatus to which the solid-state imaging apparatus according to the present application example is applied, especially, an example of a case in which the encryption process is performed for the biometric information acquired by the solid-state imaging apparatus and the resulting biometric information is outputted to the outside, is described above with reference to FIG. 23.

Figure 24:
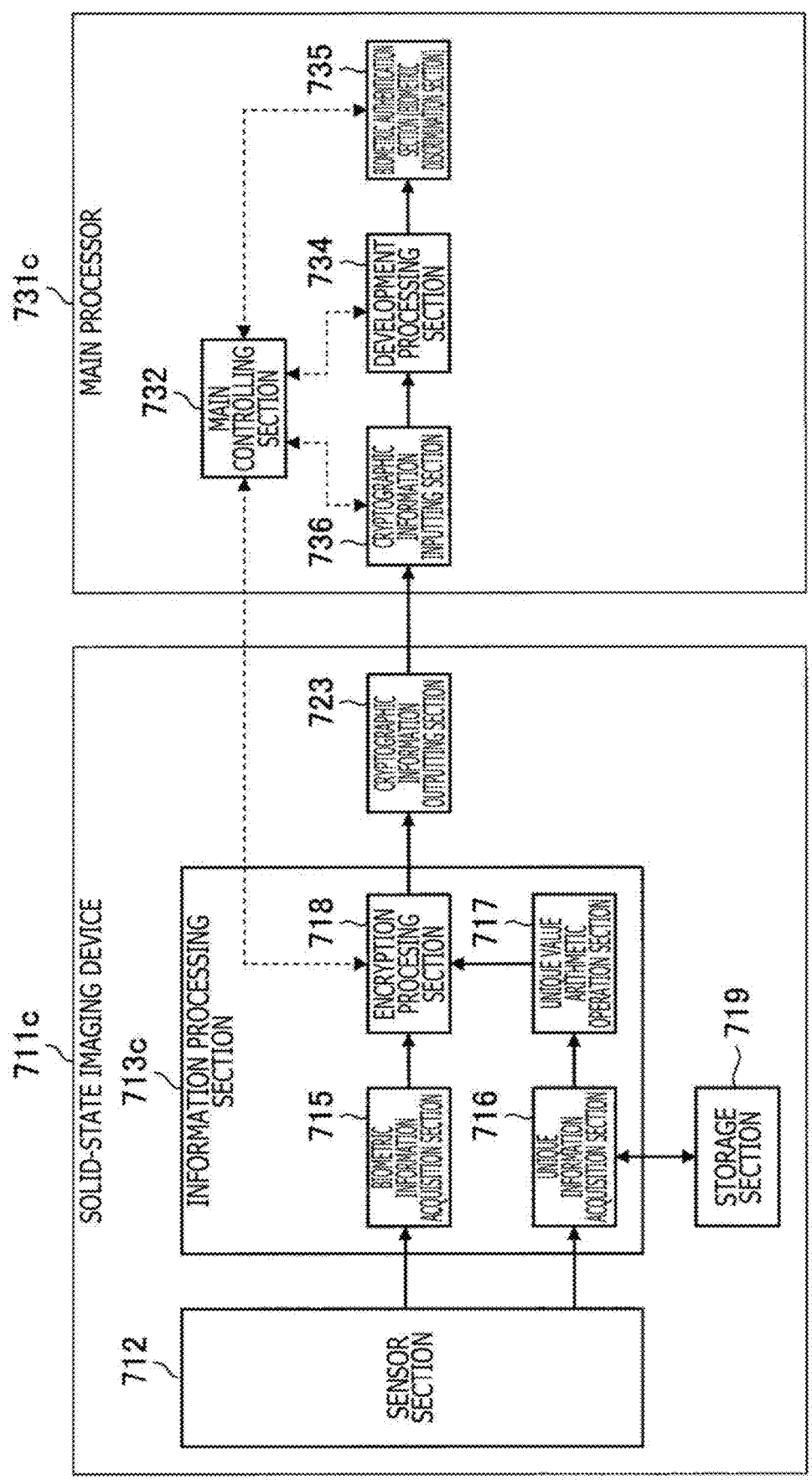
FIG. 24 is a block diagram depicting a further example of the schematic functional configuration of the imaging apparatus in the case where it is applied to biometric authentication.

Configuration Example 3: Different Example of Configuration in which Biometric Information is Encrypted and Outputted Now, an example of a functional configuration of an imaging apparatus to which the solid-state imaging apparatus according to the present application example is applied, especially, a different example of a case in which an encryption process is performed for biometric information acquired by the solid-state imaging apparatus and the resulting biometric information is outputted to the outside, is described with reference to FIG. 24. FIG. 24 is an explanatory view illustrating an application example of the technology according to the present disclosure and is a block diagram depicting a different example of a schematic functional configuration of the imaging apparatus according to the present application example. It is to be noted that, in the present description, the functional configuration of an imaging apparatus 710c depicted in FIG. 24 is described especially noticing a configuration different from that of the imaging apparatus 710b described with reference to FIG. 23, and detailed description of a portion substantially similar to that of the imaging apparatus 710b is omitted.

As depicted in FIG. 24, the imaging apparatus 710c according to the present application example includes a solid-state imaging device 711c and a main processor 731c. It is to be noted that the solid-state imaging device 711c and the main processor 731c correspond to the solid-state imaging device 711b and the main processor 731b in the imaging apparatus 710b depicted in FIG. 23, respectively. It is to be noted that, in the example depicted in FIG. 24, in order to make features easier to understand, principally a configuration relating to processing targeting biometric information is depicted and illustration of a configuration relating to processing targeting image information described above is omitted. Therefore, for example, also in the example depicted in FIG. 24, the components including an image information acquisition section 714, an output switching section 721, an image information outputting section 722, an image information inputting section 733 and so forth may be included similarly as in the example depicted in FIG. 22.

As depicted in FIG. 24, the solid-state imaging device 711c includes a sensor section 712, an information processing section 713c, a cryptographic information outputting section 723 and a storage section 719. Further, the information processing section 713c includes, for example, a biometric information acquisition section 715, a unique information acquisition section 716, a unique value arithmetic operation section 717 and an encryption processing section 718.

It is to be noted that the example depicted in FIG. 24 is different from the example depicted in FIG. 24 in that a value unique to the solid-state imaging device 711c (for example, a PUF value) generated by the unique value arithmetic operation section 717 is used as key information for performing an encryption process for the biometric information acquired by the biometric information acquisition section 715. In particular, in the solid-state imaging device 711c depicted in FIG. 24, operation of the encryption processing section 718 is different from that of the solid-state imaging device 711b depicted in FIG. 23, and the other components are substantially similar to those of the solid-state imaging device 711b.

In particular, the encryption processing section 718 encrypts the biometric information acquired by the biometric information acquisition section 715 to generate cryptographic information using the value unique to the solid-state imaging device 711c generated by the unique value arithmetic operation section 717 as key information, and transmits the cryptographic information to the cryptographic information outputting section 723.

Further, the cryptographic information outputting section 723 receives the cryptographic information generated by performing the encryption process for the biometric information by the encryption processing section 718, and outputs the cryptographic information to the outside of the solid-state imaging device 711c.

The cryptographic information inputting section 736 acquires the cryptographic information outputted from the solid-state imaging device 711c in accordance with a control signal from the main controlling section 732.

The development processing section 734 decrypts the cryptographic information acquired from the solid-state imaging device 711c by the cryptographic information inputting section 736 in accordance with a control signal from the main controlling section 732, and performs a development process of the output image to be utilized for biometric authentication on the basis of biometric information (image information) obtained as a result of the decryption. It is to be noted that it is sufficient if the key information for decryption of the cryptographic information, namely, a value unique to the solid-state imaging device 711c (for example, a PUF value), is acquired in advance and stored in a predetermined storage region. Then, the development processing section 734 outputs the output image obtained as a result of the development process to the biometric authentication section 735.

It is to be noted that succeeding processes are similar to those of the imaging apparatus 710b described with reference to FIG. 23.

As described above, in the solid-state imaging device 711c depicted in FIG. 24, it is not necessary any more to store the key information itself to be utilized for encryption of biometric information into the storage region of the solid-state imaging device 711c. Therefore, with the solid-state imaging device 711c depicted in FIG. 24, the security performance relating to protection of biometric information can be enhanced further in comparison with that of the solid-state imaging device 711b described with reference to FIG. 23.

An example of a functional configuration of the imaging apparatus to which the solid-state imaging apparatus according to the present application example is applied, especially, a different example of a case in which the encryption process is performed for the biometric information acquired by the solid-state imaging apparatus and the resulting biometric information is outputted to the outside, is described above with reference to FIG. 24.

5.2. Application Example to Biometric Authentication System

Now, as an application example of the technology according to the present disclosure, an application example to a so-called biometric authentication system in which biometric information acquired by the solid-state imaging apparatus 1 according to the embodiment of the present disclosure is transferred to a server through a network such that biometric authentication is executed in the server.

(System Configuration)

Figure 25:
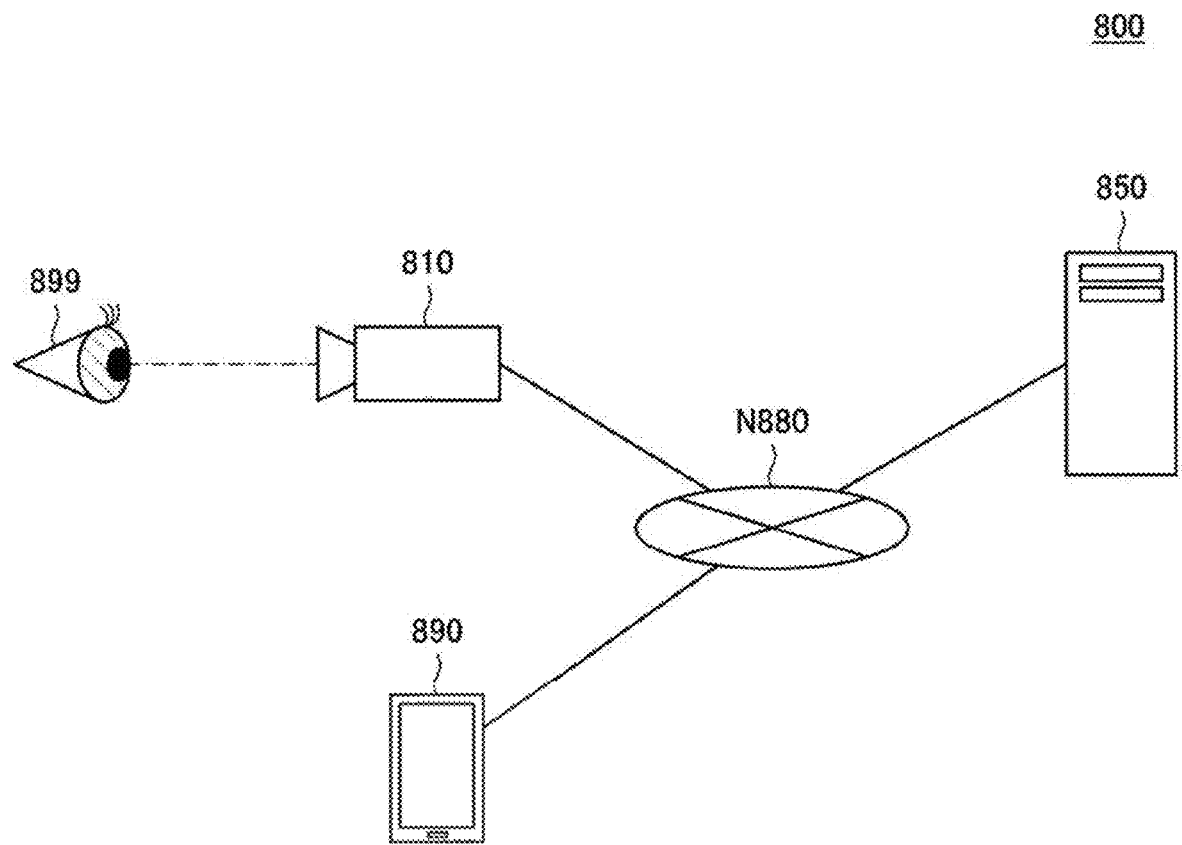
FIG. 25 is a block diagram depicting an example of a schematic system configuration of a biometric authentication system.

First, an example of a schematic system configuration of the biometric authentication system according to the present application example is described with reference to FIG. 25. FIG. 25 is an explanatory view illustrating an application example of the technology according to the present disclosure and is a block diagram depicting an example a schematic system configuration of the biometric authentication system.

As depicted in FIG. 25, the biometric authentication system 800 according to the present application example includes an imaging apparatus 810 and a server 850. Further, the biometric authentication system 800 may include a terminal apparatus 890. The imaging apparatus 810, the server 850 and the terminal apparatus 890 are configured such that information can be transmitted and received to and from each other through a predetermined network N880. It is to be noted that the kind of the network N880 that connects the imaging apparatus 810, the server 850 and the terminal apparatus 890 to each other is not limited specifically. For example, the network N880 may include the Internet, a dedicated line, a LAN (Local Area Network), a WAN (Wide Area Network) or the like. Further, the network N880 may include a wireless network or may include a wired network. Further, the network N880 may include a plurality of networks, and at least part of the plurality of networks may be configured as a wired network. Further, a network for connecting different apparatuses to each other may be set individually. As a particular example, a network that connects the imaging apparatus 810 and the server 850 to each other and another network that connects the server 850 and the terminal apparatus 890 to each other may be configured as networks different from each other.

On the basis of such a configuration as just described, in the biometric authentication system 800 according to the present application example, for example, biometric information obtained by imaging an imaging object by the imaging apparatus 810 is transmitted from the imaging apparatus 810 to the server 850 such that biometric authentication based on the biometric information is executed by the server 850. Then, for example, the server 850 executes various processes in response to a result of the biometric authentication and transmits a result of the execution of the processes to the terminal apparatus 890 (for example, a smartphone or the like) of the user specified on the basis of a result of the biometric authentication. By such a configuration as just described, a result of the various processes executed in response to a result of the biometric authentication based on the imaging result by the imaging apparatus 810 can be confirmed by the terminal apparatus 890 retained by the user itself.

Then, an example of a functional configuration especially of the imaging apparatus 810 and the server 850 from among the apparatuses included in the biometric authentication system 800 according to the present application example is described below.

(Functional Configuration of Imaging Apparatus 810)

Figure 26:
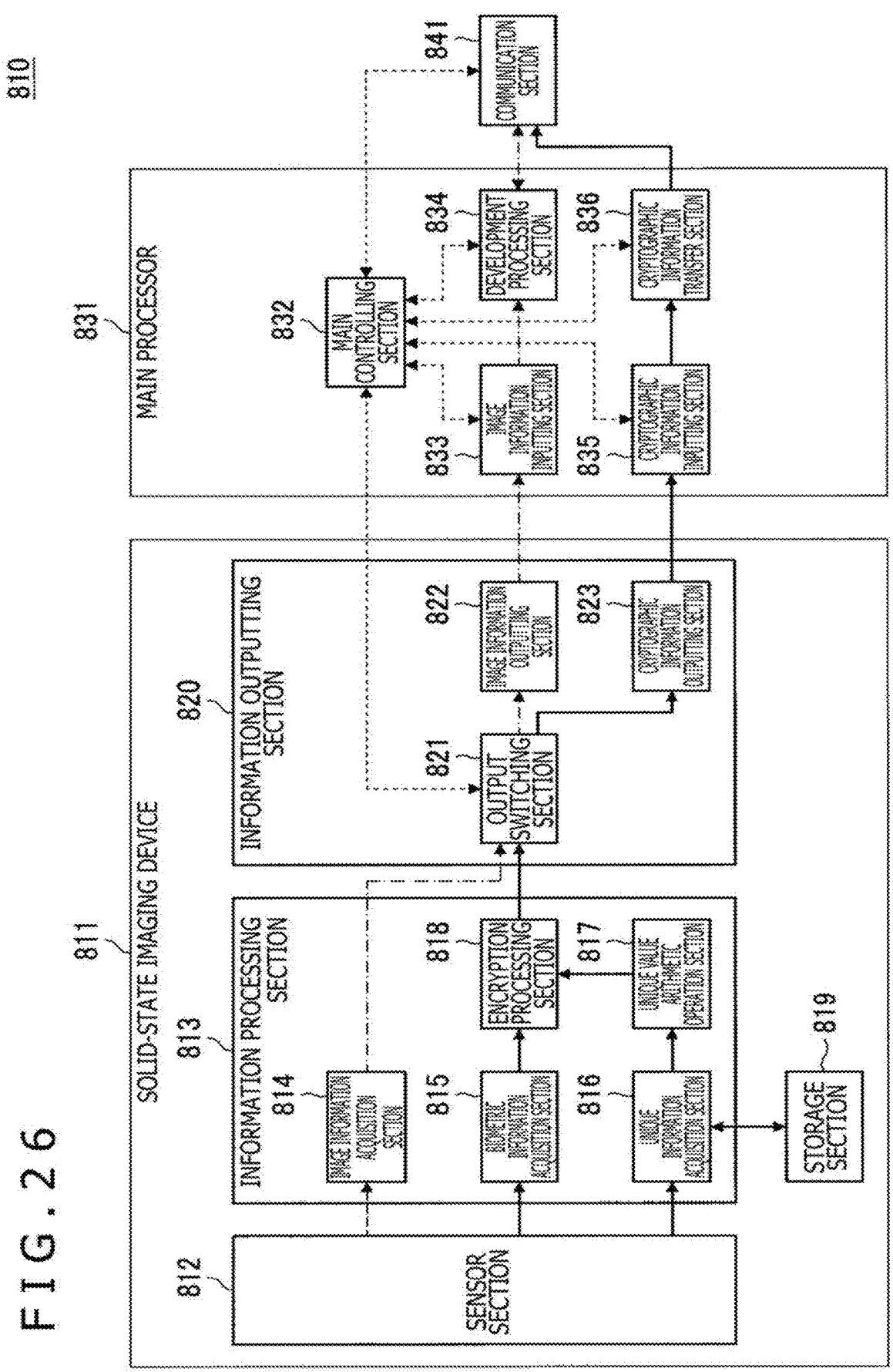
FIG. 26 is a block diagram depicting an example of a schematic functional configuration of an imaging apparatus that configures a biometric authentication system.

First, an example of a functional configuration of the imaging apparatus 810 according to the present application example is described with reference to FIG. 26. FIG. 26 is an explanatory view illustrating an application example of the technology of the present disclosure and is a block diagram depicting an example of a schematic functional configuration of the imaging apparatus 810 that configures the biometric authentication system.

As depicted in FIG. 26, the imaging apparatus 810 according to the present application example includes a solid-state imaging device 811, a main processor 831 and a communication section 841.

The communication section 841 is a component for performing transmission and reception of various information to and from a different apparatus through a predetermined network by the imaging apparatus 810. For example, in the case where transmission and reception of various information are performed to and from an external apparatus through a wireless network, the communication section 841 can include a communication antenna, a RF (Radio Frequency) circuit, a baseband processor and so forth. It is to be noted that, in the following description, where the components of the imaging apparatus 810 perform transmission and reception of information to and from a different apparatus, unless otherwise specified, it is assumed that transmission and reception of the information are performed through the communication section 841.

The solid-state imaging device 811 corresponds to the solid-state imaging apparatus 1 according to the embodiment of the present disclosure described hereinabove. As depicted in FIG. 26, the solid-state imaging device 811 includes a sensor section 812, an information processing section 813, a storage section 819, and an information outputting section 820. Further, though not depicted in FIG. 26, the solid-state imaging device 811 may include a register interface for performing transmission and reception of a set value to and from the outside. Here, the "outside" signifies a recording medium into which image information generated by an image sensor is stored, a network for transmitting the image information, an imaging apparatus main body such as a main processor or a digital camera that processes the image information, a personal computer (PC), a portable terminal, a game machine, a non-contacting type IC card such as a FeliCa (registered trademark) card or a USB memory.

The sensor section 812 corresponds to the pixel array 3 described hereinabove with reference to FIG. 1 and photo-electrically converts light from an imaging object into an electric signal.

The information processing section 813 performs processing for acquired information as occasion demands. As depicted in FIG. 26, the information processing section 813 includes, for example, an image information acquisition section 814, a biometric information acquisition section 815, a unique information acquisition section 816, a unique value arithmetic operation section 817 and an encryption processing section 818. It is to be noted that the image information acquisition section 814, the biometric information acquisition section 815, the unique information acquisition section 816 and the unique value arithmetic operation section 817 are similar to the image information acquisition section 714, the biometric information acquisition section 715, the unique information acquisition section 716, and the unique value arithmetic operation section 717 described with reference to FIG. 22, and therefore, detailed description of them is omitted.

The encryption processing section 818 performs an encryption process based on a predetermined condition for biometric information of a user acquired by the biometric information acquisition section 815 to generate cryptographic information and transmits the cryptographic information to the information outputting section 820. At this time, the encryption processing section 818 may utilize a value unique to the solid-state imaging device 811 (for example, a PUF value) generated, for example, by the unique value arithmetic operation section 817 as a key for encryption. Further, the encryption processing section 818 may utilize key information (for example, a common key) used in an existing encryption method as a key for encryption. It is to be noted that, in the case where key information that is used in an existing encryption method is utilized, the configuration for generating a value unique to the solid-state imaging device 811 (for example, the unique information acquisition section 816 and the unique value arithmetic operation section 817) may not necessarily be provided.

The storage section 819 includes a nonvolatile recording medium (for example, a memory or the like) that can retain storage content even if power is not supplied thereto and temporarily or permanently regains various kinds of information for allowing the components in the solid-state imaging device 811 to execute various processes. For example, the storage section 819 may retain in advance therein information for allowing the unique information acquisition section 816 to specify pixels that become an acquisition target of unique information (or a block including one or more pixels).

The information outputting section 820 outputs various kinds of information outputted from the information processing section 813 to the outside of the solid-state imaging device 811, and includes, for example, an output switching section 821, an image information outputting section 822 and a cryptographic information outputting section 823.

The output switching section 821 performs switching regarding which information is to be outputted to the outside of the solid-state imaging device 811 in response to the kind of the information inputted from the information processing section 813. In other words, the output switching section 821 has a role of a switch for switching the outputting destination. Since the solid-state imaging device 811 includes the output switching section 821, it is possible to selectively switch which one of image information acquired by the image information acquisition section 814 and cryptographic information obtained by encrypting biometric information acquired by the biometric information acquisition section 815 is to be outputted.

In the case where it is selected by the output switching section 821 that the image information is to be outputted, the image information outputting section 822 receives image information acquired by the image information acquisition section 814 and outputs the image information to the outside of the solid-state imaging device 811.

On the other hand, in the case where it is selected by the output switching section 821 that the cryptographic information is to be outputted, the cryptographic information outputting section 823 receives cryptographic information generated by performing the encryption process for the biometric information by the encryption processing section 818 and outputs the cryptographic information to the outside of the solid-state imaging device 811.

The main processor 831 receives image information or cryptographic information from the solid-state imaging device 811 and executes various processes in response to the kind of the received information. As depicted in FIG. 26, the main processor 831 includes a main controlling section 832, an image information inputting section 833, a development processing section 834, a cryptographic information inputting section 835 and a cryptographic information transfer section 836.

The main controlling section 832 controls operation of the various components of the imaging apparatus 810. For example, in order to cause the solid-state imaging device 811 to execute the various functions, the main controlling section 832 transmits control signals corresponding to the functions to the solid-state imaging device 811. Further, in order to implement the functions of the main processor 831, the main controlling section 832 transmits control signals corresponding to the functions to various sections in the main processor 831.

The image information inputting section 833 acquires image information outputted from the solid-state imaging device 811 in accordance with the control signal from the main controlling section 832.

The development processing section 834 performs a development process of an output image on the basis of the image information acquired from the solid-state imaging device 811 by the image information inputting section 833 in accordance with the control signal from the main controlling section 832. Further, the development processing section 834 may transmit an output image acquired by the development process to a different apparatus connected thereto through a predetermined network (for example, the server 850 or the terminal apparatus 890 depicted in FIG. 25).

The cryptographic information inputting section 835 acquires cryptographic information outputted from the solid-state imaging device 811 in accordance with a control signal from the main controlling section 832.

The cryptographic information transfer section 836 transfers the cryptographic information acquired from the solid-state imaging device 811 by the cryptographic information inputting section 835 to a predetermined apparatus connected thereto through a predetermined network (for example, to the server 850 or the like) in accordance with a control signal from the main controlling section 832.

It is to be noted that the configuration depicted in FIG. 26 is an example to the last, and if the functions of the imaging apparatus 810 described above can be implemented, then the configuration of the imaging apparatus 810 is not necessarily restricted to the example depicted in FIG. 26.

For example, while, in the example depicted in FIG. 26, the image information outputting section 822 and the cryptographic information outputting section 823 are provided separately from each other, the image information outputting section 822 and the cryptographic information outputting section 823 may otherwise be configured integrally. In particular, if the main processor 831 discriminates which kind of information the information to be outputted from the solid-state imaging device 811 is and the processing can be selectively switched in response to the type of the information to be outputted, then the outputting sections for outputting image information and cryptographic information may be commonized. Further, in this case, the image information inputting section 833 and the cryptographic information inputting section 835 may be configured integrally.

Further, part of the components of the imaging apparatus 810 depicted in FIG. 26 may be provided externally of the imaging apparatus 810.

An example of the functional configuration of the imaging apparatus 810 according to the present application example is described above with reference to FIG. 26.

(Functional Configuration of Server 850)

Figure 27:
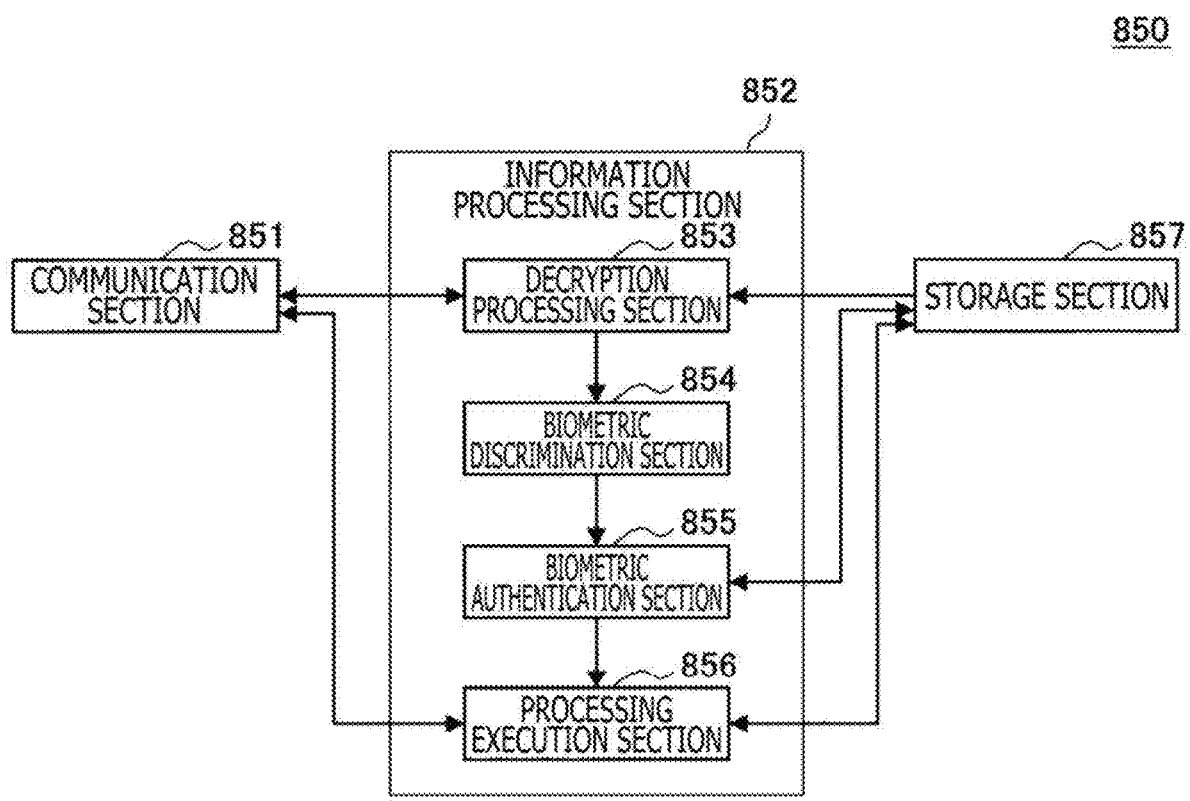
FIG. 27 is a block diagram depicting an example of a schematic functional configuration of a server that configures a biometric authentication system.

Subsequently, an example of a functional configuration of the server 850 according to the present application example is described with reference to FIG. 27. FIG. 27 is an explanatory view illustrating an application example of the technology according to the present disclosure and is a block diagram depicting an example of a schematic functional configuration of the server 850 configuring a biometric authentication system.

As depicted in FIG. 27, the server 850 according to the present application example includes a communication section 851, an information processing section 852 and a storage section 857.

The communication section 851 is a component for allowing the server 850 to perform transmission and reception of various kinds of information to and from a different apparatus through a predetermined network. For example, in the case where the communication section 851 performs transmission and reception of various kinds of information to and from an external apparatus through a wireless network, it can include a communication antenna, an RF circuit, a baseband processor and so forth. It is to be noted that it is assumed that, in the following description, in the case where each component of the server 850 performs transmission and reception of information to and from a different apparatus, unless otherwise specified, the transmission and reception of information are performed through the communication section 851.

The information processing section 852 decrypts cryptographic information transmitted thereto from the different apparatus and executes biometric authentication on the basis of biometric information obtained as a result of the decryption. Further, the information processing section 852 may execute various processes in response to a result of the biometric authentication. As depicted in FIG. 27, the information processing section 852 includes, for example, a decryption processing section 853, a biometric discrimination section 854, a biometric authentication section 855 and a processing execution section 856.

The decryption processing section 853 performs a decryption process for cryptographic information transmitted thereto from a different apparatus (for example, from the imaging apparatus 810) on the basis of key information corresponding to the transmission source of the cryptographic information to decrypt the encrypted original information (for example, the biometric information described above).

It is to be noted that, as the key information to be used for decryption of cryptographic information, for example, a unique value may be utilized for each device of an apparatus of the transmission source (for example, the solid-state imaging device 811) like the PUF value described hereinabove. It is to be noted that, as to the unique value for each device, it is sufficient if the unique value generated in advance upon production of the device, for example, is stored in a region that can be read by the decryption processing section 853 (for example, the storage section 857 hereinafter described).

Further, as another example, key information (for example, a common key or the like) that is used in an existing encryption method may be utilized as the key information to be used for decryption of cryptographic information.

The biometric discrimination section 854 discriminates whether or not the acquired biometric information can be used for authentication of the user.

The biometric authentication section 855 compares the biometric information discriminated as being capable of authenticating the user and reference information stored in a predetermined storage region (for example, the storage section 857 hereinafter described) to authenticate whether or not the user has eligibility for use.

The processing execution section 856 executes values functions (for example, an application) provided by the server 850. For example, the processing execution section 856 extracts a predetermined application from a predetermined storage section (for example, the storage section 857 hereinafter described) in response to a result of the biometric authentication by the biometric authentication section 855 and execute the extracted application. Further, the processing execution section 856 may specify a user in response to a result of the biometric authentication and transmit information according to a result of execution of the application to the terminal apparatus 890 corresponding to the specified user.

The storage section 857 temporarily or permanently retains various kinds of information for allowing the components in the server 850 to execute various processes. The storage section 857 can include a nonvolatile recording medium (for example, a memory or the like) whose storage content can be retained even if power is not supplied thereto.

Further, the storage section 857 may include at least at part thereof a volatile recording medium.

As a particular example, information that becomes a key for decrypting cryptographic information transmitted from the imaging apparatus 810 may be retained in the storage section 857. Such information includes, for example, information indicative of a unique value (for example, a PUF value) generated in advance for each imaging apparatus 810 (more particularly, for each solid-state imaging device 811).

Further, as another example, reference information that becomes a comparison target of biometric information upon biometric authentication may be retained in the storage section 857. Further, management data and so forth for managing data (for example, a library) for executing various applications, various kinds of setting and so forth may be retained in the storage section 857.

It is to be noted that the configuration depicted in FIG. 27 is an example to the last, and if it is possible to implement the functions of the server 850 described above, then the configuration of the server 850 is not necessarily restricted to the example depicted in FIG. 27. As a particular example, part of the configurations of the server 850 depicted in FIG. 27 may be provided externally of the server 850. Further, as another example, the functions of the server 850 described above may be implemented by distributed processing by a plurality of apparatuses.

An example of the functional configuration of the server 850 according to the present application example is described above with reference to FIG. 27.

(Evaluation)

As described above, in the biometric authentication system 800 according to the present application example, biometric information acquired by the solid-state imaging device 811 of the imaging apparatus 810 is outputted as cryptographic information for which an encryption process has been performed to the outside of the solid-state imaging device 811. Therefore, in regard to a configuration outside the solid-state imaging device 811, even if it is a device in the imaging apparatus 810, in the case where it does not retain key information for decryption, it is difficult for the device to decrypt cryptographic information outputted from the solid-state imaging device 811. In particular, in the biometric authentication system 800 described above, biometric information acquired by the solid-state imaging device 811 is propagated as encryption information in a route in which it is outputted from the solid-state imaging device 811 until it is received by the server 850.

Further, for encryption of biometric information, a value unique to the individual solid-state imaging device 811, which is generated (or calculated) utilizing a physical feature difficult to duplicate like a PUF value can be utilized as key information.

By such a configuration as described above, with the biometric authentication system 800 according to the present application example, the security performance relating to protection of biometric information of a user acquired as a result of imaging by the imaging apparatus 810 can be improved further.

5.3. Application Example to Mobile Body

The technology according to the present disclosure (present technology) can be applied to various products. For example, the technology according to the present disclosure may be implemented as an apparatus that is incorporated in any kind of mobile body of an automobile, an electric car, a hybrid electric car, a motorcycle, a bicycle, a personal mobility, an airplane, a drone, a ship, a robot and so forth.

Figure 28:
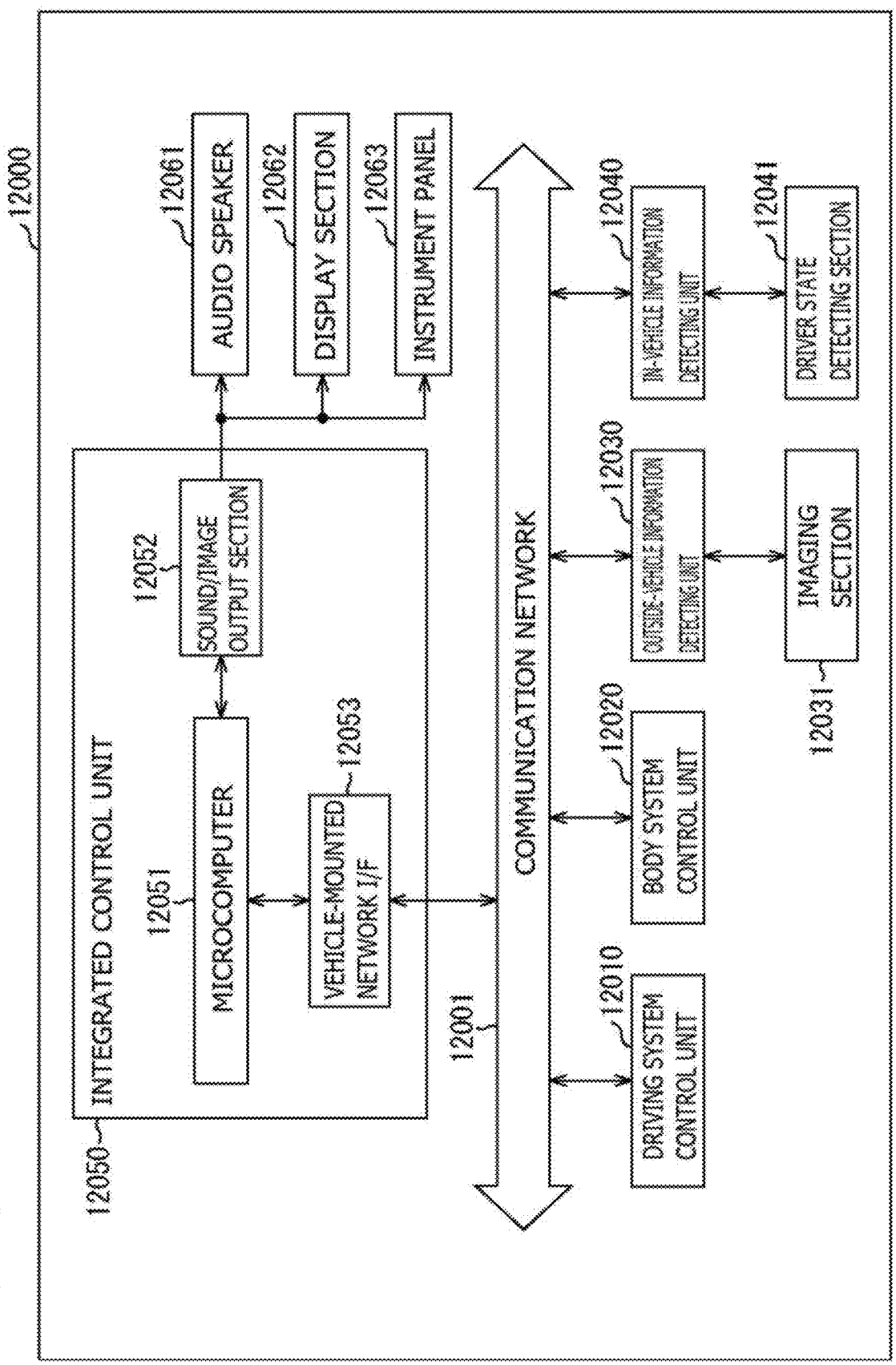
FIG. 28 is a block diagram depicting an example of schematic configuration of a vehicle control system.

FIG. 28 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 28, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 28, an audio speaker 12061, a display section 12062, and an instrument panel 12063 are illustrated as the output device. The display section 12062 may, for example, include at least one of an on-board display and a head-up display.

Figure 29:
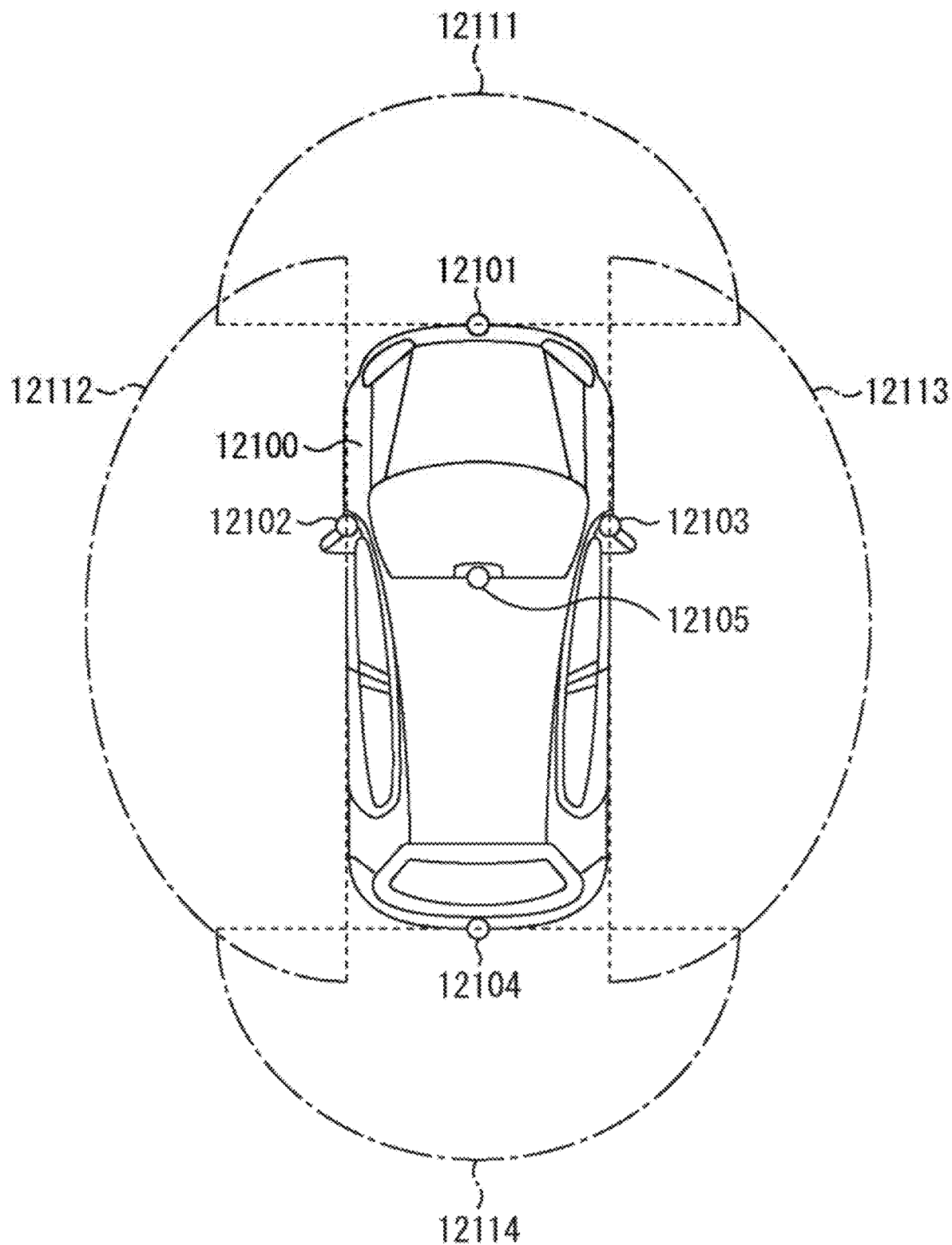
FIG. 29 is a diagram of assistance in explaining an example of installation positions of an outside-vehicle information detecting section and an imaging section.

FIG. 29 is a diagram depicting an example of the installation position of the imaging section 12031.

In FIG. 29, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 29 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle controlling system to which the technology according to the present disclosure can be applied has been described. The technology according to the present disclosure can be applied to the imaging section 12031 from within the configuration described above. In particular, the solid-state imaging apparatus 1 depicted in FIG. 1 can be applied to the imaging section 12031. By applying the technology according to the present disclosure to the imaging section 12031, for example, it is possible to perform encryption of various kinds of information acquired by the imaging section 12031 (for example, image information obtained as a result of imaging or the like) on the basis of information unique to the device (solid-state imaging apparatus) in the inside of the imaging section 12031. This makes it possible, for example, to further improve the security in regard to protection of information acquired by the imaging section 12031.

6. Conclusion

Although the preferred embodiments of the present disclosure have been described in detail with reference to the accompanying drawings, the technical scope of the present disclosure is not limited to such examples as described above. It is apparent that various alteration examples or modification examples can be conceived within the category of the technical idea described in the claims by persons who have common knowledge in the technical field of the present disclosure, and it is recognized that also such alteration examples or modification examples naturally belong to the technical scope of the present disclosure.

Further, the advantageous effects described in the present specification are explanatory or exemplary but not restrictive to the last. In short, the technology according to the present disclosure can demonstrate other advantageous effects apparent to those skilled in the art from the description of the present specification together with or in place of the advantageous effects described above.

It is to be noted that also such configurations as described below belong to the technical scope of the present disclosure.

(1)

An information processing apparatus, including:
 a specification section specifying, from among a plurality of blocks that are set by dividing pixels included in at least a partial region of a pixel region having a plurality of pixels arrayed therein and each of which includes at least one or more of the pixels, at least one or more of the blocks; and
 a generation section generating a unique value based on pixel values of the pixels included in the specified blocks and a dispersion of the pixel values of the pixels among the plurality of blocks.

(2)

The information processing apparatus according to (1) above, in which the specification section specifies the blocks in each of which a second pixel value that is calculated based on first pixel values that are the pixel values of the one or more pixels included in the blocks and corresponds to the blocks is not included in a given range including an average of the second pixel values among the plurality of blocks.

(3)

The information processing apparatus according to (2) above, in which the generation section generates the unique value based on the second pixel values corresponding to the specified blocks.

(4)

The information processing apparatus according to (3) above, in which the generation section determines at least some of values for generating the unique value in response to a result of comparison between the second pixel values corresponding to the specified blocks and the average.

(5)

The information processing apparatus according to any one of (2) to (4) above, in which the given range is set in response to a dispersion of the second pixel values among the plurality of blocks.

(6)

The information processing apparatus according to any one of (2) to (5) above, in which the given range is defined in response to setting for error correction of the generated unique value.

(7)

The information processing apparatus according to any one of (1) to (6) above, in which the partial region is a region of at least part of an OPB (Optical Black) region.

(8)

The information processing apparatus according to any one of (1) to (7) above, in which the blocks are set by dividing the pixels included in the region for each of one or more pixels that share a given circuit.

(9)

The information processing apparatus according to any one of (1) to (8) above, in which the unique value is generated based on the pixel values according to a characteristic of a threshold voltage of a given transistor in the pixels included in the specified blocks.

(10)

The information processing apparatus according to (9) above, in which
 each of the pixels includes at least three transistors including a transfer transistor that transfers charge of a photoelectric conversion element to a floating diffusion, an amplification transistor that receives a potential of the floating diffusion and outputs the potential to a signal line, and a reset transistor that controls the potential of the floating diffusion, and
 the unique value is generated based on the pixel value according to the characteristic of the threshold voltage of the amplification transistor.

(11)

The information processing apparatus according to any one of (1) to (10) above, in which the generation section generates the unique value using an average value of the pixel values of the pixels among a plural number of times of imaging as the pixel values of the pixels.

(12)

The information processing apparatus according to any one of (1) to (11) above, including:
  an encryption processing section performing an encryption process for desired information using the generated unique value as key information.

(13)

The information processing apparatus according to any one of (1) to (12) above, in which the unique value is outputted as an identifier to an outside.

(14)

An information processing method executed by a computer, including:
  specifying, from among a plurality of blocks that are set by dividing pixels included in at least a partial region of a pixel region having a plurality of pixels arrayed therein and each of which includes at least one or more of the pixels, at least one or more of the blocks; and
  generating a unique value based on pixel values of the pixels included in the specified blocks and a dispersion of the pixel values of the pixels among the plurality of blocks.

(15)

A recording medium on which a program is recorded, the program causing a computer to execute:
  specifying, from among a plurality of blocks that are set by dividing pixels included in at least a partial region of a pixel region having a plurality of pixels arrayed therein and each of which includes at least one or more of the pixels, at least one or more of the blocks; and
  generating a unique value based on pixel values of the pixels included in the specified blocks and a dispersion of the pixel values of the pixels among the plurality of blocks.

REFERENCE SIGNS LIST

1: Solid-state imaging apparatus
2: Pixel
3: Pixel array
4: Vertical driving circuit
5: Column signal processing circuit
6: Horizontal driving circuit
7: Outputting circuit
8: Control circuit
9: Vertical signal line
10: Horizontal signal line
11: Semiconductor substrate
12: Input/output terminal

The invention claimed is:

1. An information processing apparatus, comprising:
  a specification section configured to specify, from among a plurality of blocks that are set by dividing pixels included in at least a partial region of a pixel region having a plurality of pixels arrayed therein and each of which includes at least one or more of the pixels, two or more blocks of the plurality of blocks; and
  a generation section configured to:
    calculate for each block of the specified two or more blocks, a pixel value corresponding to the block based on pixel values of the one or more pixels included in the block; and
    generate a unique value based on the pixel values corresponding to the specified two or more blocks and a dispersion of the pixel values corresponding to the specified two or more blocks.

2. The information processing apparatus according to claim 1, wherein the specification section is further configured to:
  determine, for each of the two or more specified blocks, whether its corresponding pixel value is within a given range including an average of the pixel values corresponding to the two or more blocks; and
  generate the unique value based on the pixel values corresponding to blocks for which it is determined that the pixel value is not within the given range.

3. The information processing apparatus according to claim 2, wherein the given range is set based on the dispersion of the pixel values corresponding to the two or more blocks.

4. The information processing apparatus according to claim 2, wherein the given range is defined in response to setting for error correction of the generated unique value.

5. The information processing apparatus according to claim 1, wherein the partial region is a region of at least part of an OPB (Optical Black) region.

6. The information processing apparatus according to claim 1, wherein the plurality of blocks are set by dividing the pixels included in the region for each of one or more pixels that share a given circuit.

7. The information processing apparatus according to claim 1, wherein the pixel values corresponding to the two or more blocks are determined unique value is generated based on the pixel values according to a characteristic of a threshold voltage of a given transistor in the one or more pixels included in the specified two or more blocks.

8. The information processing apparatus according to claim 7, wherein
  each of the one or more pixels included in a block of the plurality of blocks includes at least three transistors including a transfer transistor that transfers charge of a photoelectric conversion element to a floating diffusion, an amplification transistor that receives a potential of the floating diffusion and outputs the potential to a signal line, and a reset transistor that controls the potential of the floating diffusion, and
  the pixel value corresponding to each of the two or more blocks is generated based on a characteristic of the threshold voltage of the amplification transistor included in pixels of the block.

9. The information processing apparatus according to claim 1, wherein the pixel value corresponding to each of the two or more blocks is an average value of the one or more pixel values of the pixels in the block among a plural number of times of imaging.

10. The information processing apparatus according to claim 1, comprising:
  an encryption processing section configured to perform an encryption process for desired information using the generated unique value as key information.

11. The information processing apparatus according to claim 1, wherein the unique value is outputted as an identifier to an outside.

12. An information processing method executed by a computer, comprising:
  specifying, from among a plurality of blocks that are set by dividing pixels included in at least a partial region of a pixel region having a plurality of pixels arrayed therein and each of which includes at least one or more of the pixels, two or more of the plurality of blocks;

calculating for each block of the specified two or more blocks, a pixel value corresponding to the block based on pixel values of the one or more pixels included in the block; and generating a unique value based on the pixel values corresponding to the specified two or more blocks and a dispersion of the pixel values corresponding to the specified two or more blocks.

13. A non-transitory computer readable recording medium on which a program is recorded, the program causing a computer to execute:

specifying, from among a plurality of blocks that are set by dividing pixels included in at least a partial region of a pixel region having a plurality of pixels arrayed therein and each of which includes at least one or more of the pixels, two or more of the plurality of blocks;

calculating for each block of the specified two or more blocks, a pixel value corresponding to the block based on pixel values of the one or more pixels included in the block; and generating a unique value based on the pixel values corresponding to the specified two or more blocks and a dispersion of the pixel values corresponding to the specified two or more blocks.

\* \* \* \* \*